US008692325B2

(12) United States Patent
Yanagi

(10) Patent No.: US 8,692,325 B2
(45) Date of Patent: Apr. 8, 2014

(54) SEMICONDUCTOR DEVICE AND METHOD OF MANUFACTURING THE SAME

(75) Inventor: Shinichiro Yanagi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 80 days.

(21) Appl. No.: 12/754,238

(22) Filed: Apr. 5, 2010

(65) Prior Publication Data

US 2010/0270616 A1 Oct. 28, 2010

(30) Foreign Application Priority Data

Apr. 24, 2009 (JP) .................................. 2009-106767

(51) Int. Cl.
*H01L 29/66* (2006.01)
(52) U.S. Cl.
USPC .................................. 257/343; 257/E29.256
(58) Field of Classification Search
USPC .......................................... 257/343, E29.256
See application file for complete search history.

(56) References Cited

U.S. PATENT DOCUMENTS

| 6,346,451 | B1* | 2/2002 | Simpson et al. | 438/311 |
|---|---|---|---|---|
| 6,762,458 | B2 | 7/2004 | Lee | |
| 2005/0255655 | A1* | 11/2005 | Hower et al. | 438/282 |
| 2005/0285189 | A1* | 12/2005 | Shibib et al. | 257/341 |
| 2006/0170056 | A1* | 8/2006 | Pan et al. | 257/365 |
| 2006/0252257 | A1 | 11/2006 | Ahn et al. | |
| 2008/0030297 | A1 | 2/2008 | Ohtsuka et al. | |
| 2008/0237702 | A1* | 10/2008 | Lee et al. | 257/336 |
| 2008/0265363 | A1 | 10/2008 | Gambino et al. | |
| 2008/0303092 | A1 | 12/2008 | Letavic | |
| 2009/0166736 | A1* | 7/2009 | Park | 257/343 |

FOREIGN PATENT DOCUMENTS

| JP | 2002-329862 A | 11/2002 |
|---|---|---|
| JP | 2009528671 A | 8/2009 |
| WO | 2007072292 A1 | 6/2007 |

OTHER PUBLICATIONS

R. Zhu et al., "A 65V, 0.56 mΩ.cm² Resurf LDMOS in a 0.35μm CMOS Process," IEEE ISPSD2000, pp. 335-338.
C. Contiero et al. "Progress in Power ICs and MEMS, 'Analog' Technologies to interface the Real World," Proceedings of 2004 International Symposium on Power Semiconductor Devices & ICs, pp. 3-12.
Japanese Office Action issued in Application No. 2009-106767 dated Jun. 4, 2013.
Park et al, BD180—a new 0.18 μm BCD (Bipolar-CMOS-DMOS) Technology from 7V to 60V, Proceeding of the 20th International Symposium on Power Semiconductor Devices & IC's May 18-22, 2008 Orlando FL, 1-4244-1533-0/08/ $25.00 Ò2008 IEEE.
European Search Report issued in application No. EP 10 25 0552 dated Jul. 26, 2013.

* cited by examiner

*Primary Examiner* — Tran Tran
(74) *Attorney, Agent, or Firm* — McDermott Will & Emery LLP

(57) ABSTRACT

There is provided a semiconductor device in which the degradation of electric characteristics can be inhibited. A semiconductor substrate has a main surface, and a trench in the main surface. A buried insulating film is buried in the trench. The trench has one wall surface and the other wall surface which oppose each other. A gate electrode layer is located over at least the buried insulating film. The trench has angular portions which are located between the main surface of at least either one of the one wall surface and the other wall and a bottom portion of the trench.

10 Claims, 46 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2009-106767 filed on Apr. 24, 2009 including the specification, drawings and abstract is incorporated herein by reference in its entirety.

BACKGROUND OF THE INVENTION

The present invention relates to a semiconductor device and a method of manufacturing the same, and particularly to a semiconductor device in which a gate electrode is partly located over a buried insulating film and a method of manufacturing the same.

As a typical structure of a high-breakdown-voltage Laterally Diffused Metal Oxide Semiconductor (LDMOS) transistor, there is a REduced SURface Field (RESURF) MOS transistor (see Patent Document 1). To provide the LDMOS transistor with a higher breakdown voltage, it is necessary to uniformly extend a depletion layer in the drift region of a drain and, as a technique therefor, there is a field plate effect using a gate electrode layer.

The field plate effect is obtained by extending the gate electrode layer toward a drain over a semiconductor substrate, but a high electric field is formed under the drain-side edge of the gate electrode layer. Accordingly, in a typical structure, a thick oxide film is formed over a surface of the semiconductor substrate, and the drain-side edge of the gate electrode layer is positioned over the oxide film, thereby reducing the intensity of the electric field under the drain-side edge of the gate electrode layer.

As the thick oxide film described above, various oxide films are used depending on the generation of a process for forming the LDMOS transistor, but a Local Oxidation of Silicon (LOCOS) oxide film and a Shallow Trench Isolation (STI) are typically used. As the thick oxide film, a configuration using the STI is described in, e.g., Non-Patent Document 2.

PRIOR ART DOCUMENTS

Non-Patent Documents

[Non-Patent Document 1]
R. Zhu et al., "A 65V, 0.56 mO. cm$^2$ Resurf LDMOS in a 0.35 μm CMOS Process", IEEE ISPSD2000, pp. 335-338
[Non-Patent Document 2]
C. Contiero et al., "Progress in Power ICs and MEMS, "Analog" Technologies to interface the Real World", IEEE ISPSD2004, pp. 3-12.

SUMMARY OF THE INVENTION

In the case of an LDMOS transistor using a fine process in the 0.25 μm generation or thereafter, a STI is mostly used as a thick oxide film. An edge portion of the STI is steeper than an edge portion of a LOCOS oxide film so that current concentration occurs in the edge portion of the STI during an ON operation. The current concentration causes an increase in impact ionization ratio, and may cause the degradation of electric characteristics due to the trapping of electrons.

The present invention has been achieved in view of the foregoing problem, and an object of the present invention is to provide a semiconductor device in which the degradation of electric characteristics can be inhibited and a method of manufacturing the same.

A semiconductor device according to an embodiment of the present invention includes a semiconductor substrate, an insulating film, and a gate electrode layer. The semiconductor substrate has a main surface, and a trench in the main surface. A buried insulating film is buried in the trench. The trench has one wall surface and the other wall surface which oppose each other. The gate electrode layer is located at least over the buried insulating film. The trench has an angular portion located between the main surface of at least either one of the one wall surface and the other wall surface and a bottom portion of the trench.

Note that "an angular portion located between the main surface of at least either one of the one wall surface and the other wall surface and a bottom portion of the trench" does not include an edge portion located at the intersection of either one of the one wall surface and the other wall surface and the bottom portion of the trench.

According to the present embodiment, the angular portion is provided between the main surface of at least either one of the one wall surface and the other wall surface and the bottom portion of the trench. Therefore, it is possible to reduce electric field concentration on the wall surfaces of the trench, and inhibit the degradation of electric characteristics.

DESCRIPTION OF THE PREFERRED EMBODIMENTS

Figure 1:
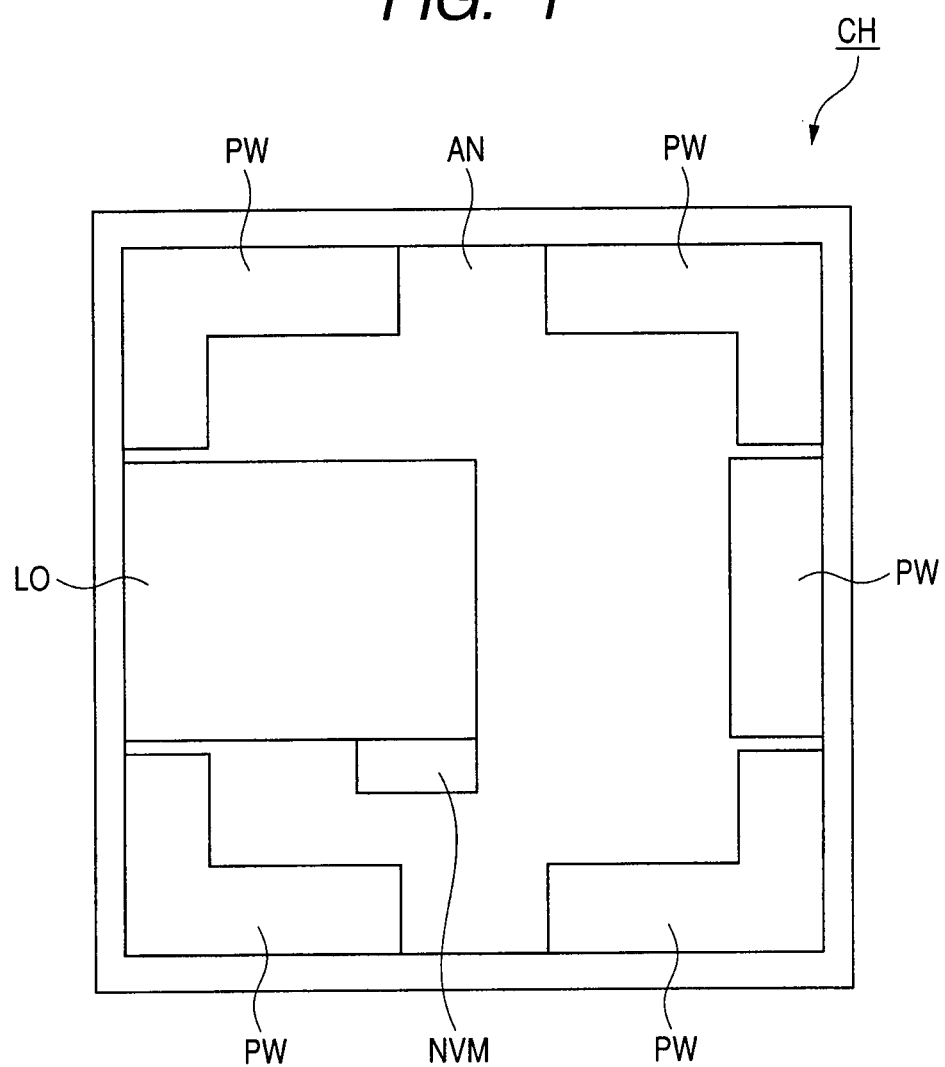
FIG. 1 is a plan view schematically showing a configuration of an analog/digital mixed chip.

Referring to the drawings, the embodiments of the present invention will be described below.

(Embodiment 1)

First, a configuration of a semiconductor device in Embodiment 1 will be described using FIGS. 1 and 2.

Referring to FIG. 1, an analog/digital mixed chip CH has, e.g., an analog element formation region AN, a logic element formation region LO, a memory element formation region NVM, and a power element formation region PW. In the analog element formation region AN, formed is an analog device such as, e.g., a resistor. In the logic element formation region LO, formed is, e.g., a complementary MOS (CMOS) transistor or the like. In the memory element formation region NVM, formed is, e.g., a stacked-gate nonvolatile memory or the like. In the power element formation region PW, formed is, e.g., an LDMOS transistor or the like.

Figure 2:
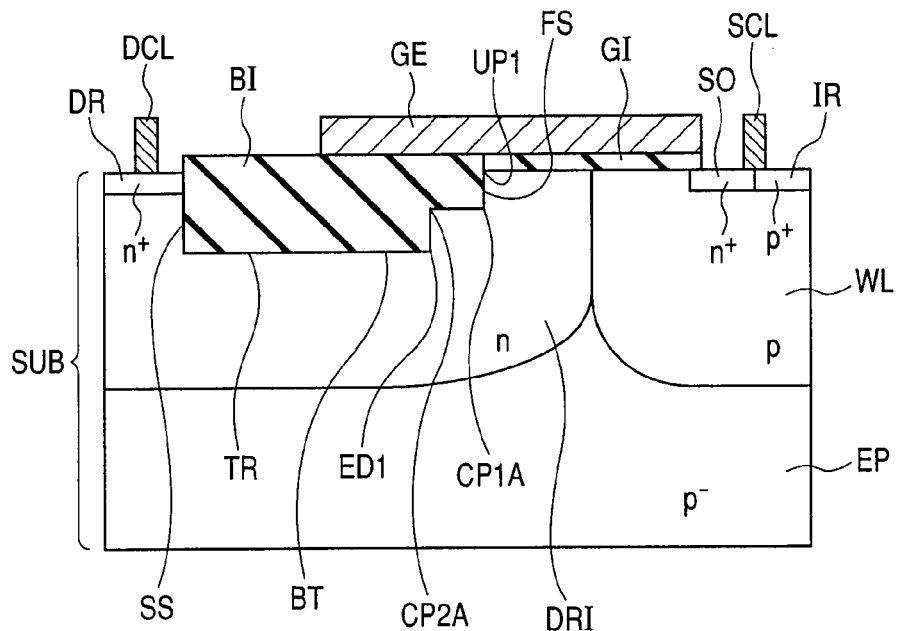
FIG. 2 is a cross-sectional view schematically showing a configuration of a semiconductor device in Embodiment 1 of the present invention.

Referring to FIG. 2, the LDMOS transistor described above primarily has a semiconductor substrate SUB, an $n^+$ source region (first region) SO, an $n^+$ drain region (second region) DR, a p-type well region (third region) WL, an n-type drift region (fourth region) DRI, a $p^-$ epitaxial region (fifth region) EP, a gate electrode layer GE, and a STI structure TR, BI.

The semiconductor substrate SUB is made of, e.g., silicon, and has a trench TR in the main surface thereof. In the trench TR, formed is a buried insulating film BI. The trench TR and the buried insulating film BI form a STI structure. The trench TR forming the STI structure has a bottom portion BT, and one wall portion FS and the other wall portion SS which oppose each other.

The $n^+$ source region SO is formed in the main surface of a portion of the semiconductor substrate SUB located closer to the one wall portion FS of the trench TR. In the main surface of the semiconductor substrate SUB, a $p^+$ body contact region IR is formed to be adjacent to the $n^+$ source region SO. The p-type well region WL is formed to be located under the $n^+$ source region SO and the $p^+$ body contact region IR, and located in a part of the main surface of the semiconductor substrate SUB interposed between the $n^+$ source region SO and the trench TR. The p-type well region WL has a p-type impurity concentration lower than that of the $p^+$ body contact region IR, and forms a p-n junction with the $n^+$ source region SO.

The $n^+$ drain region DR is formed in the main surface of a portion of the semiconductor substrate SUB located closer to the other wall portion SS of the trench TR. The n-type drift region DRI is formed in the semiconductor substrate SUB to be located under the $n^+$ drain region DR and the trench TR, and located in a part of the main surface of the semiconductor substrate SUB interposed between the trench TR and the $n^+$ source region SO. The n-type drift region DRI has an n-type impurity concentration lower than that of the $n^+$ drain region DR. The n-type drift region DRI is formed sidewise of the p-type well region WL in adjacent relation thereto, and forms a p-n junction with the p-type well region WL.

The $p^-$ epitaxial region EP is formed in the semiconductor substrate SUB so as to be located under each of the n-type drift region DRI and the p-type well region WL. The $p^-$ epitaxial region EP is formed in contact with each of the n-type drift region DRI and the p-type well region WL. The $p^-$ epitaxial region EP forms a p-n junction with the n-type drift region DRI, and a part of the p-n junction is located in a plane (in a plane substantially parallel with the main surface) along the main surface of the semiconductor substrate SUB. The $p^-$ epitaxial region EP has a p-type impurity concentration lower than that of the p-type well region WL.

The gate electrode layer GE is formed over the p-type well region WL and the n-type drift region DRI which are located in the main surface of the semiconductor substrate SUB via a gate insulating film GI. The gate electrode layer GE is formed such that the drain-side end portion thereof lies over the buried insulating film BI, whereby a field plate effect using the gate electrode layer GE can be obtained.

A source conductive layer SCL is formed over the main surface of the semiconductor substrate SUB so as to be electrically coupled to each of the n$^+$ source region SO and the p$^+$ body contact region IR. In addition, a drain conductive layer DCL is formed over the main surface of the semiconductor substrate SUB so as to be electrically coupled to the n$^+$ drain region DR.

In the present embodiment, at least either one of the one wall portion FS and the other wall portion SS of the trench TR forming the STI structure is formed with angular portions. In the present embodiment, the angular portions are formed at, e.g., the one wall portion FS of the trench TR closer to the source. Specifically, the one wall portion FS of the trench TR is formed with, e.g., a projecting angular portions CP1A and a depressed angular portion CP2A so that the one wall portion FS has a stepped shape when viewed in cross section.

The two angular portions CP1A and CP2A are located between an upper portion UP1 of the trench TR located in the main surface of the semiconductor substrate SUB and the bottom portion BT thereof. Note that, in the present embodiment, the angular portions located between the upper portion UP1 and the bottom portion BT of the trench TR do not include an edge portion ED1 formed at the intersection of the bottom portion BT and the one wall portion FS of the trench TR.

Each of the angular portions described above may have a right-angled shape, an obtuse-angled shape, or an acute-angled shape in the cross section of FIG. 2.

Figure 3:
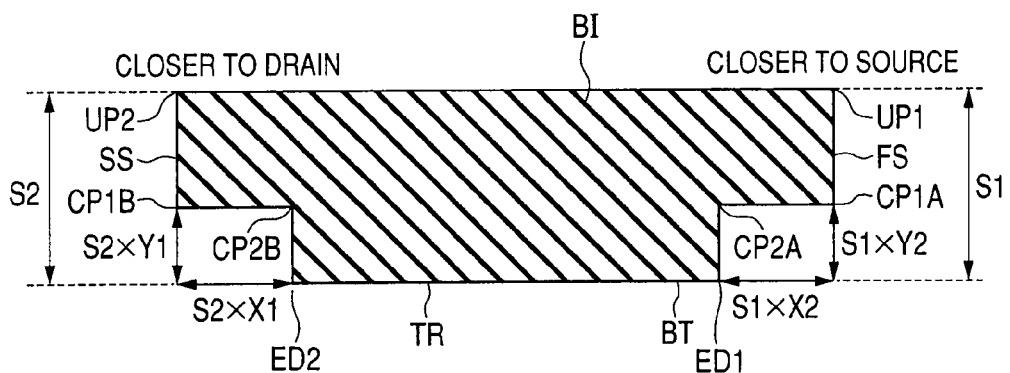
FIG. 3 is an enlarged cross-sectional view of a trench in the STI structure shown in FIG. 2, which is for illustrating the cross-sectional shape of the trench.

Next, the stepped shape of the one wall portion FS of the trench TR will be described using FIG. 3. Referring to FIG. 3, when it is assumed that the dimension from the upper portion UP1 of the one wall portion FS of the trench TR to the bottom portion BT thereof in a depth direction (thickness direction) is S1 and proportions (%) are X2 and Y2, the angular portion CP1A is located at a position (position closer to the main surface of the semiconductor substrate SUB) shallower by S1×Y2 than the bottom portion BT of the trench TR. The junction portion (edge portion) ED1 between the one wall portion FS and the bottom portion BT is located at the depth S1 from the main surface of the semiconductor substrate SUB and closer to the drain (closer to the other wall portion SS) by S1×X2 as measured from the upper portion UP1 of the trench TR in a lateral direction (direction along the main surface of the semiconductor substrate SUB).

Here, when the proportion X2 is 80%, the proportion Y2 is preferably not less than 40% and not more than 80%. When the proportion X2 is in the range of not less than 40% and not more than 120%, X2:Y2=1:2 is preferably satisfied.

Next, a method of manufacturing the semiconductor device according to the present embodiment will be described using FIGS. 4 to 13. Note that, in each of FIGS. 4 to 13, in conjunction with a stacked-gate nonvolatile memory NVM and a CMOS transistor in the analog/digital mixed chip shown in FIG. 1, there is shown the LDMOS transistor (hereinafter referred to as a "SS-LDMOS transistor") shown in FIG. 2.

Figure 4:
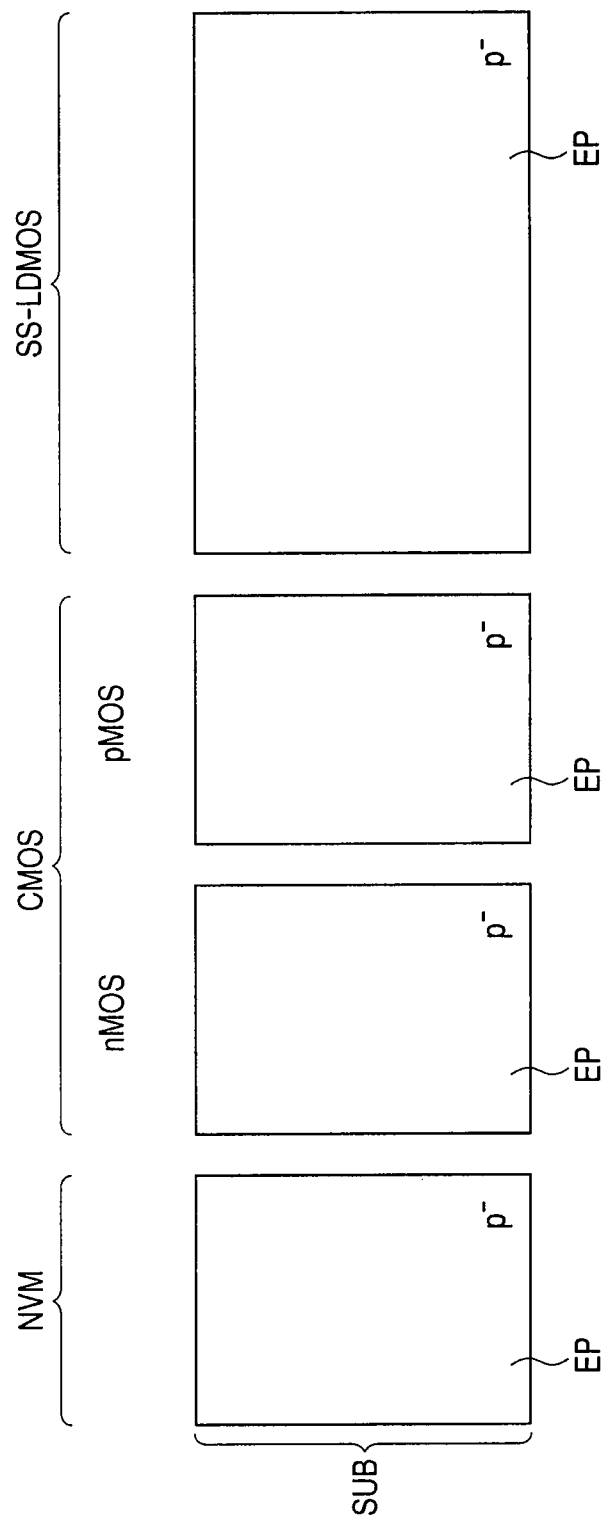
FIG. 4 is a cross-sectional view schematically showing a first step of a method of manufacturing the semiconductor device in Embodiment 1 of the present invention.

Referring to FIG. 4, the semiconductor substrate SUB is prepared which has the p$^-$ epitaxial region EP in each of the SS-LDMOS transistor region (first element region), the CMOS transistor region (second element region), and the nonvolatile memory region (third element region).

Figure 5:
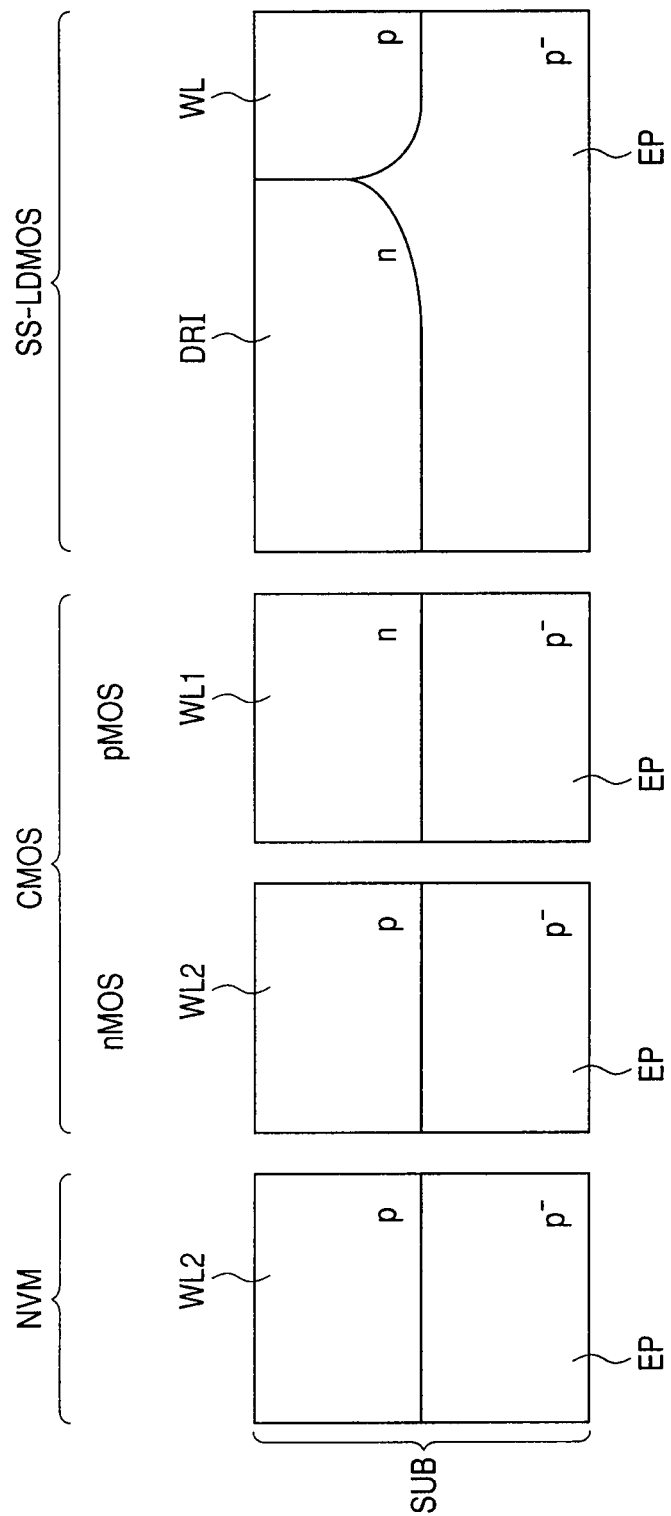
FIG. 5 is a cross-sectional view schematically showing a second step of the method of manufacturing the semiconductor device in Embodiment 1 of the present invention.

Referring to FIG. 5, in the main surface of the semiconductor substrate SUB, impurity diffusion layers required for the individual elements are formed by ion implantation or the like. For example, the n-type drift region DRI and the p-type well region WL are formed in the SS-LDMOS transistor region. An n-type region WL1 is formed in the pMOS transistor region, while a p-type region WL2 is formed in each of the nMOS transistor region and the nonvolatile memory region NVM.

Figure 6:
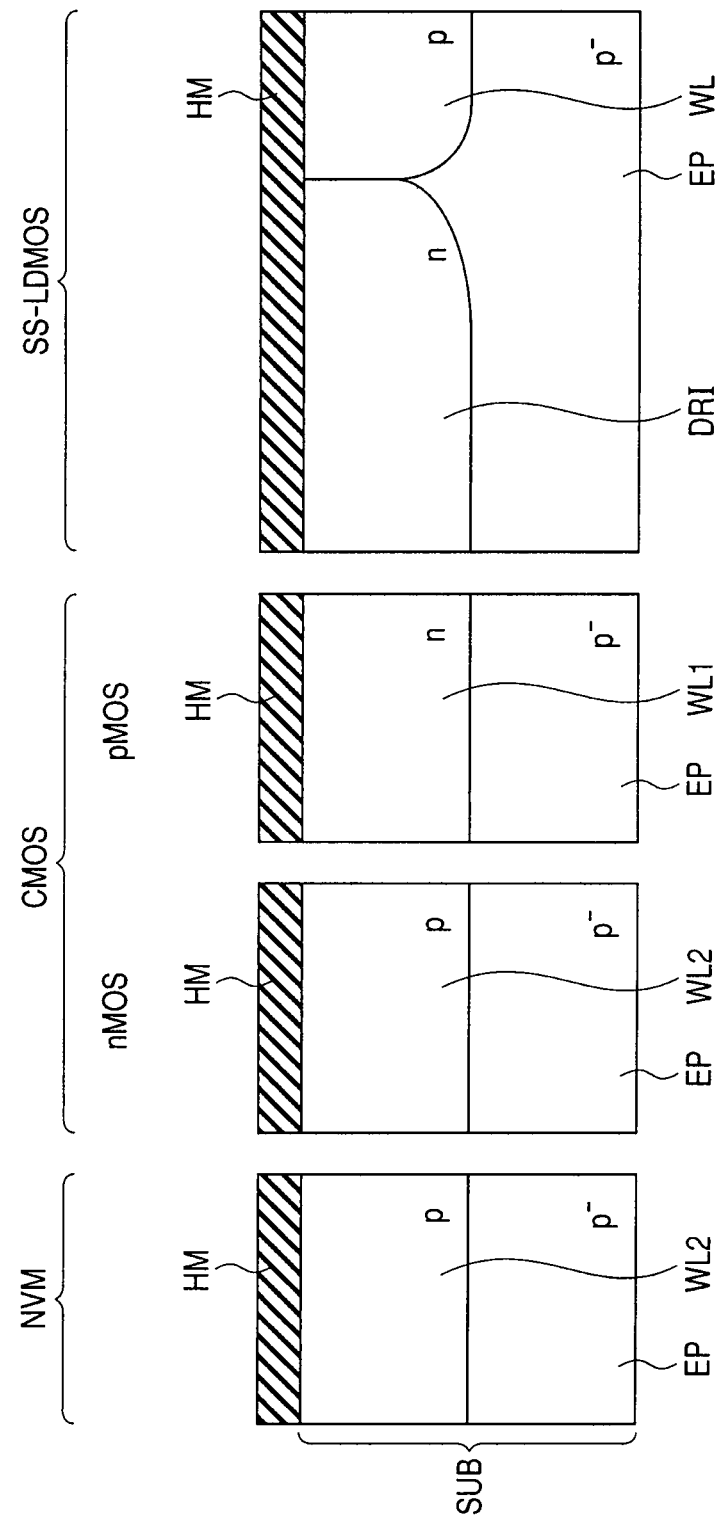
FIG. 6 is a cross-sectional view schematically showing a third step of the method of manufacturing the semiconductor device in Embodiment 1 of the present invention.

Referring to FIG. 6, a hard mask (insulating film) HM for forming the STI structure is formed over the entire main surface of the semiconductor substrate SUB.

Figure 7:
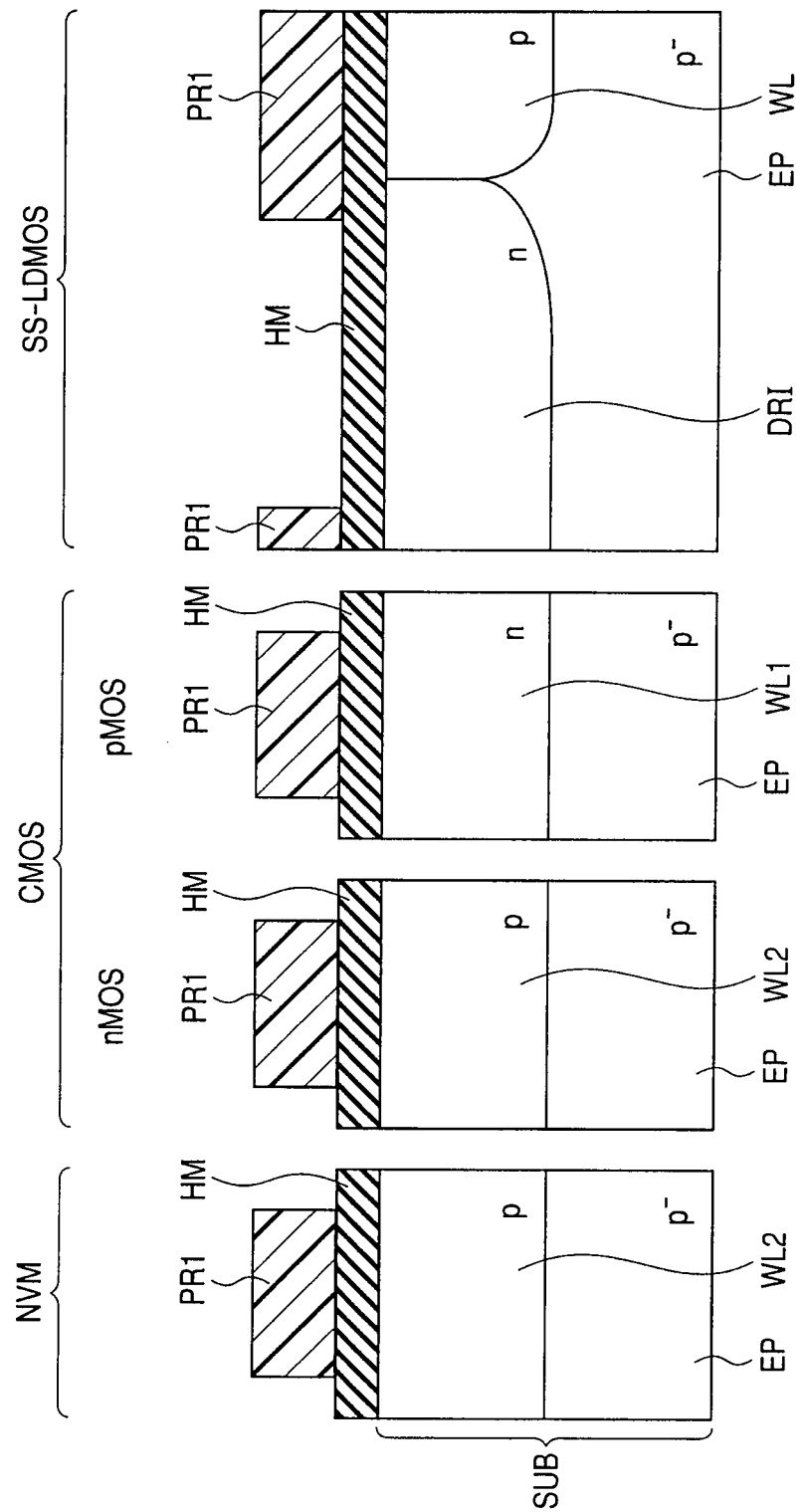
FIG. 7 is a cross-sectional view schematically showing a fourth step of the method of manufacturing the semiconductor device in Embodiment 1 of the present invention.

Referring to FIG. 7, over the hard mask HM, a patterned photoresist PR1 is formed using a typical photoengraving technique. Using the photoresist PR1 as a mask, anisotropic etching is performed with respect to the hard mask HM. Thereafter, the photoresist mask PR1 is removed by, e.g., ashing or the like.

Figure 8:
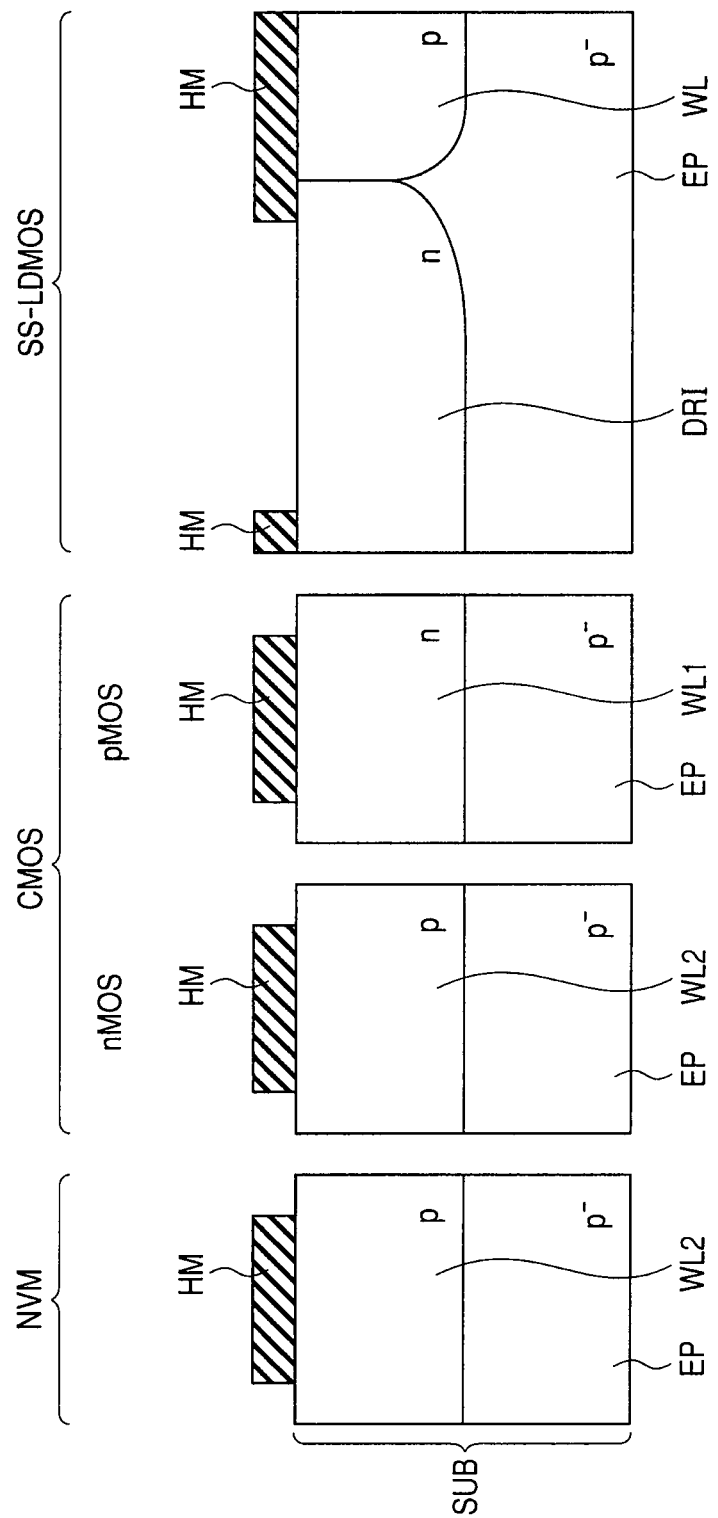
FIG. 8 is a cross-sectional view schematically showing a fifth step of the method of manufacturing the semiconductor device in Embodiment 1 of the present invention.

Referring to FIG. 8, the hard mask HM is patterned by the etching described above to expose the surface of a part of the semiconductor substrate SUB. Using the patterned hard mask HM as a mask, anisotropic etching is performed with respect to the exposed main surface of the semiconductor substrate SUB.

Figure 9:
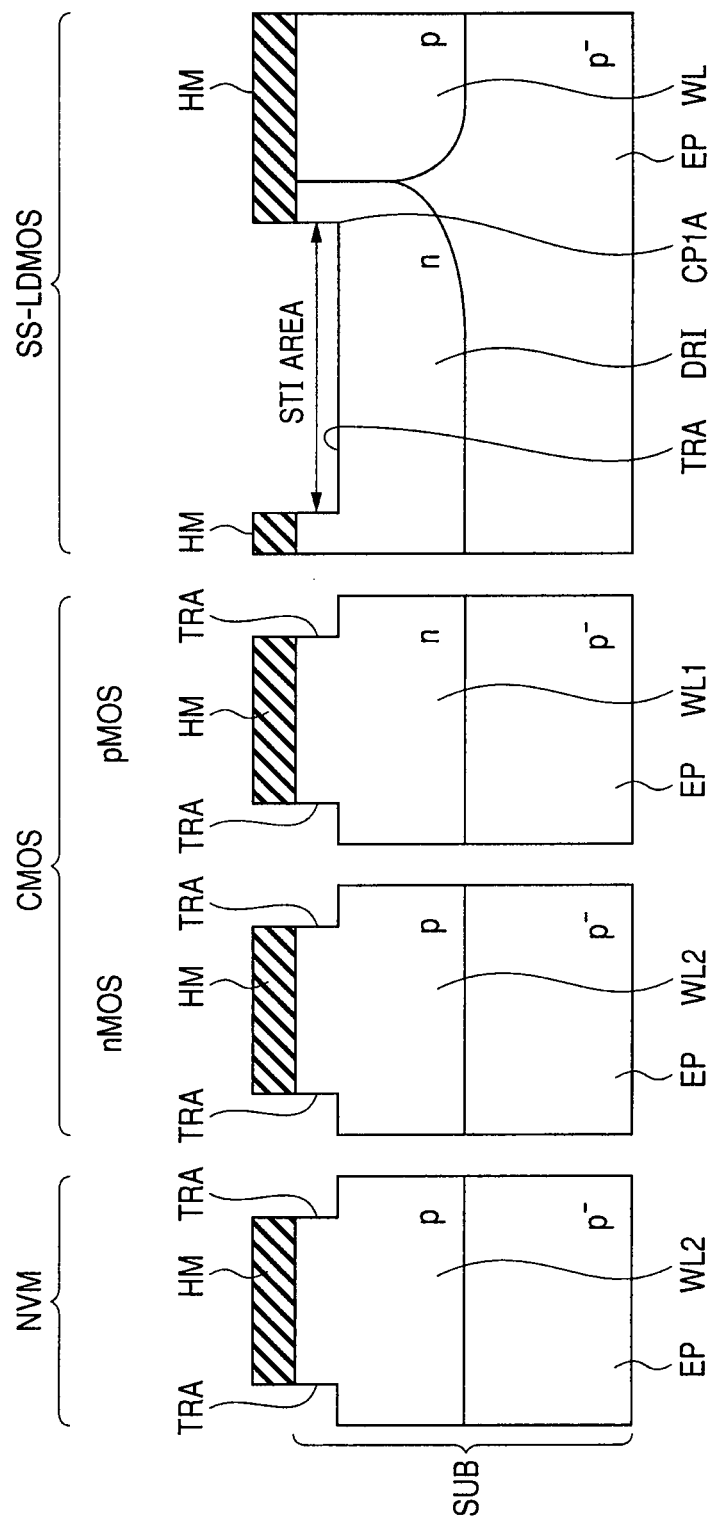
FIG. 9 is a cross-sectional view schematically showing a sixth step of the method of manufacturing the semiconductor device in Embodiment 1 of the present invention.

Referring to FIG. 9, by the etching described above, the trench (first trench) TRA for the STI structure is formed in the main surface of the semiconductor substrate SUB in the SS-LDMOS transistor region. By the etching described above, a trench (third trench) TRA for the STI structure is also formed in the CMOS transistor region, and a trench (fourth trench) TRA for the STI structure is also formed in the nonvolatile memory region, each by the same step of forming the trench (first trench) TRA in the SS-LDMOS transistor region. Each of these trenches TRA is formed to have a pair of sidewalls opposing each other, and have substantially the same depths.

Figure 10:
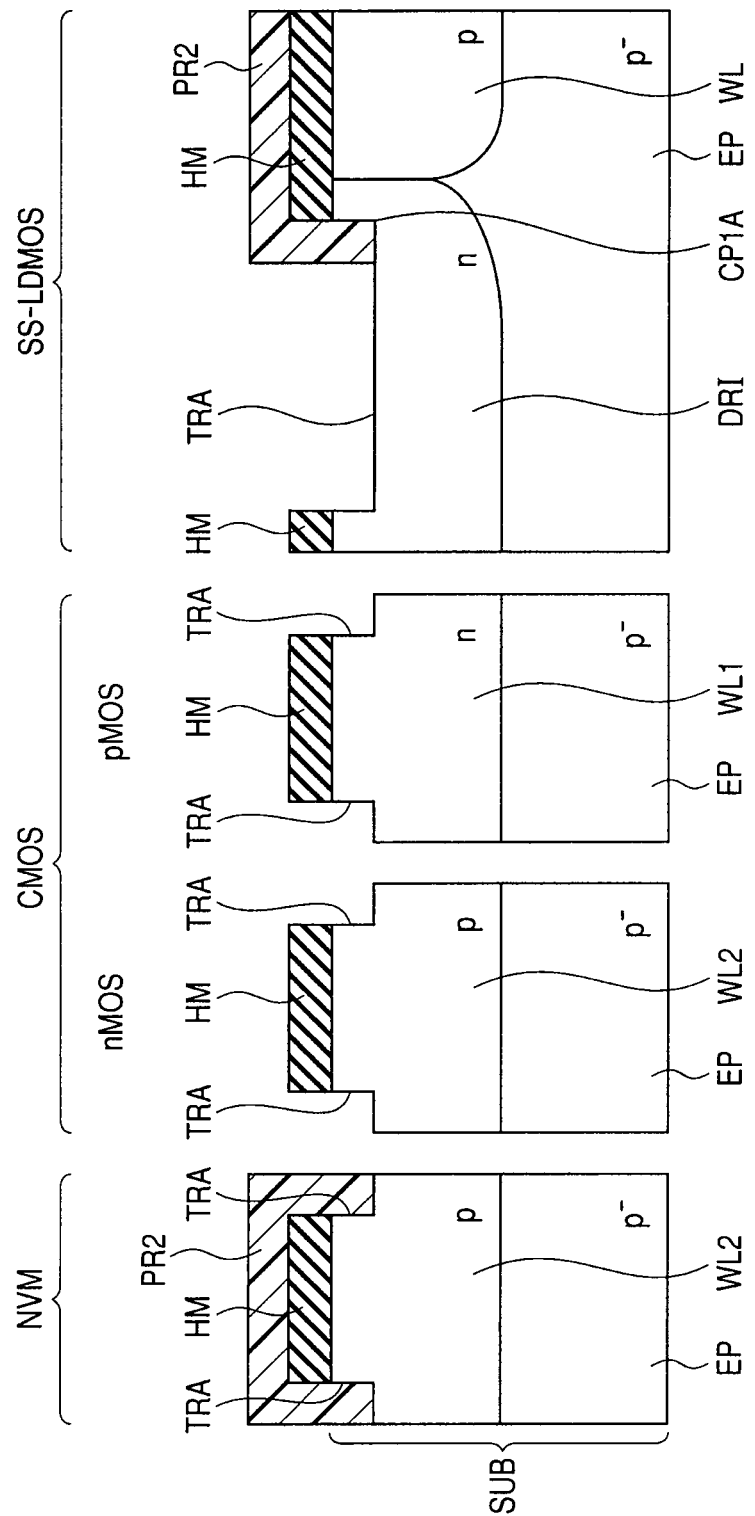
FIG. 10 is a cross-sectional view schematically showing a seventh step of the method of manufacturing the semiconductor device in Embodiment 1 of the present invention.

Referring to FIG. 10, using a typical photoengraving technique, a patterned photoresist PR2 is formed. The photoresist PR2 is formed in the SS-LDMOS transistor region to cover the source-side sidewall of the trench (first trench) TRA, and open the drain-side sidewall and the middle portion of the trench (first trench) TRA between the source-side and drain-side sidewalls thereof. The photoresist PR2 is also formed to open the entire trench (third trench) TRA in the CMOS transistor region, and cover the entire trench (fourth trench) TRA in the nonvolatile memory region.

Figure 11:
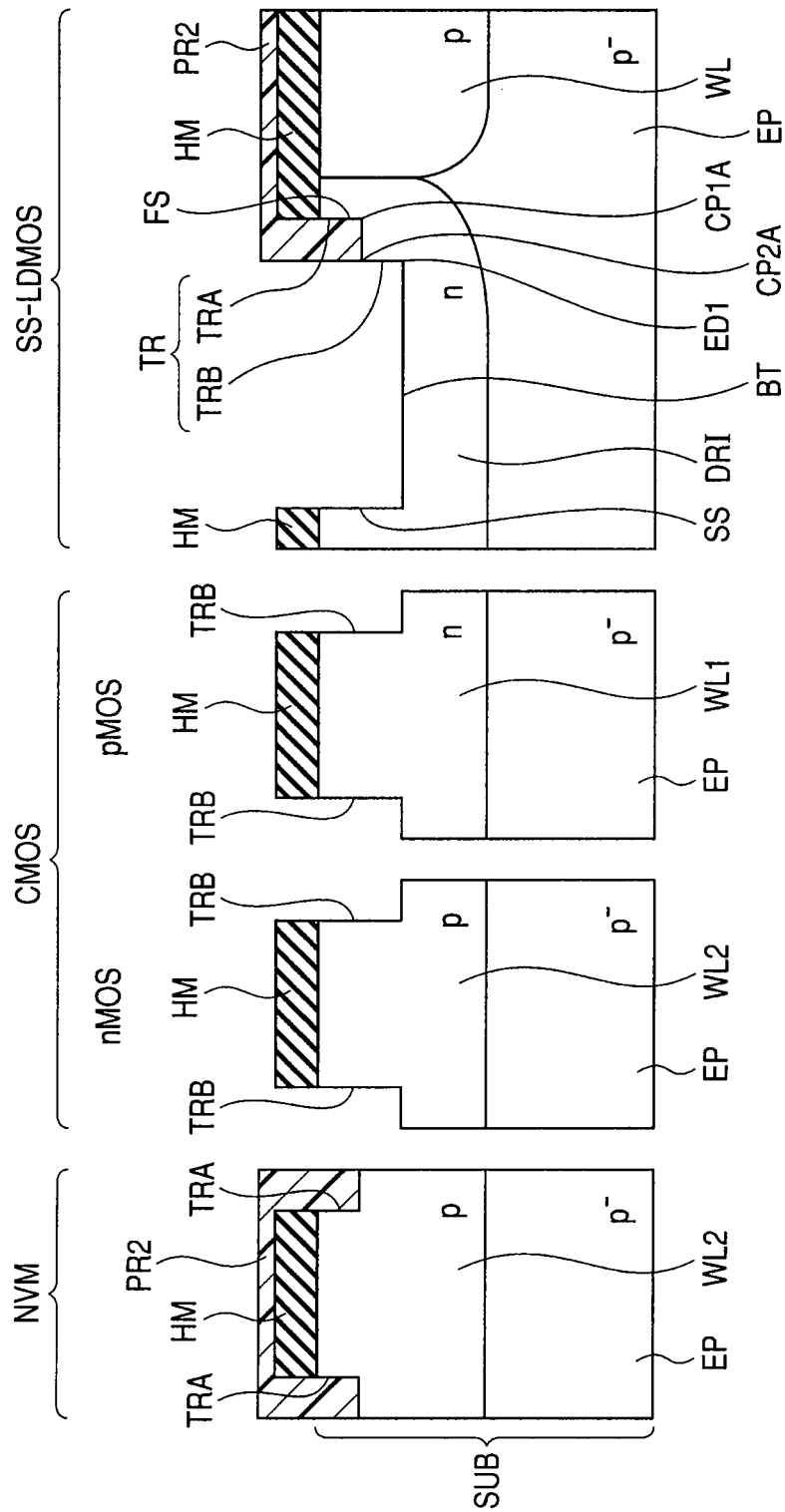
FIG. 11 is a cross-sectional view schematically showing an eighth step of the method of manufacturing the semiconductor device in Embodiment 1 of the present invention.

Referring to FIG. 11, using the photoresist PR2 as a mask, anisotropic etching is performed with respect to the semiconductor substrate SUB. As a result, a trench (second trench) TRB is formed to extend deep under the middle portion and the drain-side sidewall of the trench (first trench) TRA in the SS-LDMOS transistor region. Simultaneously with the formation of the trench (second trench) TRB in the SS-LDMOS transistor region, the trench (third trench) TRA in the CMOS transistor region becomes the trench TRB extending to substantially the same depth as that of the trench (second trench) TRB in the SS-LDMOS transistor region.

In the SS-LDMOS transistor region, the trench (first trench) TRA and the trench (second trench) TRB form the trench TR having the angular portions CP1A and CP2A forming the stepped shape at the one wall portion FS thereof. The respective depths of the angular portions CP1A and CP2A are substantially the same as the depth of the trench (fourth trench) TRA in the nonvolatile memory region. The depth of the bottom portion BT of the trench TR in the SS-LDMOS transistor region is substantially the same as the depth of the trench (third trench) TRB in the CMOS transistor region. Thereafter, the photoresist PR2 is removed by, e.g., ashing or the like.

Figure 12:
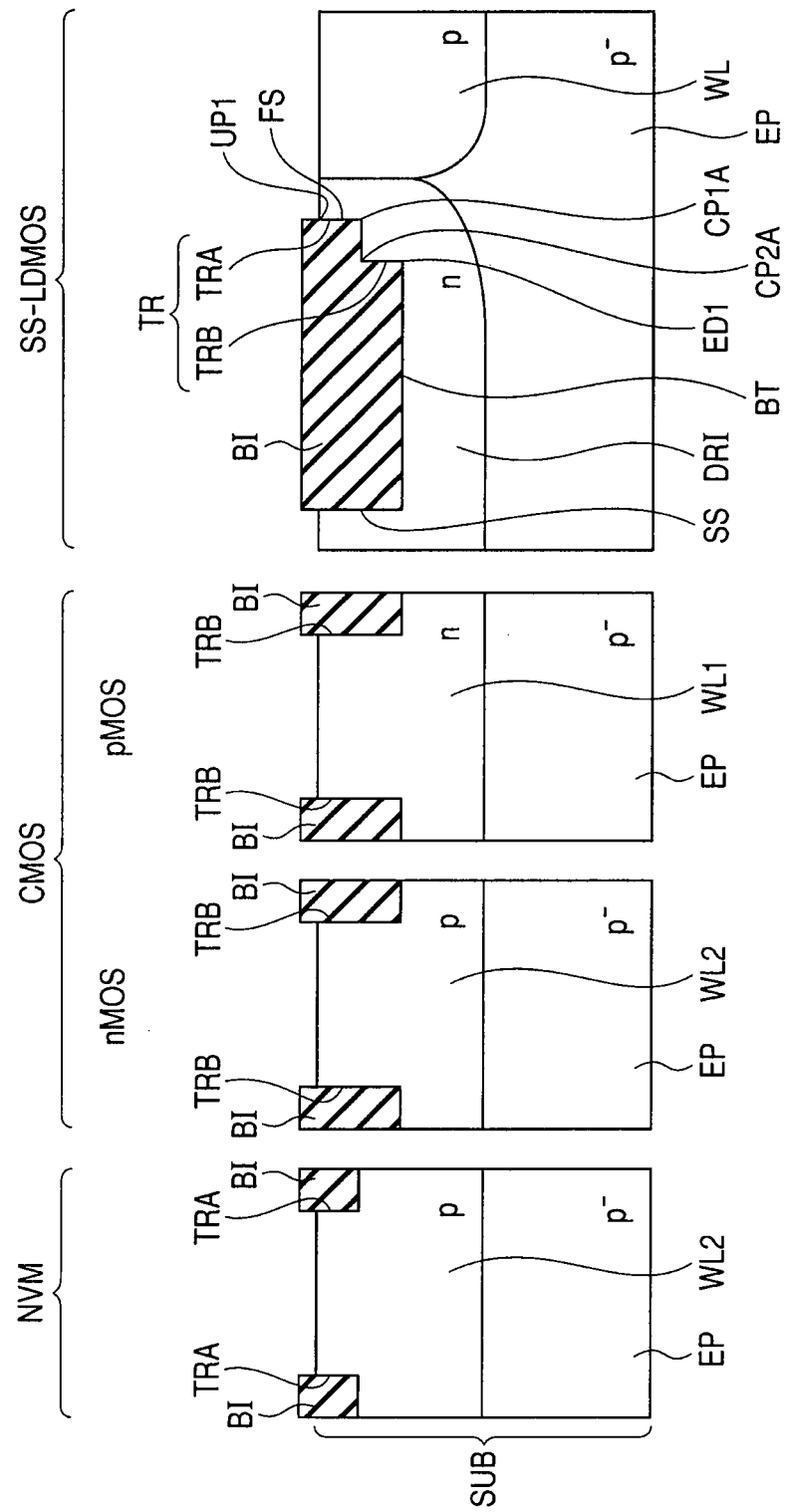
FIG. 12 is a cross-sectional view schematically showing a ninth step of the method of manufacturing the semiconductor device in Embodiment 1 of the present invention.

Referring to FIG. 12, the buried insulating film BI is formed so as to be buried in each of the trenches TR, TRA, and TRB.

Figure 13:
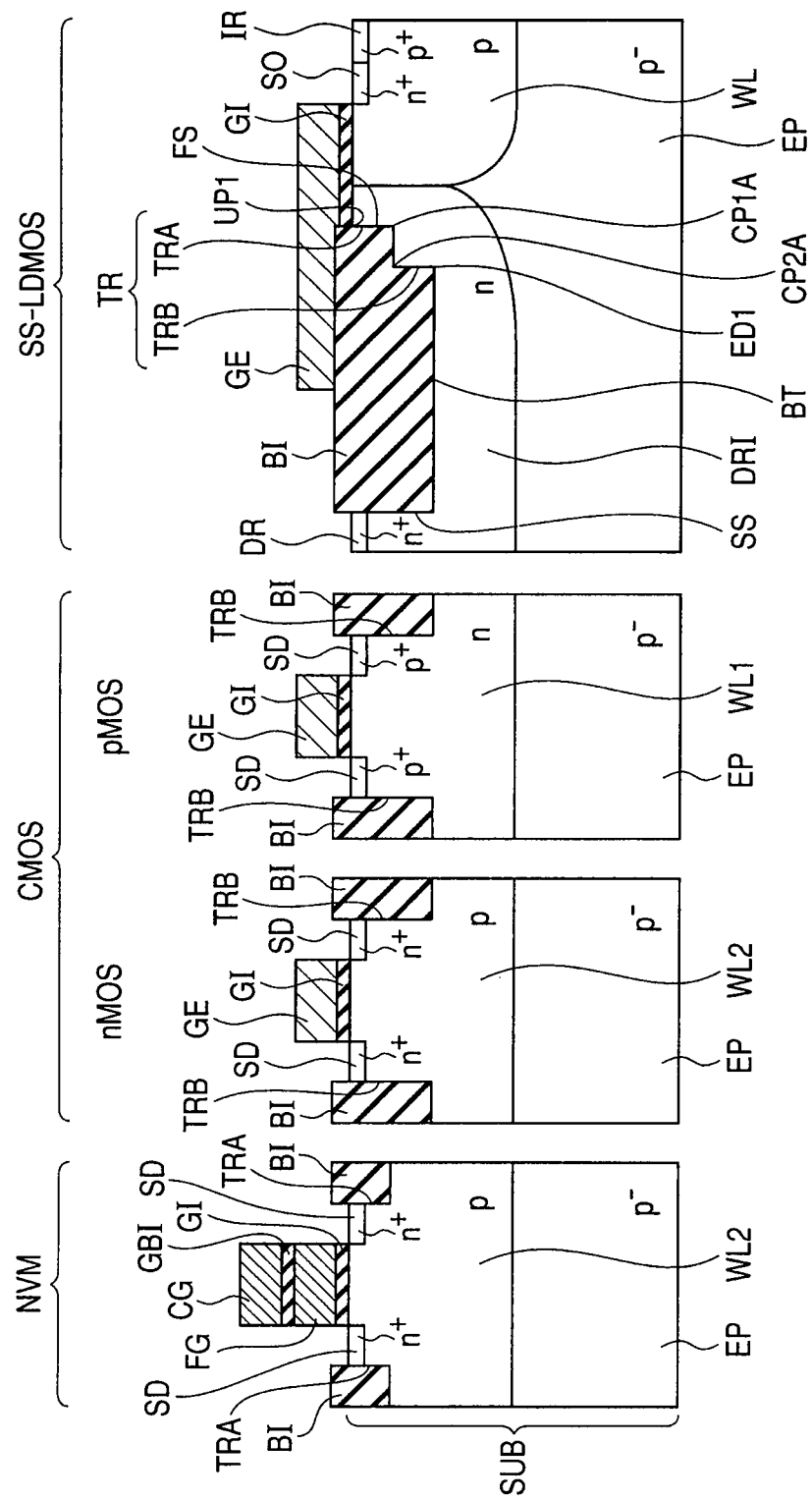
FIG. 13 is a cross-sectional view schematically showing a tenth step of the method of manufacturing the semiconductor device in Embodiment 1 of the present invention.

Referring to FIG. 13, in the SS-LDMOS transistor region, the gate insulating film GI, the gate electrode layer GE, the source region SO, the drain region DR, and the $p^+$ body contact region IR are formed. In the CMOS transistor region, the gate insulating film GI, the gate electrode layer GE, and source/drain regions SD are formed. In the nonvolatile memory region, the gate insulating film GI, a floating gate electrode FG, an intergate insulating film GB1, a control gate electrode CG, and the source/drain regions SD are formed.

By the foregoing process, the semiconductor device according to the present embodiment is manufactured. Next, the operation and effect of the semiconductor device according to the present embodiment will be described in comparison with those of a comparative example shown in FIG. 14.

Figure 14:
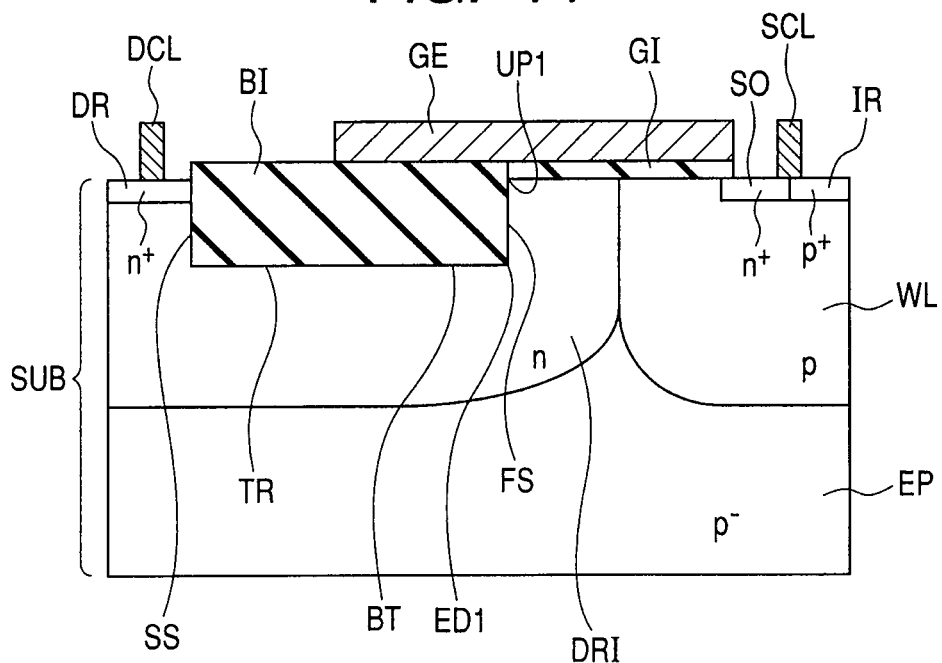
FIG. 14 is a cross-sectional view schematically showing a configuration of a semiconductor device according to a comparative example which does not have an angular portion at a sidewall of a trench of a STI structure.

Referring to FIG. 14, a semiconductor device according to the comparative example is different from the configuration of the present embodiment shown in FIG. 2 in that the one wall portion FS of the trench TR forming the STI structure is not formed with angular portions. Accordingly, each of the one wall portion FS and the other wall portion SS of the trench TR in the comparative example has a cross-sectional shape which is linear from the upper portion UP1 of the trench TR to the bottom portion thereof.

Except for the portion described above, the configuration of the comparative example is substantially the same as the configuration of the present embodiment shown in FIG. 2. Therefore, a description thereof is omitted by providing the same components with the same reference numerals.

The present inventors examined an amount of degradation of a drain current Ids in an Operating Life Test (OLT) in each of the configuration of the present embodiment shown in FIG. 2 and the configuration of the comparative example shown in FIG. 14. The result of the examination is shown in FIG. 15.

The OLT test is a method which gives a given stress (voltage or temperature) to an element under measurement, and evaluates the amount of degradation of the drain current Ids and an amount of time-dependent change of a threshold voltage Vth. In this test, a stress during a worst-case operation is given to an element having an ON breakdown voltage of not less than 60 V by setting a gate voltage Vg to 3.3 V, and setting a drain voltage Vd to 45 V.

Figure 15:
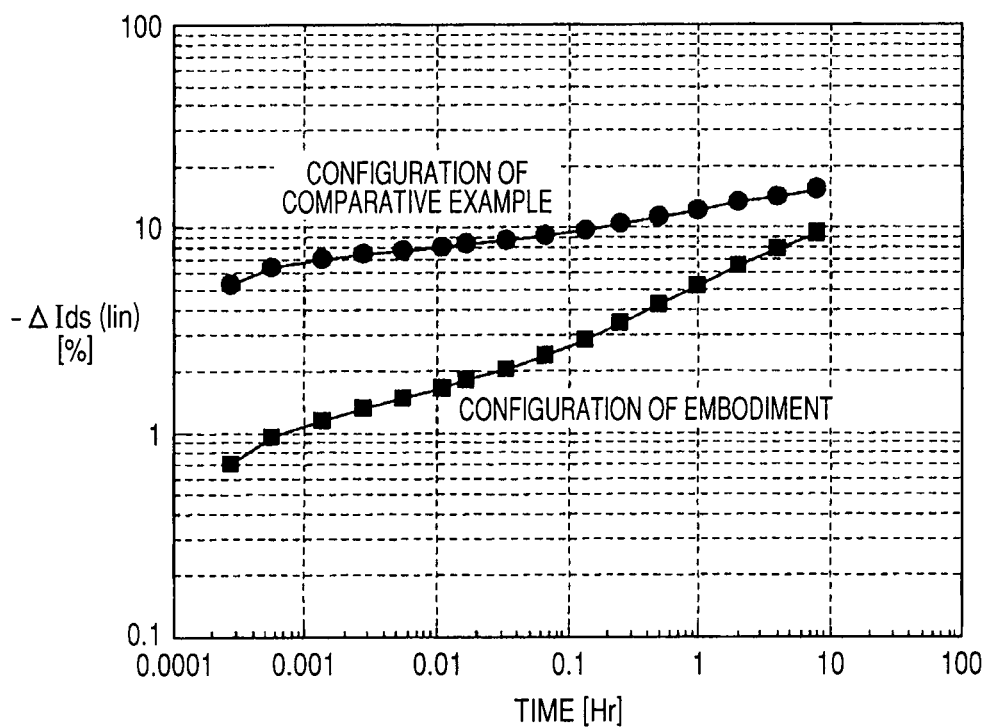
FIG. 15 is a view showing the result of variations in drain current Ids with a lapse of time under an OLT test.

As can be seen from the result of FIG. 15, it has been found that the degradation of the drain current in the configuration of the present embodiment shown in FIG. 2 can be reduced to about half the degradation of the drain current in the configuration of the comparative example shown in FIG. 14, and high element reliability can be obtained.

Figure 16A:
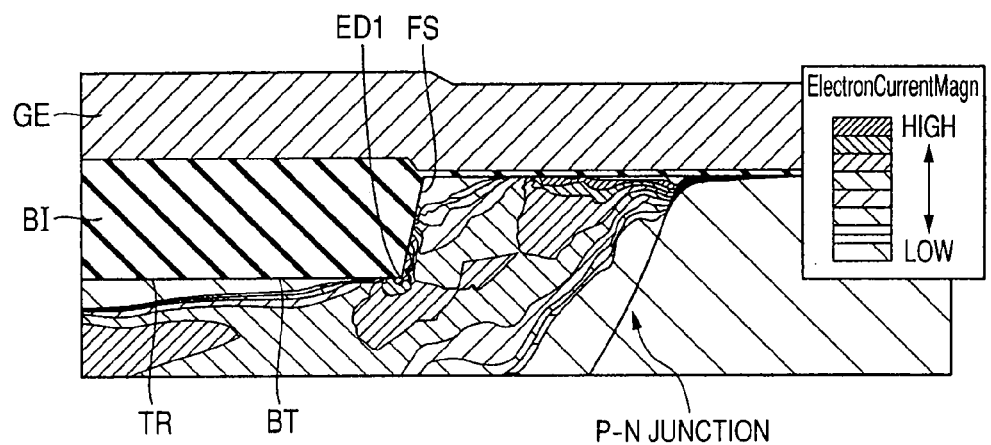
FIG. 16(A) is a distribution diagram of an electron/current density in the comparative example under OLT stressing conditions.
Figure 16B:
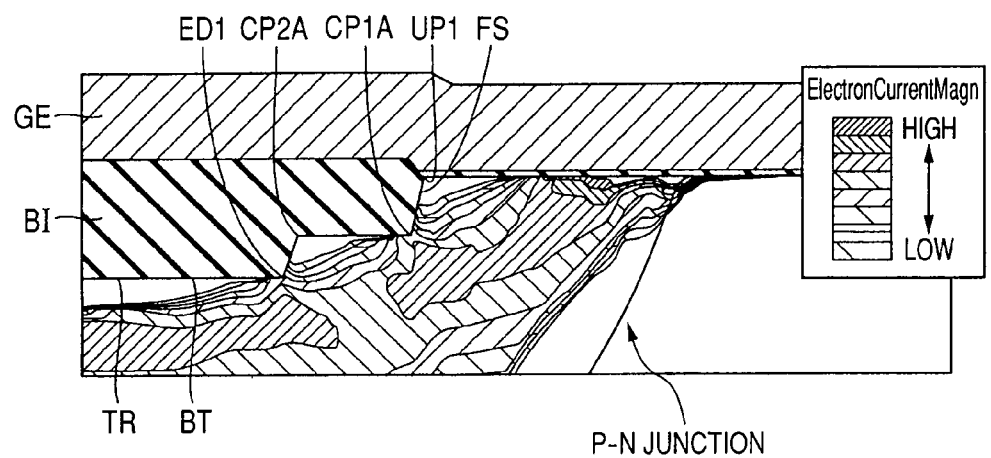
FIG. 16(B) is a distribution diagram of an electron/current density of a stepped type in the configuration shown in FIG. 2 under OLT stressing conditions.
Figure 17A:
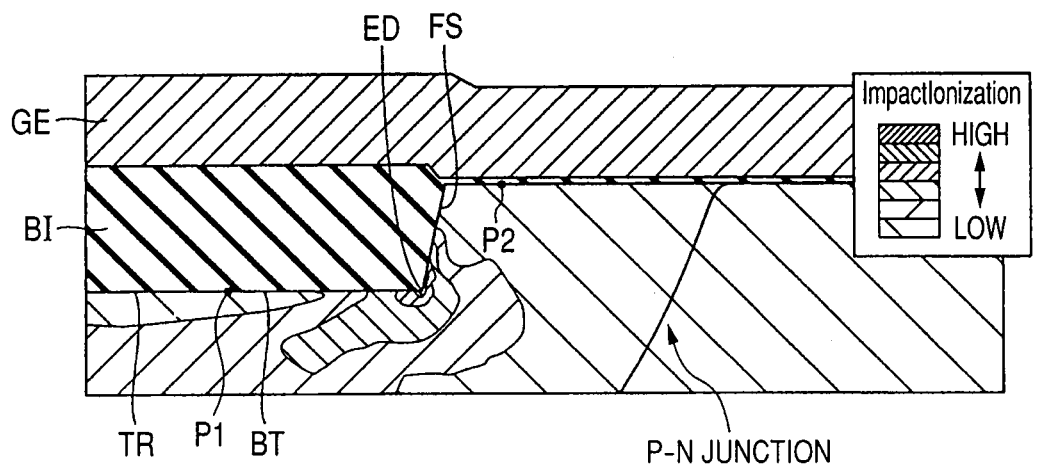
FIG. 17(A) is a distribution diagram of an impact ionization ratio in the comparative example under OLT stressing conditions.
Figure 17B:
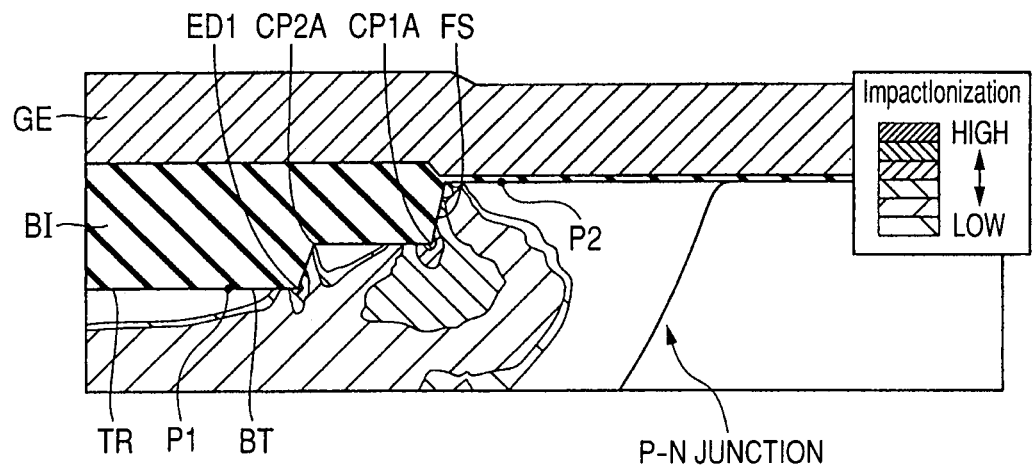
FIG. 17(B) is a distribution diagram of an impact ionization ratio of a stepped type in the configuration shown in FIG. 2 under OLT stressing conditions.
Figure 18:
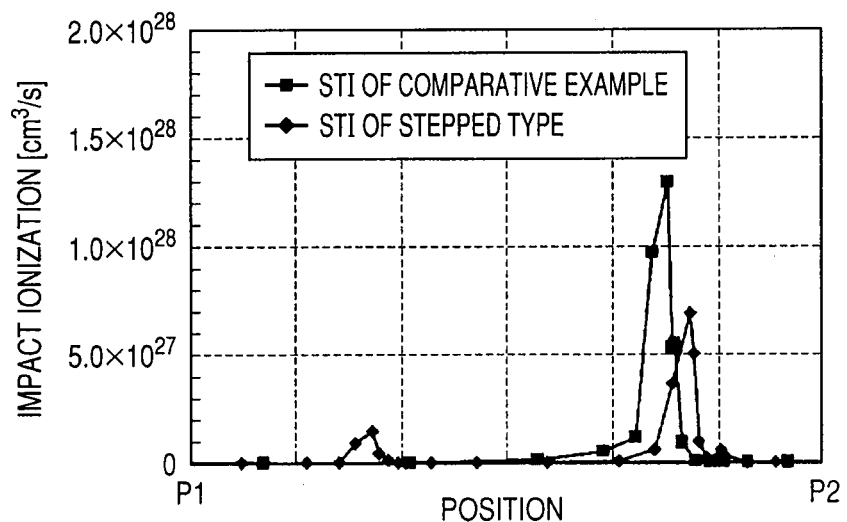
FIG. 18 is a view showing the distribution of the impact ionization ratio along the interface of a semiconductor substrate between the points P1 and P2 of FIG. 17 in each of the configuration of the comparative example and the configuration (of the stepped type) shown in FIG. 2, each under OLT stressing conditions.

To verify the effect of inhibiting the Ids degradation, the present inventors also reproduced a stressed condition under an OLT test by device simulation, and made a comparison between the internal states of the elements. FIGS. 16(A) and 16(B) show the distributions of electron/current densities in the respective configurations of the comparative example and the present embodiment shown in FIG. 2, each under stressing conditions. FIGS. 17(A) and 17(B) show the distributions of compact ionization ratios in the respective configurations of the comparative example and the present embodiment shown in FIG. 2, each under stressing conditions. In the stepped shapes in FIG. 16(B) and FIG. 17(B), X2 and Y2 mentioned in the description of FIG. 3 were set to 120% and 40%, respectively. FIG. 18 shows the distribution of the impact ionization ratio along the interface of the semiconductor substrate between the points P1 and P2 in each of FIGS. 17(A) and 17(B).

As can be seen from the results of FIGS. 16 to 18, it has been found that the electron/current density and the impact ionization ratio are high in the vicinity of the edge portion ED1 of the trench TR in the configuration of the comparative example, and also high in the vicinity of each of the edge portion ED1 and the angular portion CP1A of the trench TR in the configuration of the present embodiment shown in FIG. 2. It has also been found that the electron/current density and the impact ionization ratio in the vicinity of each of the edge portion ED1 and the angular portion CP1A in the configuration shown in FIG. 2 are lower than the electron/current density and the impact ionization ratio in the vicinity of the edge portion ED1 in the configuration of the comparative example shown in FIG. 14.

The impact ionization is a phenomenon in which an electron accelerated by an electric field impinges on a crystal lattice to generate an electron-hole pair. It can be considered that, in the comparative example, a current is concentrated on the edge portion ED1 of the trench TR to increase the electron/current density, and consequently increase the impact ionization ratio. On the other hand, it can be considered that, in the present embodiment, the one wall portion FS of the trench TR is formed into the stepped shape to distribute the current concentration to the edge portion ED1 and to the projecting angular portion CP1A, and accordingly reduce the current concentration and the impact ionization ratio.

The present inventors also examined what influence was exerted on electric characteristics by hot carriers generated by the impact ionization described above when they were trapped at the interface of the edge portion ED1 of the trench TR. The examination was conducted by device simulation in which negative charges are generated at the interface of the edge portion ED1 of the trench TR to artificially reproduce a state where electrons are trapped.

Figure 19:
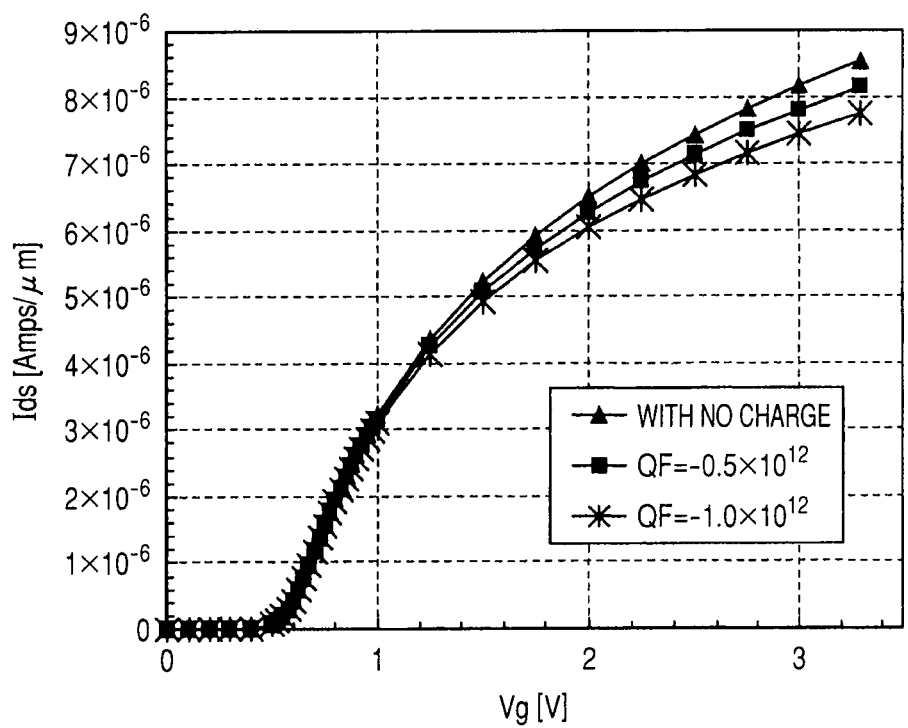
FIG. 19 is a view showing the Vg-Id characteristic of a gate voltage Vg and a drain current Ids when charges are generated in an edge portion of a STI structure.

FIG. 19 shows respective Vg-Ids characteristics when charges are generated in the edge portion ED1 of the trench TR and when charges are not generated therein. As can be seen from the result of FIG. 19, an ON current showed a tendency to decrease as the minus charges placed in the edge portion ED1 of the trench TR were larger.

Figure 20A:
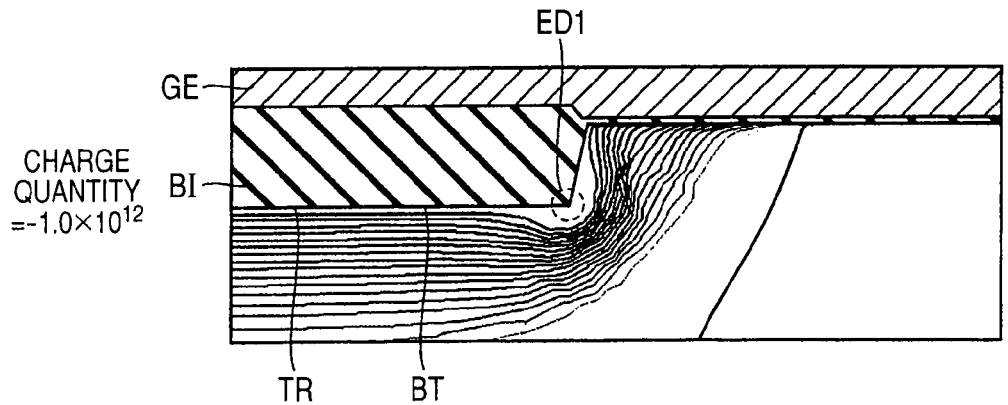
FIGS. 20A, 20B, and 20C are views showing, for comparison, current paths in an ON state (where Vg=3.3 V and Vd=0.1 V) when charges generated in the edge portion of the STI structure are varied.
Figure 20B:
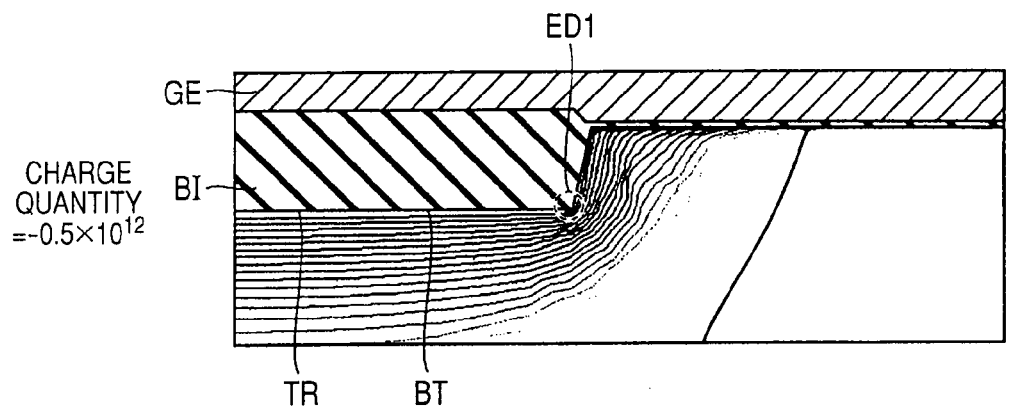
Figure 20C:
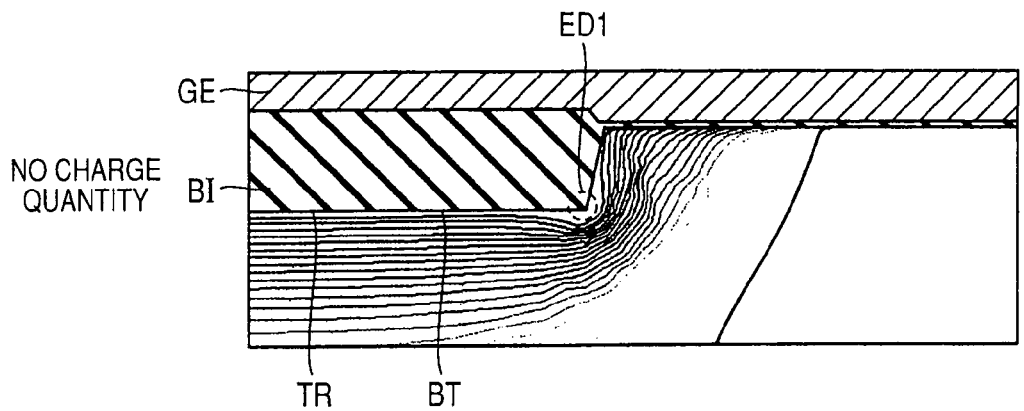

FIGS. 20(A), 20(B), and 20(C) are views showing, for comparison, respective current paths in an ON state (where Vg=3.3 V and Vd=0.1 V) in the cases where a quantity of charges generated in the edge portion ED1 of the trench TR was $-1.0 \times 10^{12}$, where a quantity of charges generated in the edge portion ED1 of the trench TR was $-0.5 \times 10^{12}$, and where no charge was generated. The solid lines in the semiconductor substrate of FIG. 20 are the contours of currents/potentials and, among the plurality of contours, the one closer to the trench TR shows the negatively higher current/potential.

As can be seen from the result of FIG. 20, it has been found that, as the negative charges in the edge portion ED1 of the trench TR are larger in quantity, a current flows further away from the edge portion ED1 of the trench TR. It can be considered that, because the current path becomes longer as the current flows further away from the edge portion ED1, an ON resistance increases, and a current capability decreases.

Therefore, it has been found that the Ids degradation in the OLT test is caused by the trapping of hot carries generated by the impact ionization at the interface of the edge portion ED1 of the trench TR, and is correlated with the impact ionization ratio in the edge portion ED1 of the trench TR.

Thus, in the SS-LDMOS transistor according to the present embodiment, the current concentration can be reduced by forming the one wall portion FS of the trench TR into the stepped shape as compared to the reduction of the current concentration in the configuration of the comparative example. Therefore, it can be considered that the generation of hot carriers due to the impact ionization and the trapping of electrons at the interface of the edge portion ED1 of the trench TR are inhibited, and the Ids degradation can be reduced.
(Embodiment 2)

Next, a configuration of a semiconductor device according to Embodiment 2 will be described using FIG. 21.

Figure 21:
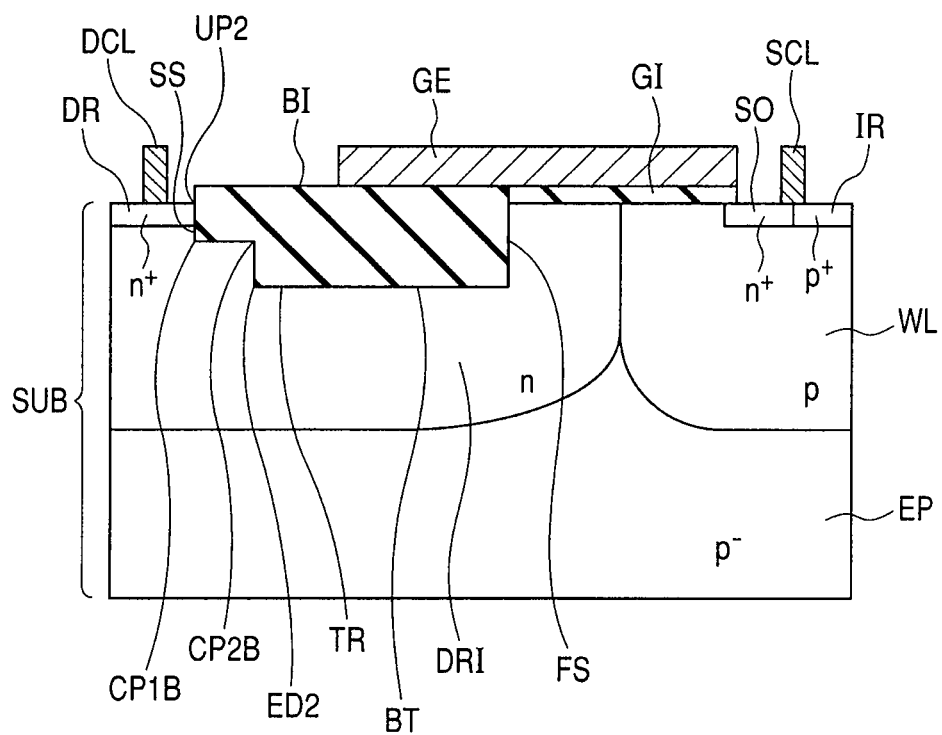
FIG. 21 is a cross-sectional view schematically showing a configuration of a semiconductor device in Embodiment 2 of the present invention.

Referring to FIG. 21, the configuration of the present embodiment is different from the configuration of Embodiment 1 shown in FIG. 2 in that the other wall portion SS of the trench TR closer to the drain has a stepped shape, while the one wall portion FS of the trench TR closer to the source does not have a stepped shape. In the configuration of the present embodiment, the other wall portion SS of the trench TR has a projecting angular portion CP1B and a depressed angular portion CP2B to show a stepped shape when viewed in cross section.

The two angular portions CP1B and CP2B are located between an upper portion UP2 of the trench TR located in the main surface of the semiconductor substrate SUB and the bottom portion BT thereof. Note that, in the present embodiment, the angular portions located between the upper portion TP2 and the bottom portion BT of the trench TR do not include an edge portion ED2 formed at the intersection of the bottom portion BT and the other wall portion SS of the trench TR.

Each of the angular portions described above may have a right-angled shape, an obtuse-angled shape, or an acute-angled shape in the cross section of FIG. 21.

The configuration of the present embodiment is otherwise substantially the same as the configuration of Embodiment 1 described above. Therefore, a description thereof is omitted by providing the same components with the same reference numerals.

Next, the stepped shape of the other wall portion SS of the trench TR will be described using FIG. 3. Referring to FIG. 3, when it is assumed that the dimension from the upper portion UP2 of the trench TR to the bottom portion BT thereof in the depth direction is S2 and proportions (%) are X1 and Y1, the angular portion CP1B of the other wall portion SS is located at a position (position closer to the main surface of the semiconductor substrate SUB) shallower by S2×Y1 than the bottom portion BT of the trench TR. The junction portion (edge portion) ED2 between the other wall portion SS and the bottom portion BT is located at the depth S2 from the main surface of the semiconductor substrate SUB and closer to the source (closer to the one wall portion FS) by S2×X1 as measured from the upper portion UP2 of the trench TR in a lateral direction (direction along the main surface of the semiconductor substrate SUB).

Here, when the proportion X1 is 120%, the proportion Y1 is preferably 40%. When the proportion X1 is 200%, Y1 is preferably not less than 60% and not more than 80%.

Figure 22:
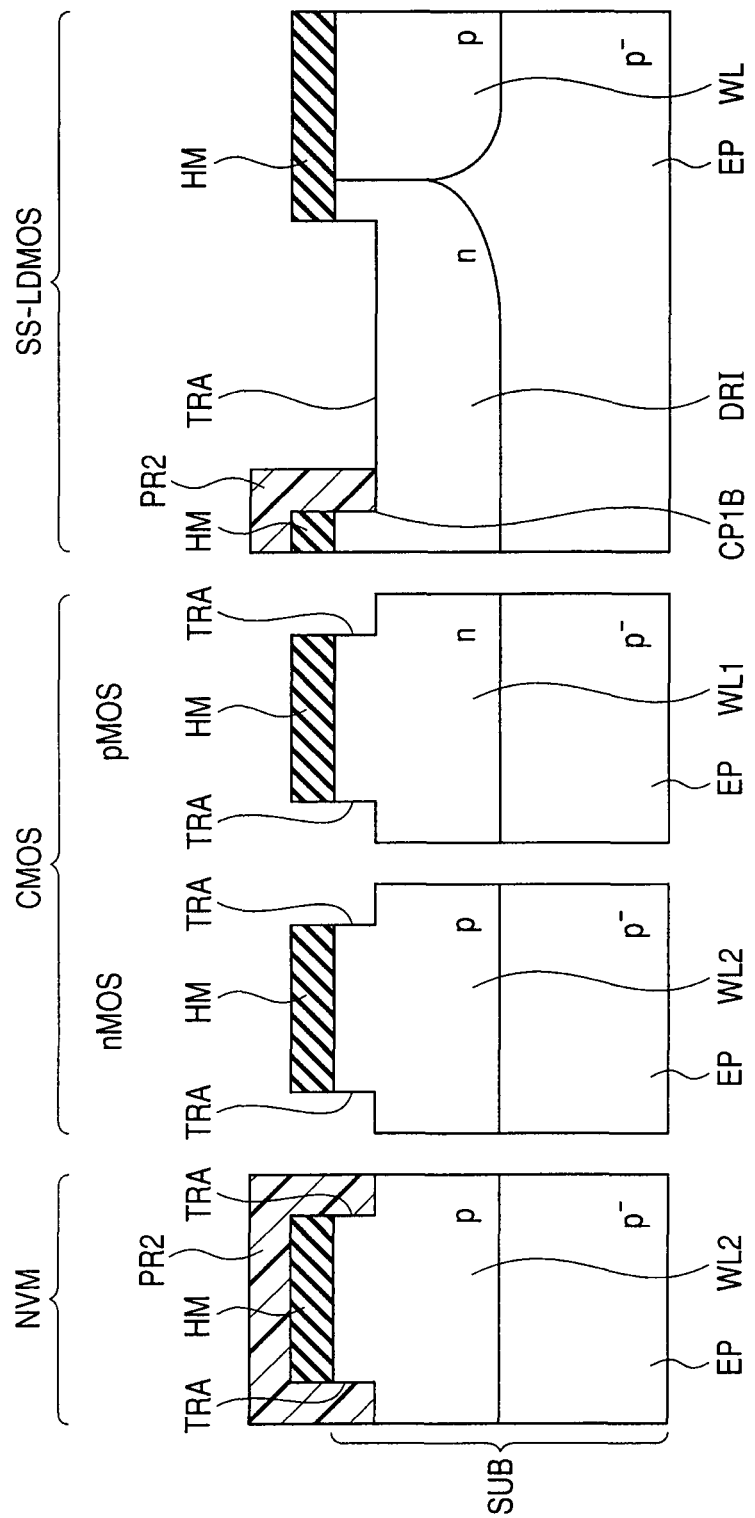
FIG. 22 is a cross-sectional view schematically showing a first step of a method of manufacturing the semiconductor device in Embodiment 2 of the present invention.

Next, a method of manufacturing the semiconductor device according to the present embodiment will be described using FIGS. 22 and 23.

In the manufacturing method according to the present embodiment, the same steps as those of Embodiment 1 shown in FIGS. 4 to 9 are performed first. Then, referring to FIG. 22, the patterned photoresist PR2 is formed using a typical photoengraving technique. The photoresist PR2 is formed in the SS-LDMOS transistor region to cover the drain side of the trench (first trench) TRA, and open the source side and the middle portion of the trench (first trench) TRA between the source side and the drain side thereof. The photoresist PR2 is also formed to open the entire trench (third trench) TRA in the CMOS transistor region, and cover the entire trench (fourth trench) TRA in the nonvolatile memory region.

Figure 23:
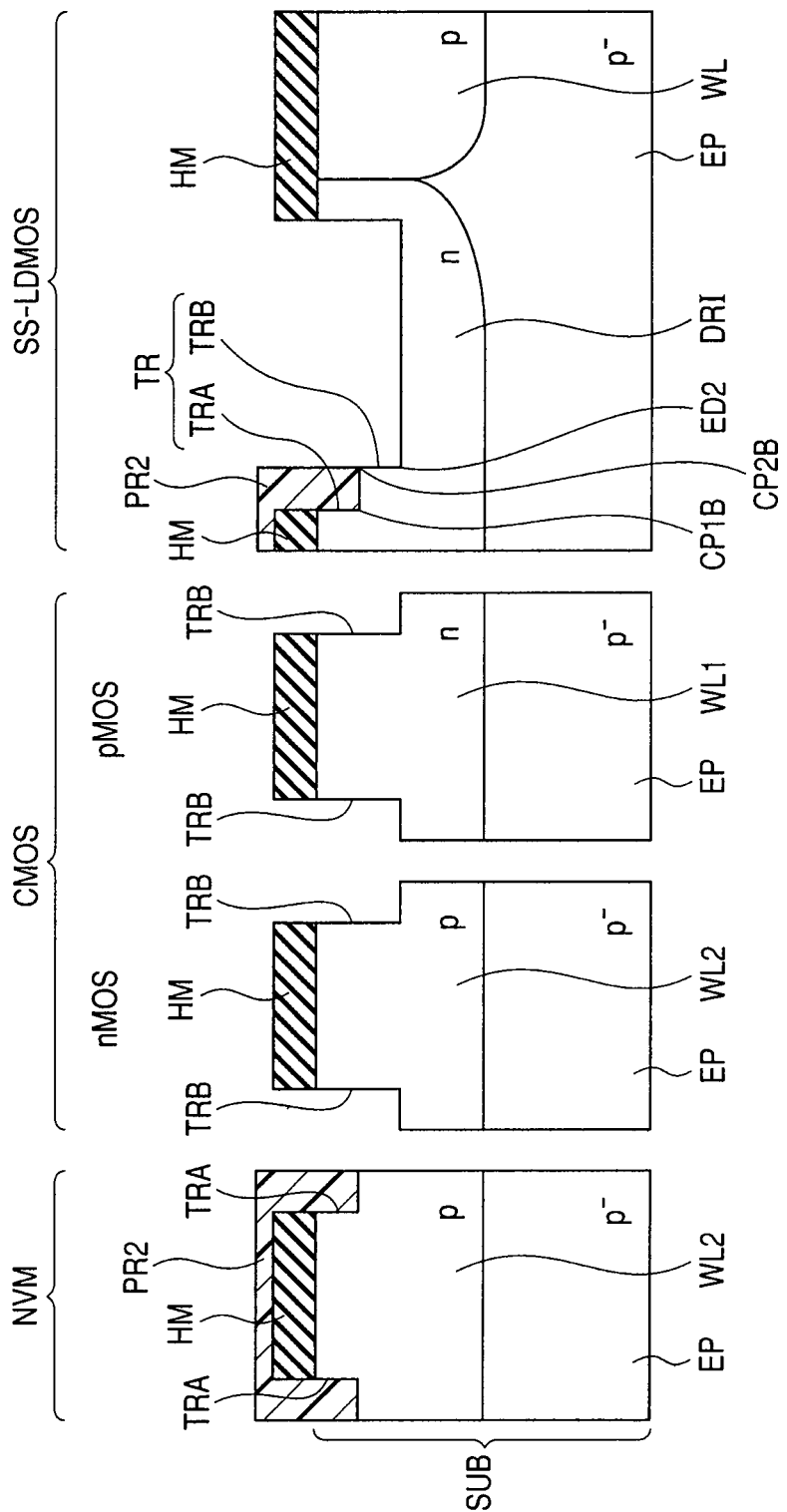
FIG. 23 is a cross-sectional view schematically showing a second step of the method of manufacturing the semiconductor device in Embodiment 2 of the present invention.

Referring to FIG. 23, using the photoresist PR2 as a mask, anisotropic etching is performed with respect to the semiconductor substrate SUB. As a result, the trench (second trench) TRB is formed to extend deep under the middle portion and the source-side sidewall of the trench (first trench) TRA in the SS-LDMOS transistor region. Simultaneously with the formation of the trench (second trench) TRB in the SS-LDMOS transistor region, the trench (third trench) TRA of the CMOS transistor region becomes the trench TRB extending to substantially the same depth as that of the trench (second trench) TRB in the SS-LDMOS transistor region.

In the SS-LDMOS transistor region, the trench (first trench) TRA and the trench (second trench) TRB form the trench TR having the angular portions CP1B and CP2B forming the stepped shape at the other wall portion SS thereof. The respective depths of the angular portions CP1B and CP2B are substantially the same as the depth of the trench (fourth trench) TRA in the nonvolatile memory region. The depth of the bottom portion BT of the trench TR in the SS-LDMOS transistor region is substantially the same as the depth of the trench (third trench) TRB in the CMOS transistor region. Thereafter, the photoresist PR2 is removed by, e.g., ashing or the like.

Thereafter, by performing the same steps as those of Embodiment 1 shown in FIGS. 12 and 13, the semiconductor device according to the present embodiment is manufactured.

Next, the operation and effect of the semiconductor device according to the present embodiment will be described in comparison with those of the comparative example shown in FIG. 14.

Figure 24A:
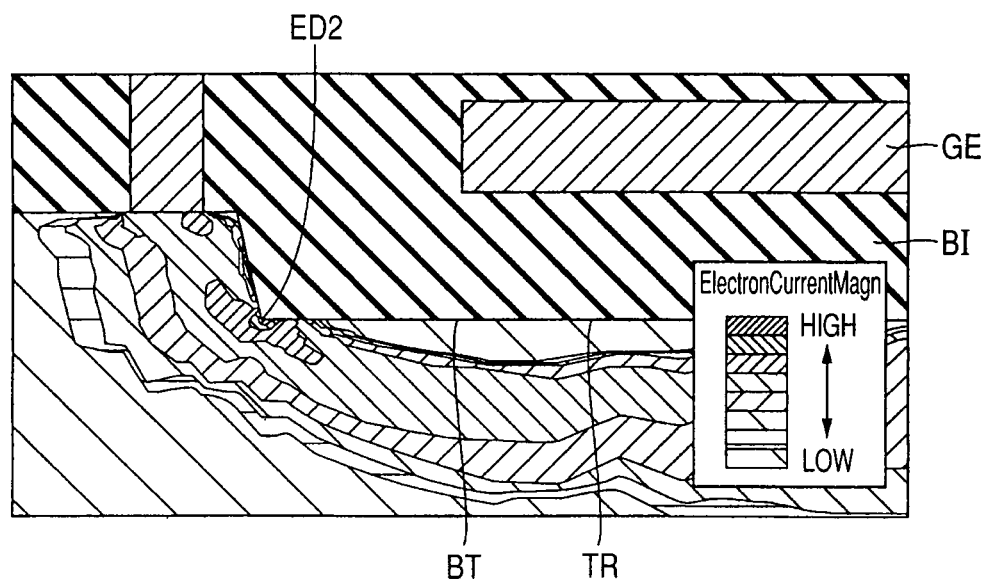
FIG. 24(A) is a distribution diagram of an electron/current density in a comparative example under OLT stressing conditions.
Figure 24B:
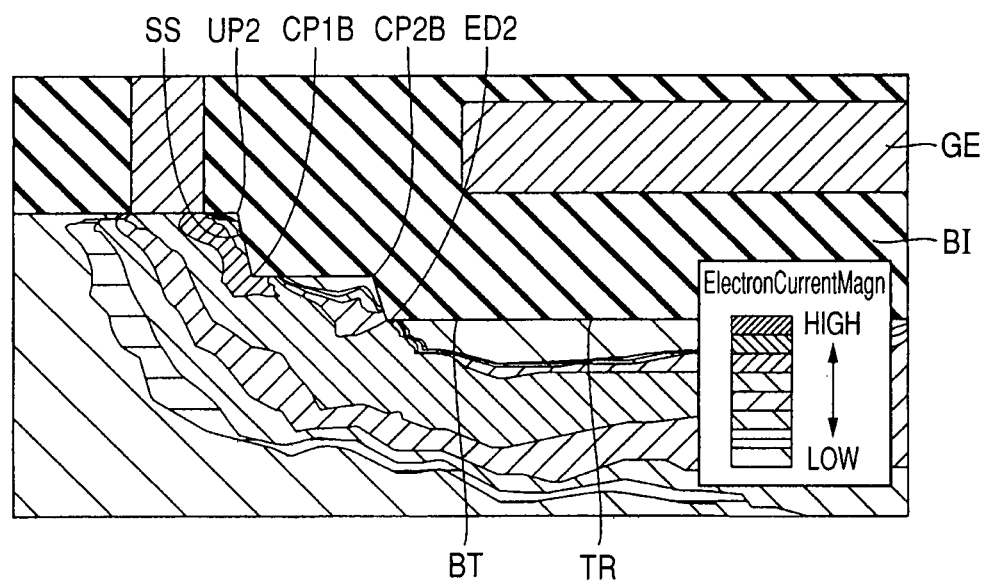
FIG. 24(B) is a distribution diagram of an electron/current density of a stepped type in Embodiment 2 under OLT stressing conditions.
Figure 25A:
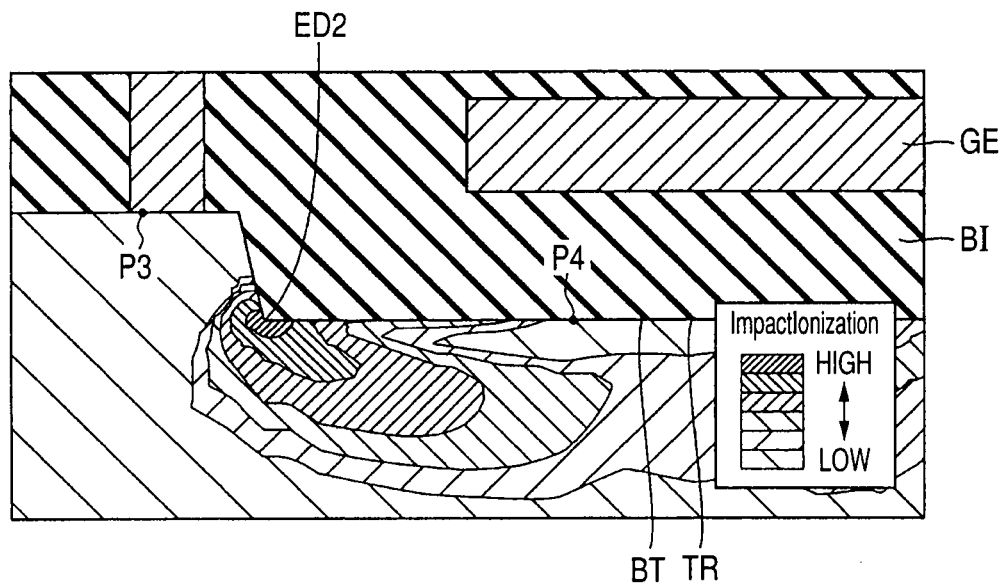
FIG. 25(A) is a distribution diagram of an impact ionization ratio in the comparative example under OLT stressing conditions.
Figure 25B:
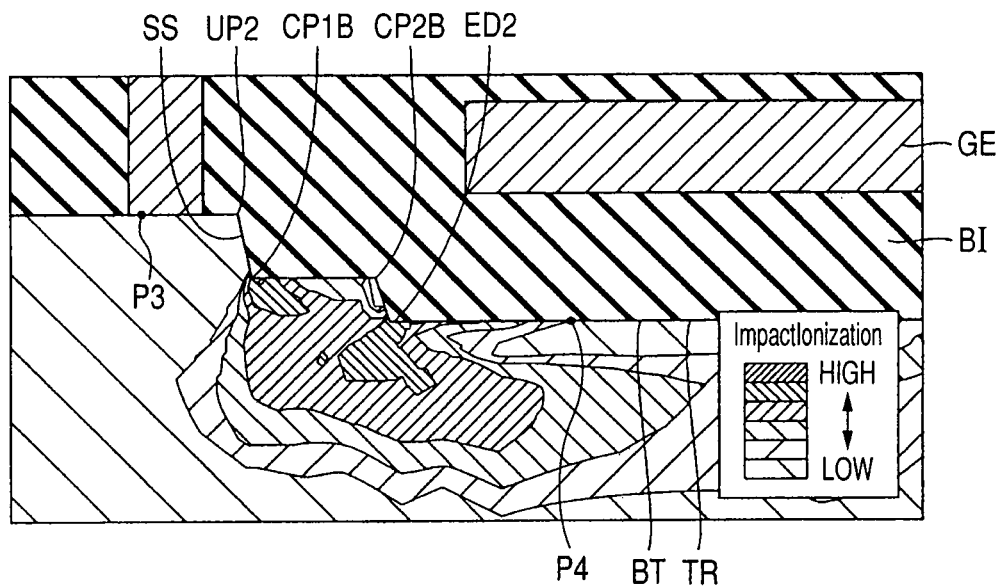
FIG. 25(B) is a distribution diagram of an impact ionization ratio of a stepped type in Embodiment 2 under OLT stressing conditions.
Figure 26:
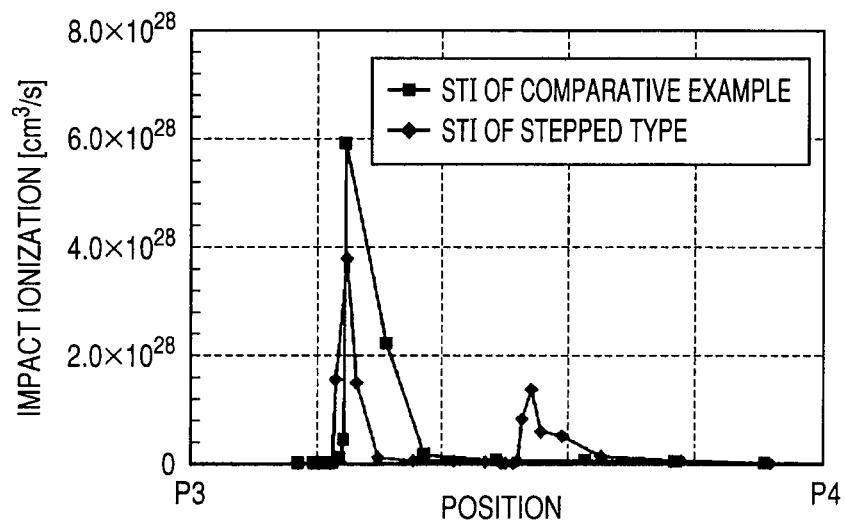
FIG. 26 is a view showing the distribution of the impact ionization ratio along the interface of a semiconductor substrate between the points P3 and P4 of FIG. 25 in each of the configuration of the comparative example and the configuration (of the stepped type) shown in FIG. 21, each under OLT stressing conditions.

The present inventors reproduced a stressed condition under an OLT test by device simulation, and made a comparison between the internal states of the elements. FIGS. 24(A) and 24(B) show the respective distributions of electron/current densities in the comparative example and the present embodiment shown in FIG. 21, each under stressing conditions. FIGS. 25(A) and 25(B) show the respective distributions of compact ionization ratios in the comparative example and the present embodiment shown in FIG. 21, each under stressing conditions. In the stepped shapes in FIG. 24(B) and FIG. 25(B), X1 and Y1 mentioned in the description of FIG. 3 were set to 120% and 40%, respectively. FIG. 26 shows the distribution of the impact ionization ratio along the interface of the semiconductor substrate between the points P3 and P4 in each of FIGS. 25(A) and 25(B).

As can be seen from the results of FIGS. 24 to 26, it has been found that the electron/current density and the impact ionization ratio are high in the vicinity of the edge portion ED2 of the trench TR in the comparative example, and also high in the vicinity of each of the edge portion ED2 and the angular portion CP1B of the trench TR in the present embodiment. It has also been found that the electron/current density and the impact ionization ratio in the vicinity of each of the edge portion ED2 and the angular portion CP1B in the present embodiment are lower than the electron/current density and the impact ionization ratio in the vicinity of the edge portion ED2 in the comparative example.

The result described above can be considered in the same manner as in Embodiment 1. That is, it can be considered that, in the comparative example, a current is concentrated on the edge portion ED2 of the trench TR to increase the electron/current density, and consequently increase the impact ionization ratio. On the other hand, it can be considered that, in the present embodiment, the other wall portion SS of the trench TR is formed into the stepped shape to distribute the current concentration to the edge portion ED2 and to the projecting angular portion CP1B, and accordingly reduce the current concentration and the impact ionization ratio.

Thus, in the SS-LDMOS transistor according to the present embodiment, the current concentration can be reduced by forming the other wall portion SS of the trench TR into the stepped shape as compared to the reduction of the current concentration in the configuration of the comparative example. Therefore, it can be considered that the generation of hot carriers due to the impact ionization and the trapping of electrons at the interface of the edge portion ED2 of the trench TR are inhibited, and the Ids degradation can be reduced.

(Embodiment 3)

Next, a configuration of a semiconductor device according to Embodiment 3 will be described using FIG. 27.

Figure 27:
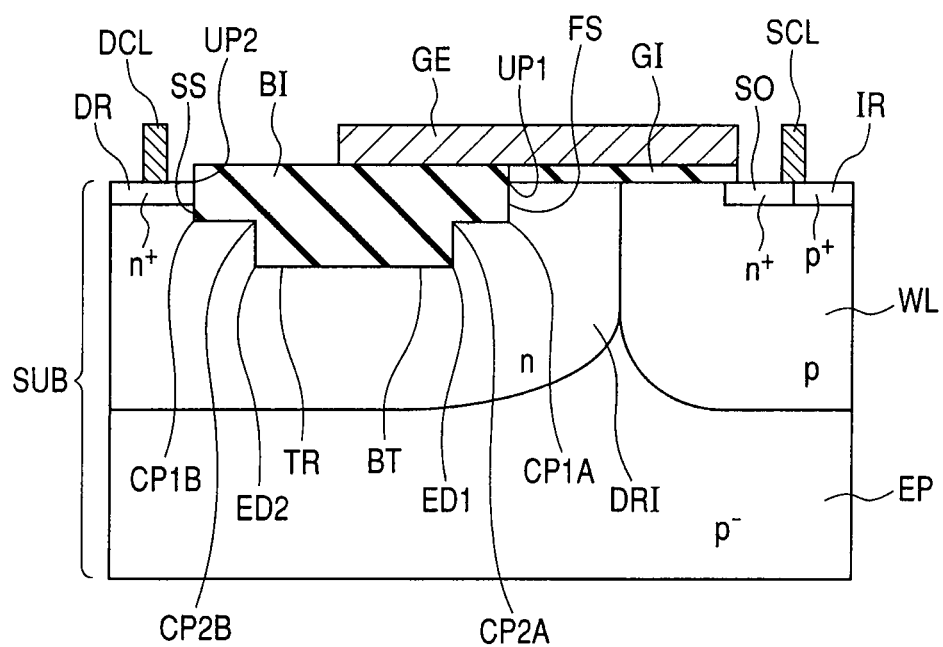
FIG. 27 is a cross-sectional view schematically showing a configuration of a semiconductor device in Embodiment 3 of the present invention.

Referring to FIG. 27, the configuration of the present embodiment is different from the configuration of Embodiment 1 shown in FIG. 2 in that not only the one wall portion FS of the trench TR closer to the source, but also the other wall portion SS of the trench RT closer to the drain have respective stepped shapes. In the configuration of the present embodiment, the one wall portion FS of the trench TR closer to the source has the projecting angular portion CP1A and the depressed angular portion CP2A to show a stepped shape when viewed in cross section. On the other hand, the other wall portion SS of the trench TR closer to the drain has the projecting angular portion CP1B and the depressed angular portion CP2B to also show a stepped shape when viewed in cross section.

The two angular portions CP1A and CP2A of the one wall portion FS are located between the upper portion UP1 of the trench TR located in the main surface of the semiconductor substrate SUB and the bottom portion BT thereof.

On the other hand, the two angular portions CP1B and CP2B are located between the upper portion UP2 of the trench TR located in the main surface of the semiconductor substrate SUB and the bottom portion BT thereof.

Each of these angular portions may have a right-angled shape, an obtuse-angled shape, or an acute-angled shape in the cross section of FIG. 27.

The configuration of the present embodiment is otherwise substantially the same as the configuration of Embodiment 1 described above. Therefore, a description thereof is omitted by providing the same components with the same reference numerals.

As for the stepped shape of each of the one wall portion FS and the other wall portion SS of the trench TR, it is the same as the shape described above in Embodiments 1 and 2 using FIG. 3.

That is, referring to FIG. 3, the angular portion CP1A is located at a position (position closer to the main surface of the semiconductor substrate SUB) shallower by S1×Y2 than the bottom portion BT of the trench TR. The junction portion (edge portion) ED1 between the one wall portion FS having the stepped shape and the bottom portion BT is located at the depth S1 from the main surface of the semiconductor substrate SUB and closer to the drain (closer to the other wall portion SS) by S1×X2 as measured from the upper portion UP1 of the trench TR in a lateral direction (direction along the main surface of the semiconductor substrate SUB).

Here, when the proportion X2 is 80%, the proportion Y2 is preferably not less than 40% and not more than 80%. When the proportion X2 is in the range of not less than 40% and not more than 120%, X2:Y2=1:2 is preferably satisfied.

Referring to FIG. 3, the angular portion CP1B of the other wall portion SS is located at a position (position closer to the main surface of the semiconductor substrate SUB) shallower by S2×Y1 than the bottom portion BT of the trench TR. The junction portion (edge portion) ED2 between the other wall portion SS having the stepped shape and the bottom portion BT is located at the depth S2 from the main surface of the semiconductor substrate SUB and closer to the source (closer to the one wall portion FS) by S2×X1 as measured from the upper portion UP2 of the trench TR in a lateral direction (direction along the main surface of the semiconductor substrate SUB).

Here, when the proportion X1 is 120%, the proportion Y1 is preferably 40%. When the proportion X1 is 200%, X1 is preferably not less than 60% and not more than 80%.

Figure 28:
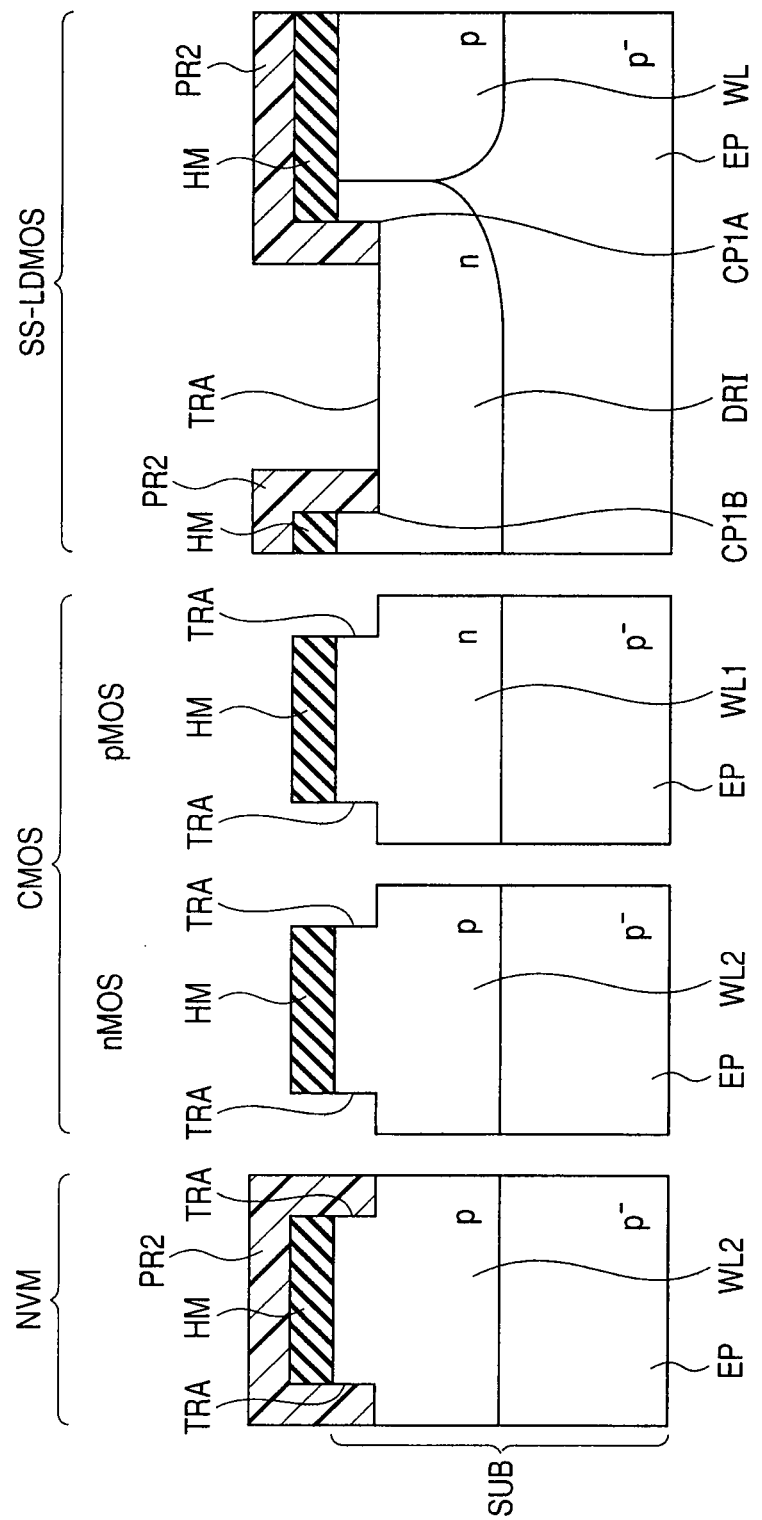
FIG. 28 is a cross-sectional view schematically showing a first step of a method of manufacturing the semiconductor device in Embodiment 3 of the present invention.

Next, a method of manufacturing the semiconductor device according to the present embodiment will be described using FIGS. 28 and 29.

In the manufacturing method according to the present embodiment, the same steps as those of Embodiment 1 shown in FIGS. 4 to 9 are performed first. Then, referring to FIG. 28, the patterned photoresist PR2 is formed using a typical photoengraving technique. The photoresist PR2 is formed in the SS-LDMOS transistor region to cover the drain side and the source side of the trench (first trench) TRA, and open the middle portion of the trench (first trench) TRA interposed between the drain side and the source side thereof. The photoresist PR2 is also formed to open the entire trench (third trench) TRA in the CMOS transistor region, and cover the entire trench (fourth trench) TRA in the nonvolatile memory region.

Figure 29:
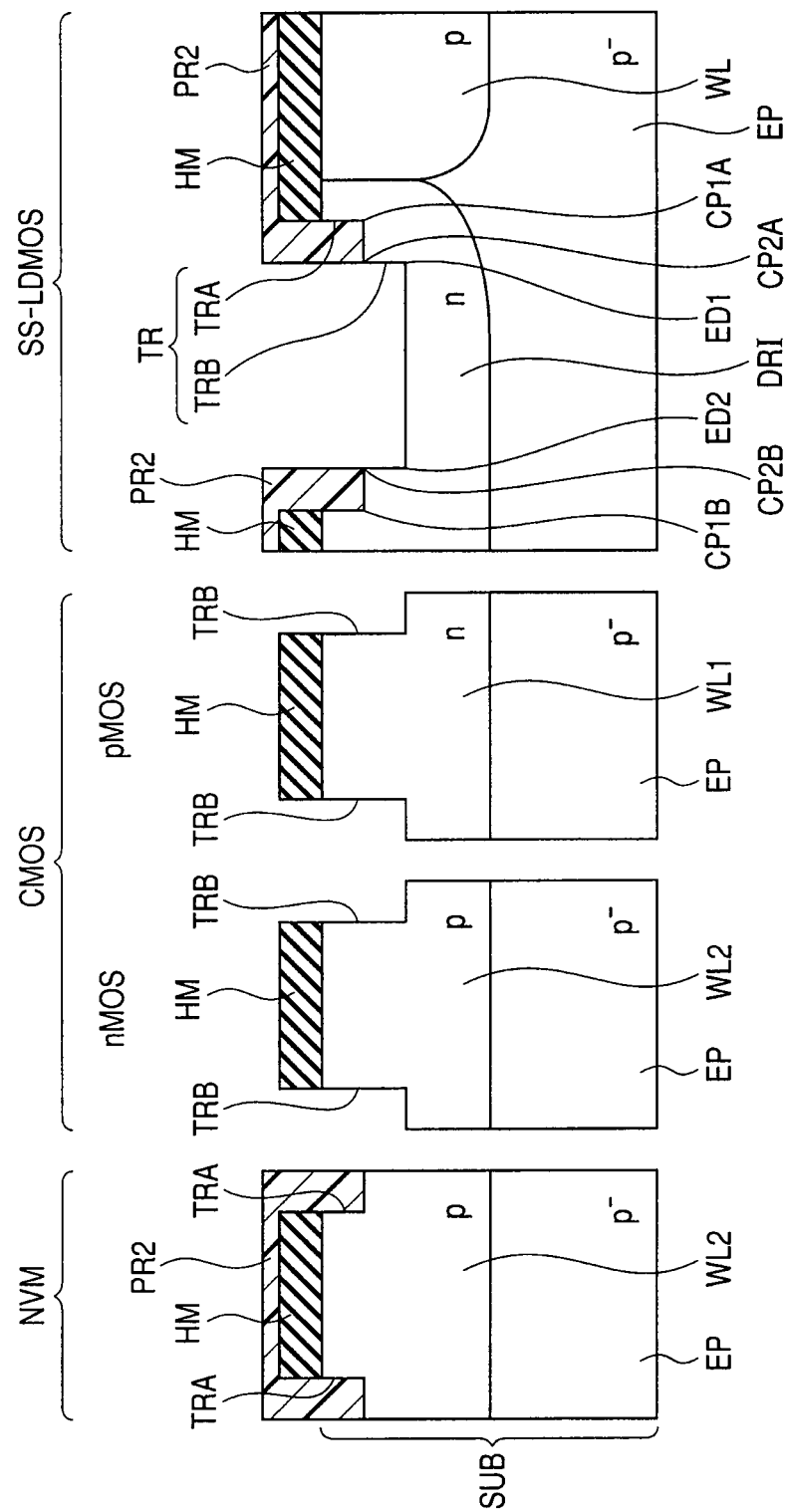
FIG. 29 is a cross-sectional view schematically showing a second step of the method of manufacturing the semiconductor device in Embodiment 3 of the present invention.

Referring to FIG. 29, using the photoresist PR2 as a mask, anisotropic etching is performed with respect to the semiconductor substrate SUB. As a result, the trench (second trench) TRB is formed to extend deep under the middle portion of the trench (first trench) in the SS-LDMOS transistor region. Simultaneously with the formation of the trench (second trench) TRB in the SS-LDMOS transistor region, the trench (third trench) TRA of the CMOS transistor region becomes the trench TRB extending to substantially the same depth as that of the trench (second trench) TRB in the SS-LDMOS transistor region.

In the SS-LDMOS transistor region, the trench (first trench) TRA and the trench (second trench) TRB form the trench TR. The trench TR has the angular portions CP1A and CP2A forming the stepped shape at the one wall portion FS thereof, and the angular portions CP1B and CP2B forming the stepped shape at the other wall portion SS thereof. The respective depths of the angular portions CP1A, CP2A, CP1B, and CP2B are substantially the same as the depth of the trench (fourth trench) TRA in the nonvolatile memory region. The depth of the bottom portion BT of the trench TR in the SS-LDMOS transistor region is substantially the same as the depth of the trench (third trench) TRB in the CMOS transistor region. Thereafter, the photoresist PR2 is removed by, e.g., ashing or the like.

Thereafter, by performing the same steps as those of Embodiment 1 shown in FIGS. 12 and 13, the semiconductor device according to the present embodiment is manufactured.

Next, the operation and effect of the semiconductor device according to the present embodiment will be described in comparison with those of the comparative example shown in FIG. 14.

Figure 30A:
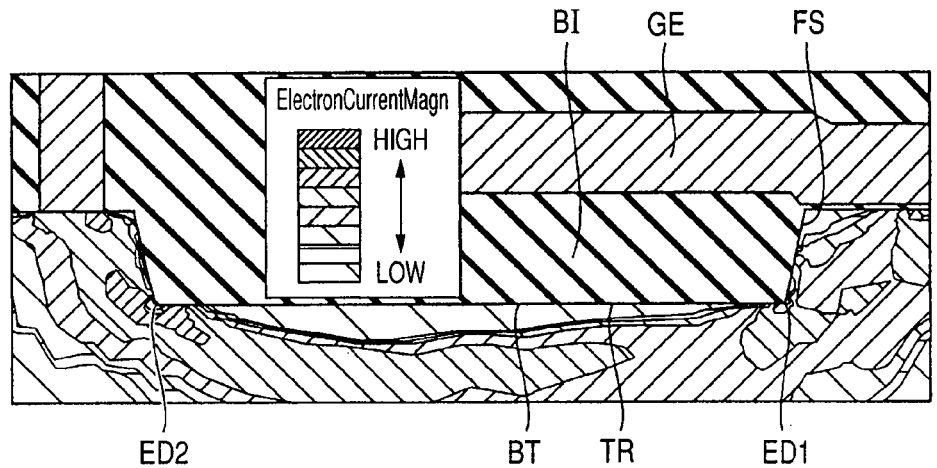
FIG. 30(A) is a distribution diagram of an electron/current density of a conventional type in a comparative example under OLT stressing conditions.
Figure 30B:
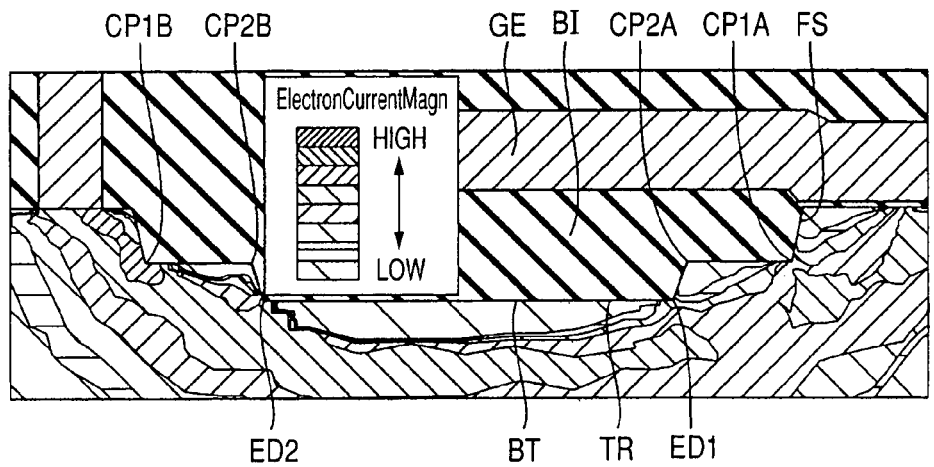
FIG. 30(B) is a distribution diagram of an electron/current density of a stepped type in Embodiment 3 under OLT stressing conditions.
Figure 31A:
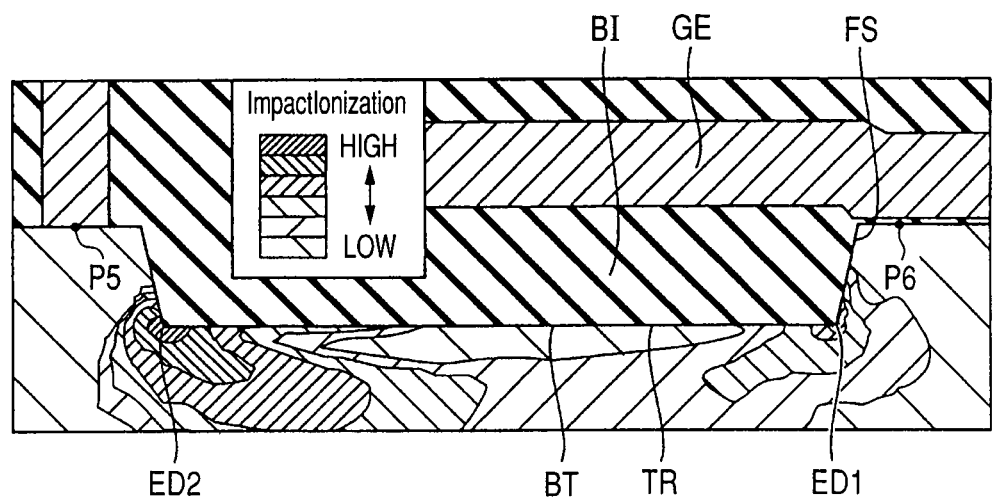
FIG. 31(A) is a distribution diagram of an impact ionization ratio of the conventional type in the comparative example under OLT stressing conditions.
Figure 31B:
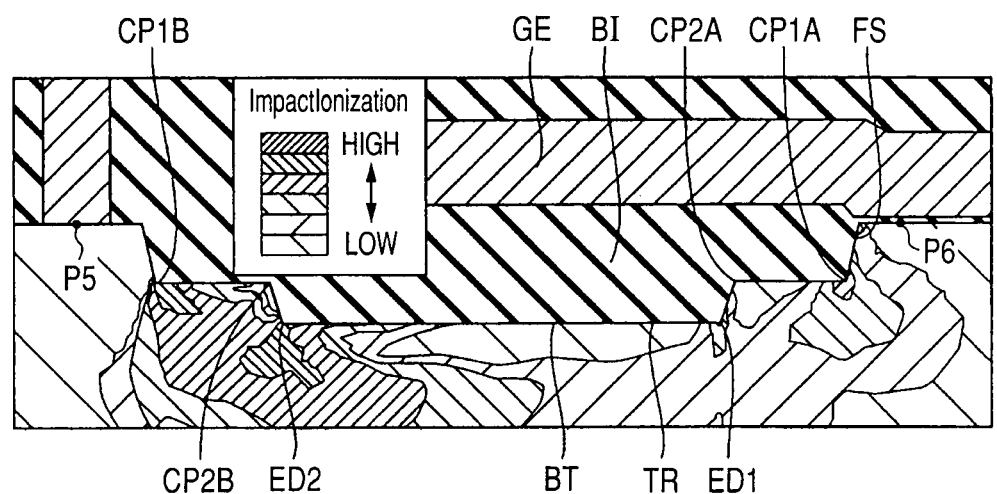
FIG. 31(B) is a distribution diagram of an impact ionization ratio of the stepped type in Embodiment 3 under OLT stressing conditions.
Figure 32:
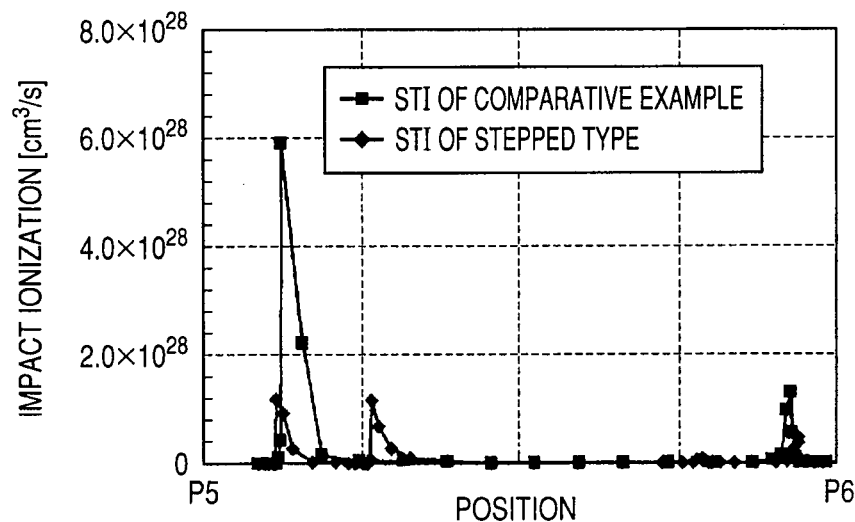
FIG. 32 is a view showing the distribution of the impact ionization ratio along the interface of a semiconductor substrate between the points P5 and P6 of FIG. 31 in each of the configuration of the comparative example and the configuration (of the stepped type) shown in FIG. 27, each under OLT stressing conditions.

The present inventors reproduced a stressed condition under an OLT test by device simulation, and made a comparison between the internal states of the elements. FIGS. 30(A) and 30(B) show the respective distributions of electron/current densities in the comparative example and the present embodiment shown in FIG. 27, each under stressing conditions. FIGS. 31(A) and 31(B) show the respective distributions of compact ionization ratios in the comparative example and the present embodiment shown in FIG. 27, each under stressing conditions. In the stepped shapes in FIG. 30(B) and FIG. 31(B), X1 and X2 mentioned in the description of FIG. 3 were each set to 120%, and Y1 and Y2 each mentioned in the description of FIG. 3 were each set to 40%. FIG. 32 shows the distribution of the impact ionization ratio along the interface of the semiconductor substrate between the points P5 and P6 in each of FIGS. 31(A) and 31(B).

As can be seen from the results of FIGS. 30 to 32, it has been found that the electron/current density and the impact ionization ratio are high in the vicinity of each of the edge portions ED1 and ED2 of the trench TR in the comparative example, and also high in the vicinity of each of the edge portions ED1 and ED2 and the angular portions CP1A and CP1B of the trench TR in the present embodiment. It has also been found that the electron/current density and the impact ionization ratio in the vicinity of each of the edge portions ED1 and ED2 and the angular portions CP1A and CP1B in the present embodiment are lower than the electron/current density and the impact ionization ratio in the vicinity of each of the edge portions ED1 and ED2 in the comparative example.

The result described above can be considered in the same manner as in Embodiment 1. That is, it can be considered that, in the comparative example, a current is concentrated on the edge portions ED1 and ED2 of the trench TR to increase the electron/current density, and consequently increase the impact ionization ratio. On the other hand, it can be considered that, in the present embodiment, each of the one wall portion FS and the other wall portion SS of the trench TR is formed into the stepped shape to distribute the current concentration to the edge portions ED1 and ED2 and to the projecting angular portions CP1A and CP1B, and accordingly reduce the current concentration and the impact ionization ratio.

Thus, in the SS-LDMOS transistor according to the present embodiment, the current concentration can be reduced by forming each of the one wall portion FS and the other wall portion SS of the trench TR into the stepped shape as compared to the reduction of the current concentration in the configuration of the comparative example. Therefore, it can be considered that the generation of hot carriers due to the impact ionization and the trapping of electrons at the interfaces of the edge portions ED1 and ED2 of the trench TR are inhibited, and the Ids degradation can be reduced.

(Embodiment 4)

In each of Embodiments 1 to 3 described above, the description has been given to the case where the SS-LDMOS transistor is of the RESURF type, but the SS-LDMOS transistor may also be of a NON-RESURF type. The configuration thereof will be described below using FIG. 33.

Figure 33:
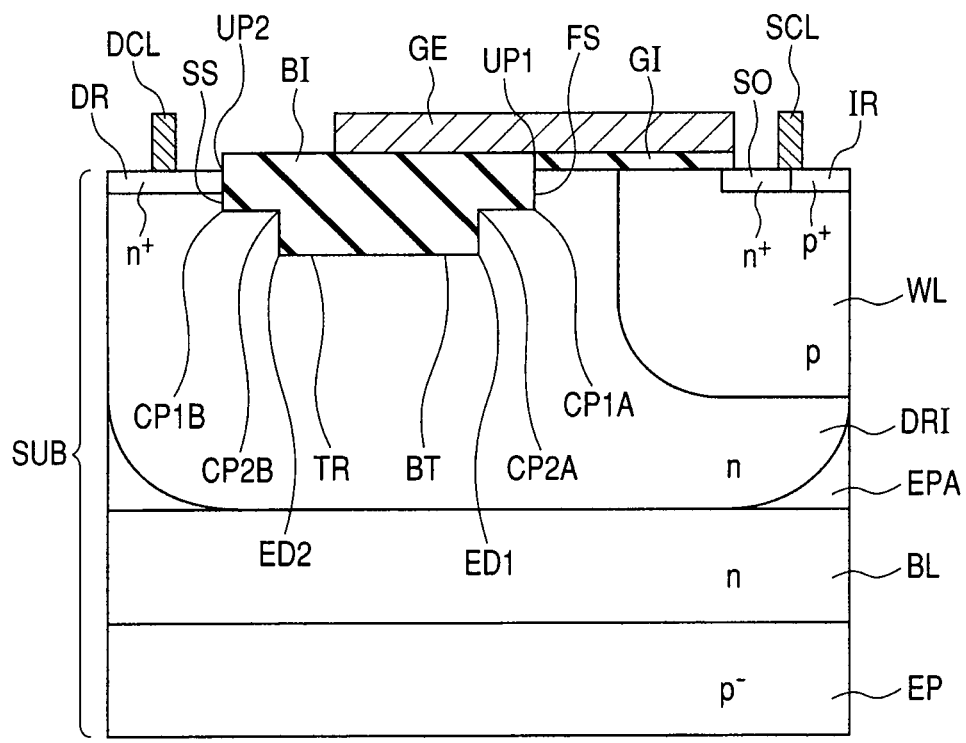
FIG. 33 is a cross-sectional view schematically showing a configuration of a semiconductor device in Embodiment 4 of the present invention.

Referring to FIG. 33, the configuration of the present embodiment is different from the configuration of Embodiment 3 shown in FIG. 27 in that an n-type buried region BL is formed, and that the n-type drift (offset) region DRI is formed to extend under the p-type well region WL.

The n-type buried region BL is formed in the semiconductor substrate SUB to be located over the $p^-$ epitaxial region EP, and form a p-n junction with the $p^-$ epitaxial region EP. Over the n-type buried region BL, formed is a $p^-$ epitaxial region EPA.

The n-type drift region DRI1 is formed to extend under the p-type well region WL, and formed to come in contact with the n-type buried region BL. In this manner, the NON-RESURF SS-LDMOS transistor has been formed.

The configuration of the present embodiment is otherwise substantially the same as the configuration of Embodiment 3 described above. Therefore, a description thereof is omitted by providing the same components with the same reference numerals.

In a NON-RESURF SS-LDMOS transistor as described in the present embodiment also, by forming the angular portions CP1A, CP2A, CP1B, and CP2B in at least either one of the one wall portion FS and the other wall portion SS of the trench TR, it is possible to reduce the current concentration on the wall portions of the trench TR, and inhibit the degradation of electric characteristics due to the trapping of electrons.

In the present embodiment, the description has been given to the configuration in which the angular portions are provided at each of the one wall portion FS and the other wall portion SS of the trench TR. However, the angular portions may also be provided at either one of the one wall portion FS and the other wall portion SS.

(Embodiment 5)

In each of Embodiments 1 to 4 described above, the description has been given to the case where the trench having the angular portions is applied to the LDMOS transistor. However, the trench having the angular portions can also be applied to an element in which a current is allowed to flow into a region of a semiconductor substrate located under the trench. The configuration thereof will be described below using FIG. 34.

Figure 34:
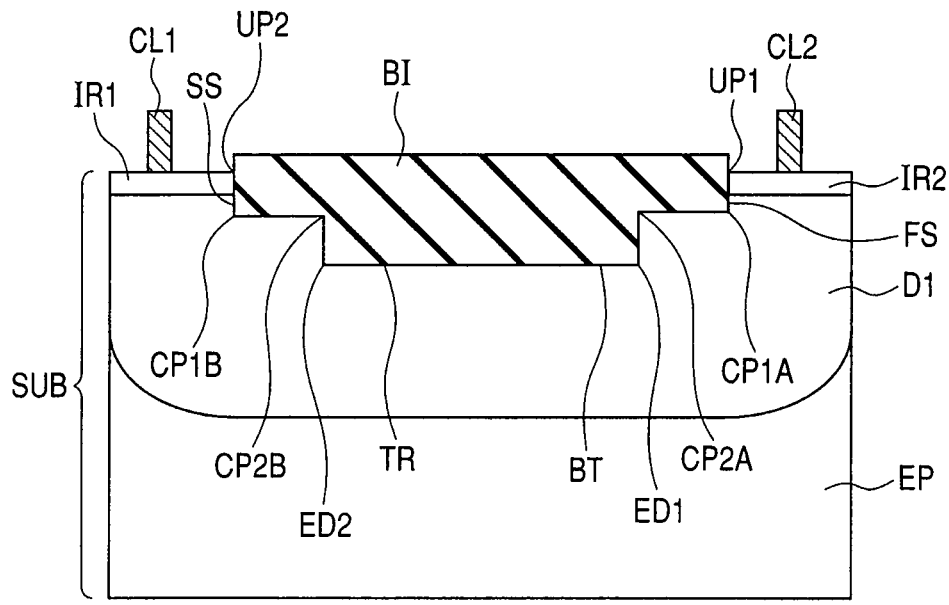
FIG. 34 is a cross-sectional view schematically showing a configuration of a semiconductor device in Embodiment 5 of the present invention.

Referring to FIG. 34, in the present embodiment, the $p^-$ epitaxial region EP is formed in the semiconductor substrate SUB. Over the $p^-$ epitaxial region EP, an n-type region DI is formed to form a p-n junction with the $p^-$ epitaxial region EP. In the main surface of the semiconductor substrate SUB over the n-type region DI, formed is the STI structure.

The STI structure has the trench TR formed in the main surface of the semiconductor substrate SUB, and the buried insulating film BI to be buried in the trench TR. The one wall portion FS of the trench TR is provided with the angular portions CP1A and CP2A, while the other wall portion SS thereof is provided with the angular portions CP1B and CP2B. The shapes and positions of these angular portions are substantially the same as in the configuration of Embodiment 3 so that a description thereof is omitted.

In the main surface of a portion of the semiconductor substrate SUB located closer to the one wall portion FS of the trench TR, formed is an $n^+$ region IR2 having an n-type impurity concentration higher than that of the n-type region DI. In the main surface of a portion of the semiconductor substrate SUB located closer to the other wall portion SS of the trench TR, formed is an $n^+$ region IR1 having an n-type impurity concentration higher than that of the n-type region DI. To the $n^+$ region IR2, an electrode CL2 is electrically coupled while, to the $n^+$ region IR1, an electrode CL1 is electrically coupled.

The $n^+$ region IR2 is, e.g., a region to which a relatively low voltage is applied, while the $n^+$ region IR1 is, e.g., a region to which a relatively high voltage is applied. By the application of these voltages, a current can be allowed to flow through the region of the semiconductor substrate SUB located under the trench TR, and between the $n^+$ region IR2 and the $n^+$ region IR1.

In the element in which a current is allowed to flow into the region of the semiconductor substrate SUB located below the trench TR as described in the present embodiment also, by forming the angular portions in at least either one of the one wall portion FS and the other wall portion SS of the trench TR, it is possible to reduce the electric field concentration on the wall portions of the trench TR, and inhibit the degradation of electric characteristics due to the trapping of electrons.

In the present embodiment, the description has been given to the configuration in which the angular portions are provided at each of the one wall portion FS and the other wall portion SS of the trench TR. However, the angular portions may also be provided at either one of the one wall portion FS and the other wall portion SS.

(Embodiment 6)

The present inventors examined a preferred shape as the stepped shape of the one wall portion FS of the trench TR in Embodiment 1 shown in FIG. 2. The content and result of the examination will be described using FIGS. 35 and 37.

First, the present inventors evaluated X2 dependence in the stepped shape of the one wall portion FS of the trench TR. The evaluation was performed by setting Y2 to 40%, and setting X2 to the three levels of 40%, 120%, and 200%. In the evaluation, OLT stressing conditions were set to satisfy Vg=3.3 V and Vd=45 V, and measurement conditions were set to satisfy Vg=3.3 V and Vd=0.2 V. The result of the evaluation is shown in FIG. 35.

Figure 35:
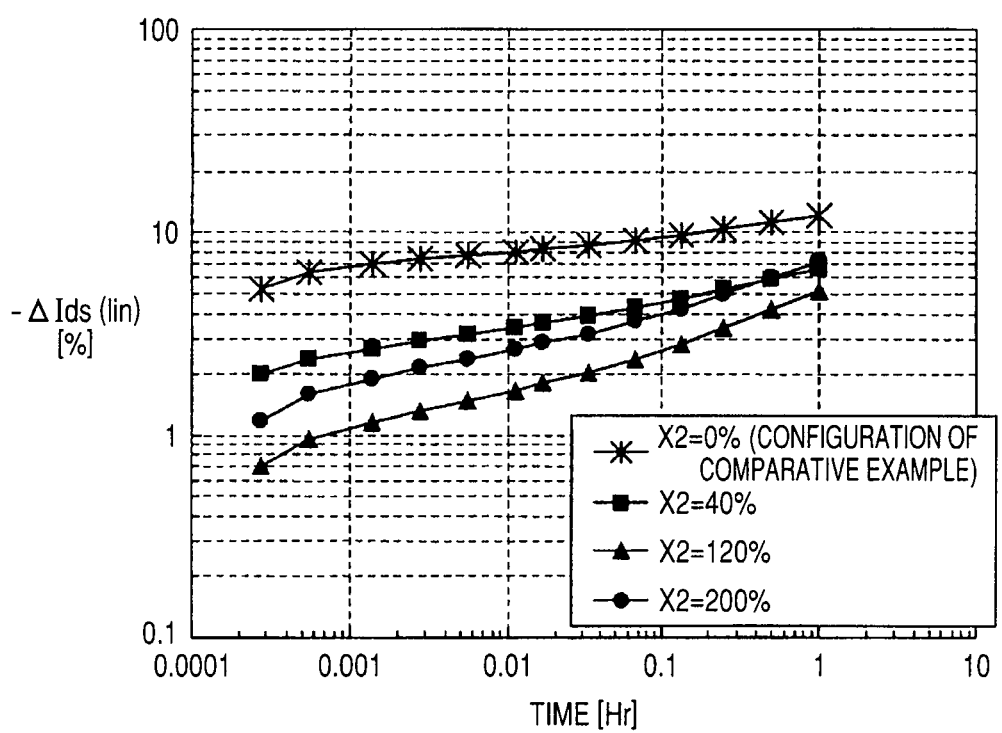
FIG. 35 is a view showing variations in drain current when an angular portion is provided at the source-side sidewall of a trench of a STI structure, and the position of the angular portion is varied.

As can be seen from the result of FIG. 35, it has been found that, in each of the cases where X2 is 40%, where X2 is 120%, and where X2 is 200%, the effect of inhibiting the Ids degradation can be obtained as compared to the case where X2 is 0%. It has also been found that the parameter X2 has a progressively higher effect of inhibiting the Ids degradation when X2 is 120%, 200%, and 40% in this order.

The present inventors also examined an electron/current distribution, the distribution of an electric field intensity, and the distribution of an impact ionization ratio. The results of the examination are shown in FIGS. 36 to 41.

Figure 36A:
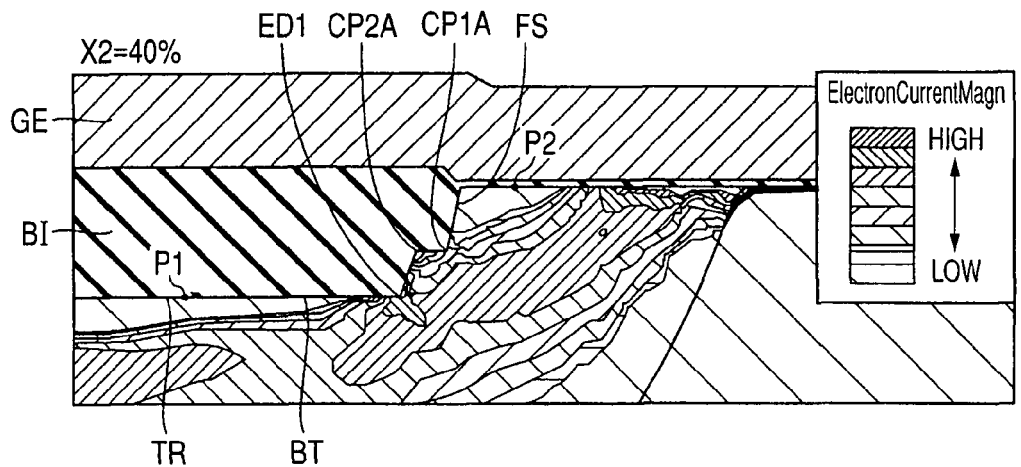
FIG. 36(A) is a distribution diagram of an electron/current density when X2 is 40% under OLT stressing conditions.
Figure 36B:
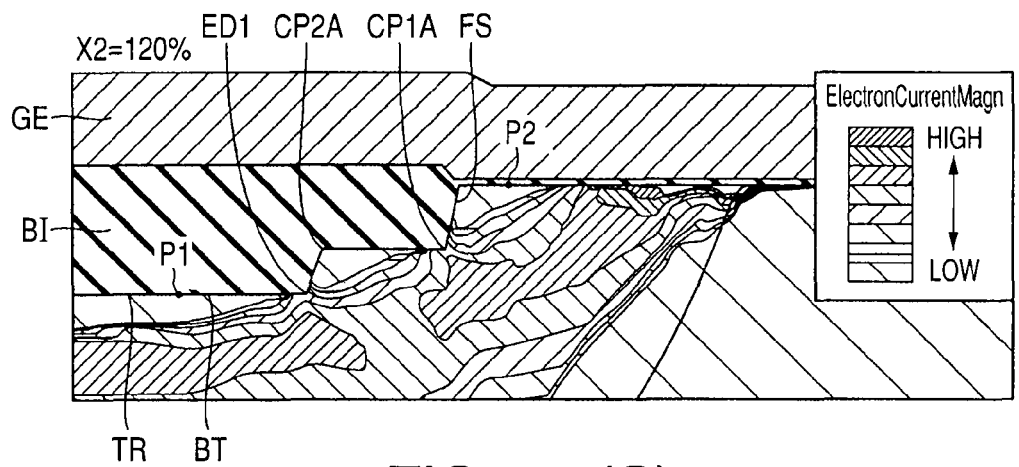
FIG. 36(B) is a distribution diagram of an electron/current density when X2 is 120% under OLT stressing conditions.
Figure 36C:
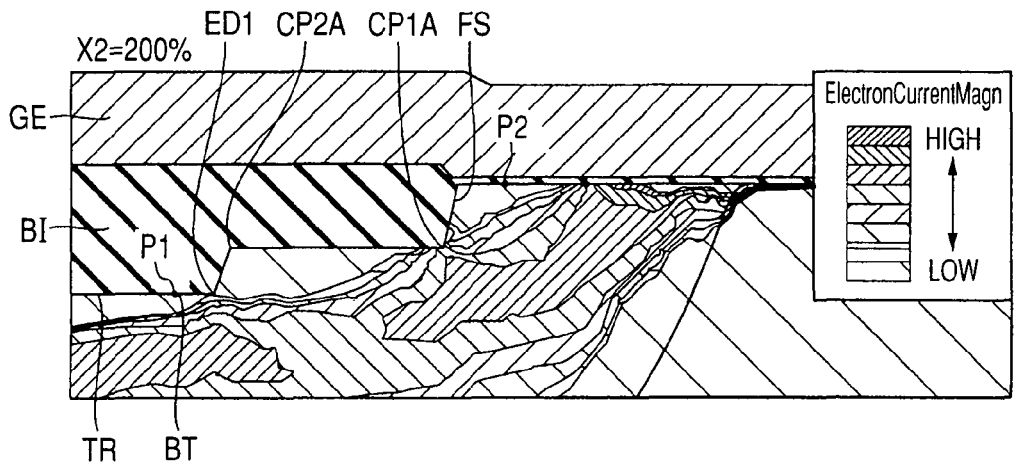
FIG. 36(C) is a distribution diagram of an electron/current density when X2 is 200% under OLT stressing conditions.
Figure 37:
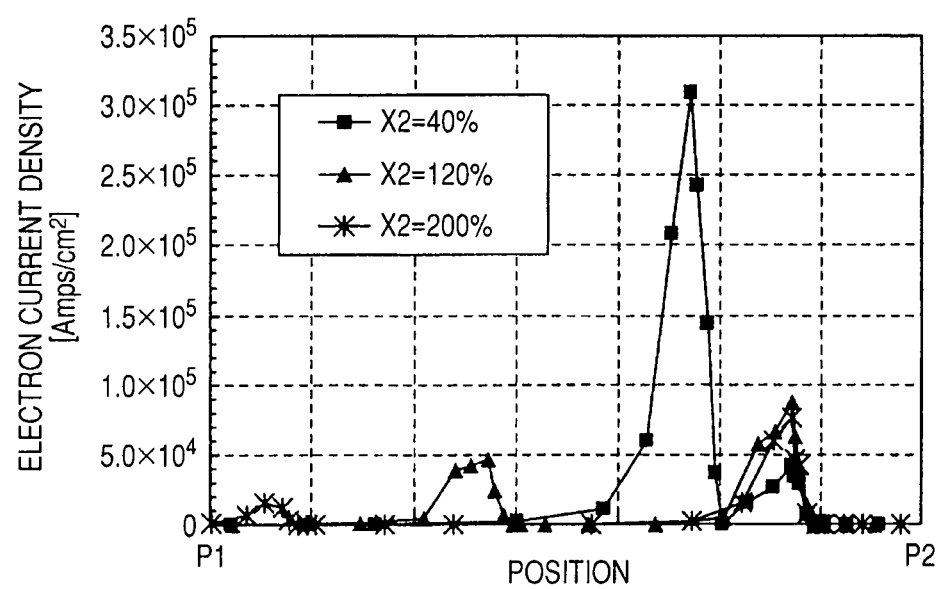
FIG. 37 is a view showing electrons and currents along the interface of a semiconductor substrate between the points P1 and P2 of FIG. 36 when X2 is assumed to be 40%, 120%, and 200% under OLT stressing conditions.
Figure 38A:
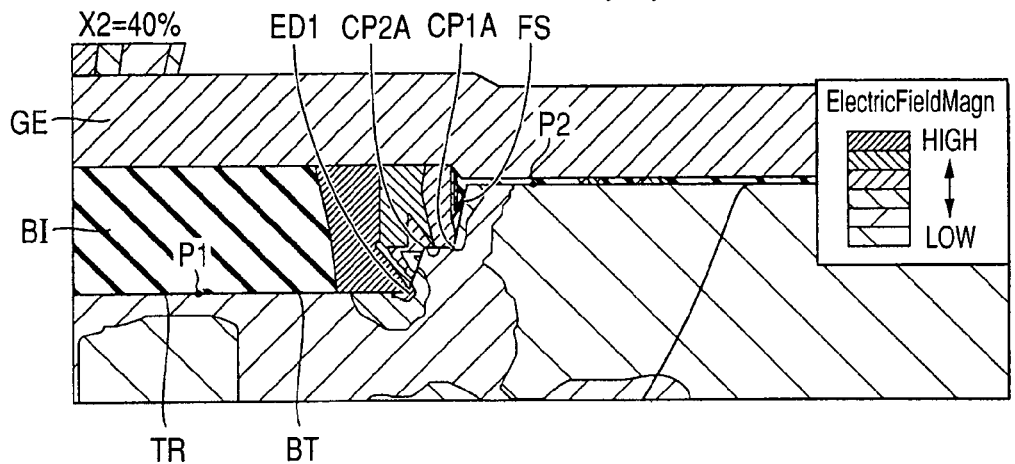
FIG. 38(A) is a distribution diagram of an electric field intensity when X2 is 40% under OLT stressing conditions.
Figure 38B:
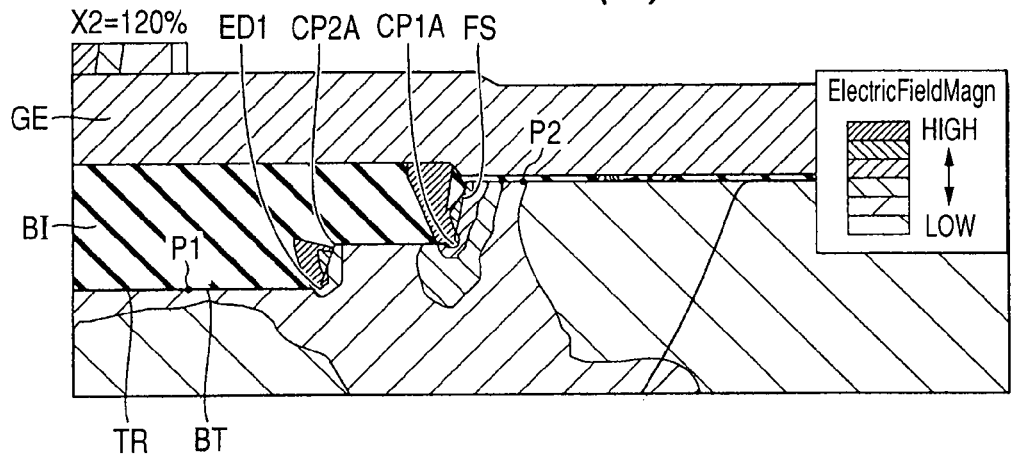
FIG. 38(B) is a distribution diagram of an electric field intensity when X2 is 120% under OLT stressing conditions.
Figure 38C:
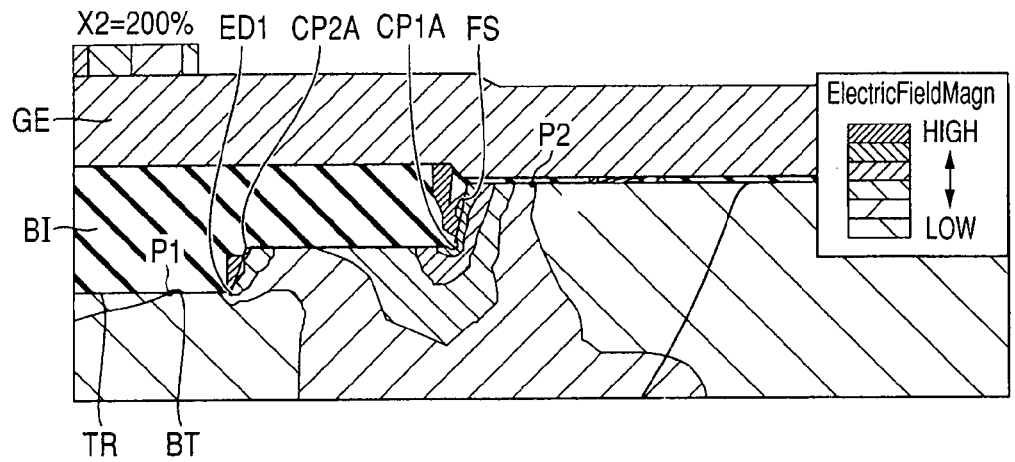
FIG. 38(C) is a distribution diagram of an electric field intensity when X2 is 200% under OLT stressing conditions.
Figure 39:
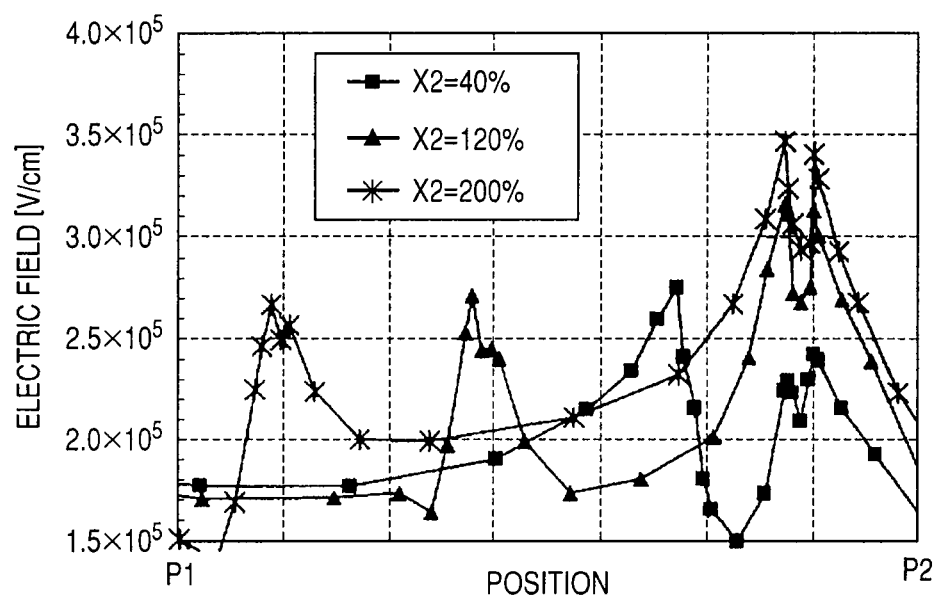
FIG. 39 is a view showing electric field intensities along the interface of a semiconductor substrate between the points P1 and P2 of FIG. 38 when X2 is assumed to be 40%, 120%, and 200% under OLT stressing conditions.
Figure 40A:
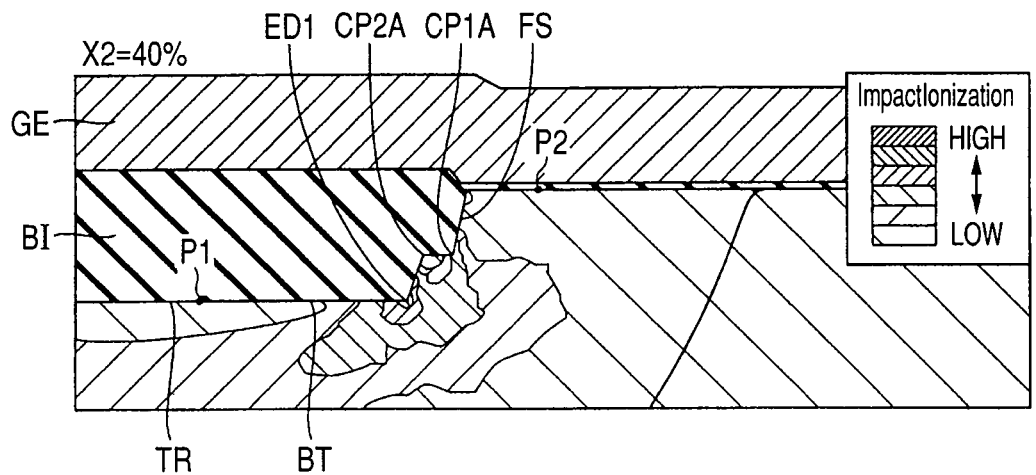
FIG. 40(A) is a distribution diagram of an impact ionization ratio when X2 is 40% under OLT stressing conditions.
Figure 40B:
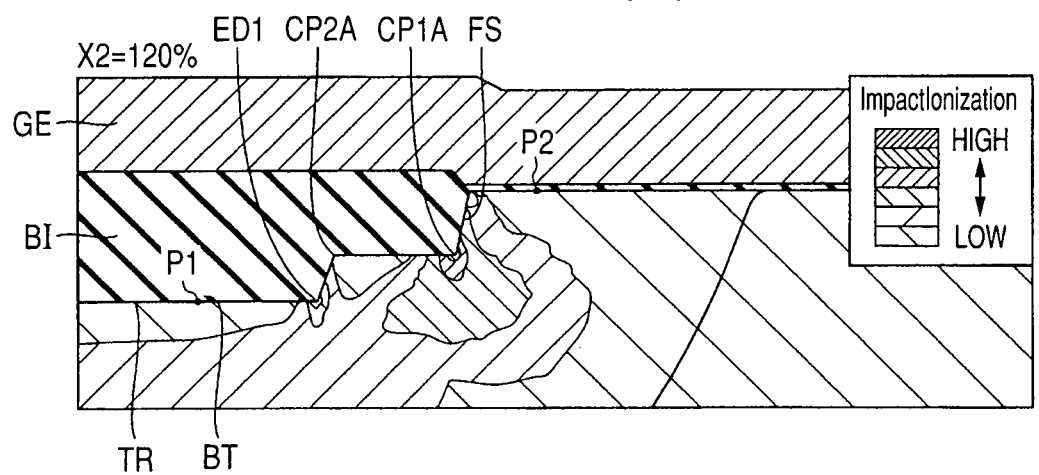
FIG. 40(B) is a distribution diagram of an impact ionization ratio when X2 is 120% under OLT stressing conditions.
Figure 40C:
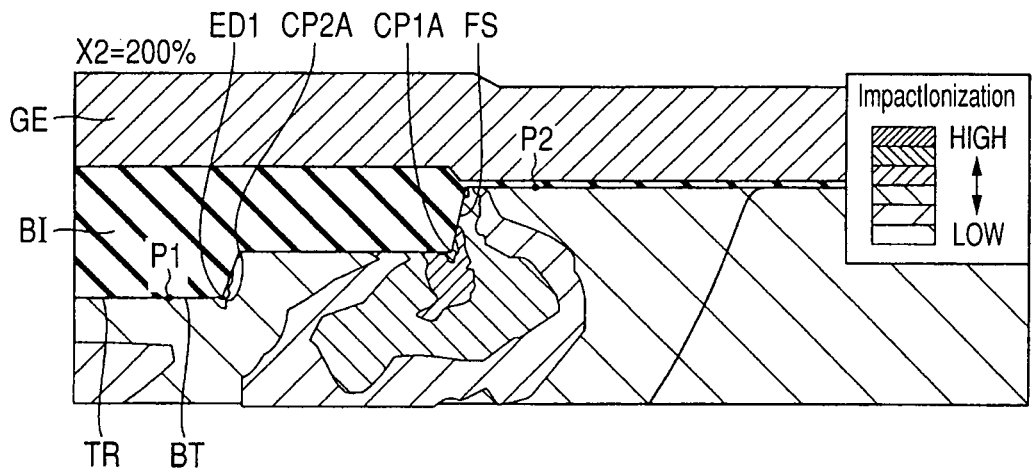
FIG. 40(C) is a distribution diagram of an impact ionization ratio when X2 is 200% under OLT stressing conditions.
Figure 41:
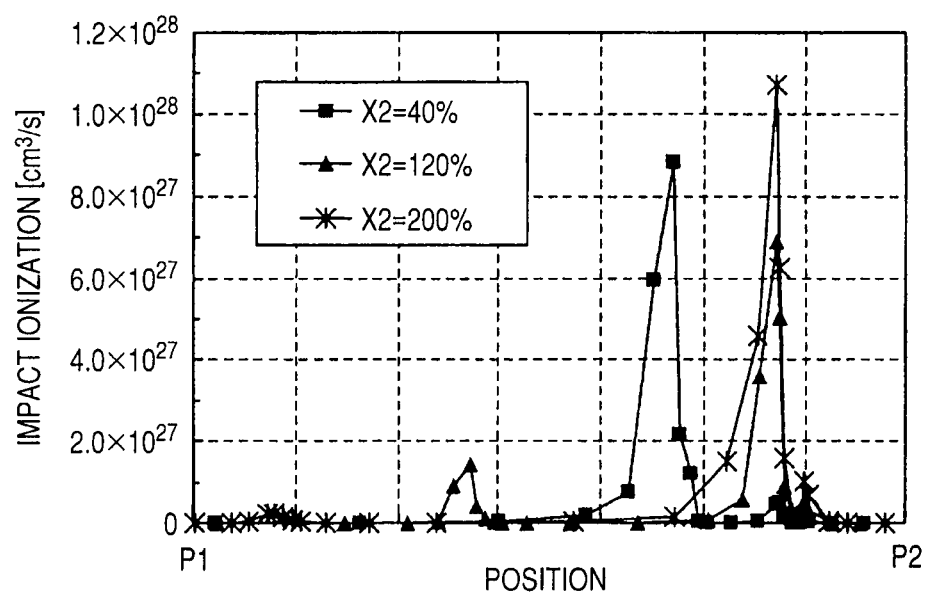
FIG. 41 is a view showing impact ionization ratios along the interface of a semiconductor substrate between the points P1 and P2 of FIG. 40 when X2 is assumed to be 40%, 120%, and 200% under OLT stressing conditions.

FIGS. 36(A), 36(B), and 36(C) show the respective electron/current distributions when X2 is 40%, when X2 is 120%, and when X2 is 200%, each under OLT stressing conditions. FIG. 37 shows the electron/current distribution along the interface of a semiconductor substrate between the points P1 and P2 of each of FIGS. 36(A) to 36(C) under OLT stressing conditions. FIGS. 38(A), 38(B), and 38(C) show the respective distributions of the electric field intensities when X2 is 40%, when X2 is 120%, and when X2 is 200% under OLT stressing conditions. FIG. 39 shows the distribution of the electric field intensity along the interface of the semiconductor substrate between the points P1 and P2 of each of FIGS. 38(A) to 38(C) under OLT stressing conditions. FIGS. 40(A), 40(B), and 40(C) show the respective distributions of the impact ionization ratios when X2 is 40%, when X2 is 120%, and when X2 is 200% under OLT stressing conditions. FIG. 41 shows the distribution of the impact ionization ratio along the interface of the semiconductor substrate between the points P1 and P2 of each of FIGS. 40(A) to 40(C) under OLT stressing conditions.

As can be seen from the results of FIGS. 36 to 41, the electron/current density in the edge portion ED1 of the trench TR was highest when X2=40% (see FIG. 37) and the electric field intensity was highest when X2=200% (see FIG. 39), while the impact ionization ratio was lowest when X2=120% (see FIG. 41).

Therefore, it can be considered that the electron/current density was the cause of a high impact ionization ratio when X2=40%, the electric field intensity was the cause of a high impact ionization ratio when X2=200%, and the impact ionization ratio was lowest when X2=120%, which was a middle value between 40% and 200%.

From these results also, it has been recognized that Ids variations are correlated with the edge portion ED1 and the angular portion CP1 of the trench TR.

The present inventors also performed simulation for examining the impact ionization ratios when the respective values of X2 and Y2 in the stepped shape of the one wall portion FS of the trench TR were varied. The result of the simulation is shown below in Table 1.

TABLE 1

|    |     | X2 | | | | | |
|----|-----|------|------|------|------|------|------|
|    |     | 0%   | 40%  | 80%  | 120% | 160% | 200% |
| Y2 | 0%  | $1.2 \times 10^{28}$ | | | | | |
|    | 20% | | $6.0 \times 10^{27}$ | $7.3 \times 10^{27}$ | $1.0 \times 10^{28}$ | $1.1 \times 10^{28}$ | $1.2 \times 10^{28}$ |
|    | 40% | | $8.2 \times 10^{27}$ | $4.1 \times 10^{27}$ | $9.0 \times 10^{27}$ | $1.2 \times 10^{28}$ | $1.5 \times 10^{28}$ |
|    | 60% | | $1.0 \times 10^{28}$ | $4.5 \times 10^{27}$ | $5.7 \times 10^{27}$ | $1.0 \times 10^{28}$ | $1.6 \times 10^{28}$ |
|    | 80% | | $8.0 \times 10^{27}$ | $4.6 \times 10^{27}$ | $1.0 \times 10^{28}$ | $2.3 \times 10^{28}$ | $3.4 \times 10^{28}$ |

(Unit: cm³/s)

As can be seen from the result of Table 1, when the angular portion CP1A was located within the range of Y2=40% to 80% as compared to X2=80%, the impact ionization was lowest. It has also been found that, in the range of X2=40% to 120%, when the angular portion CP1A is located at a ratio of X2:Y2=2:1, the impact ionization ratio tends to be lower.

The present inventors also performed simulation for examining the impact ionization ratios when the respective values of X1 and Y1 in the stepped shape of the other wall portion SS of the trench TR were varied. The result of the simulation was shown below in Table 2.

TABLE 2

|    |     | X1 | | | | | |
|----|-----|------|------|------|------|------|------|
|    |     | 0%   | 40%  | 80%  | 120% | 160% | 200% |
| Y1 | 0%  | $4.3 \times 10^{28}$ | | | | | |
|    | 20% | | $7.7 \times 10^{28}$ | $6.6 \times 10^{28}$ | $6.9 \times 10^{28}$ | $5.1 \times 10^{28}$ | $3.7 \times 10^{28}$ |
|    | 40% | | $9.4 \times 10^{28}$ | $6.1 \times 10^{28}$ | $1.4 \times 10^{28}$ | $6.6 \times 10^{28}$ | $4.3 \times 10^{28}$ |
|    | 60% | | $9.2 \times 10^{28}$ | $4.6 \times 10^{28}$ | $3.7 \times 10^{28}$ | $3.3 \times 10^{28}$ | $1.5 \times 10^{28}$ |
|    | 80% | | $7.2 \times 10^{28}$ | $6.9 \times 10^{28}$ | $4.5 \times 10^{28}$ | $6.1 \times 10^{28}$ | $2.1 \times 10^{28}$ |

(Unit: cm³/s)

As can be seen from the result of Table 2, it has been found that, when (X1, Y1)=(120%, 40%) and (200%, 60% to 80%), the impact ionization ratio is lowest.

(Embodiment 7)

In the present embodiment, a two-dimensional layout of the angular portions will be described using FIGS. 42 to 44.

Figure 42:
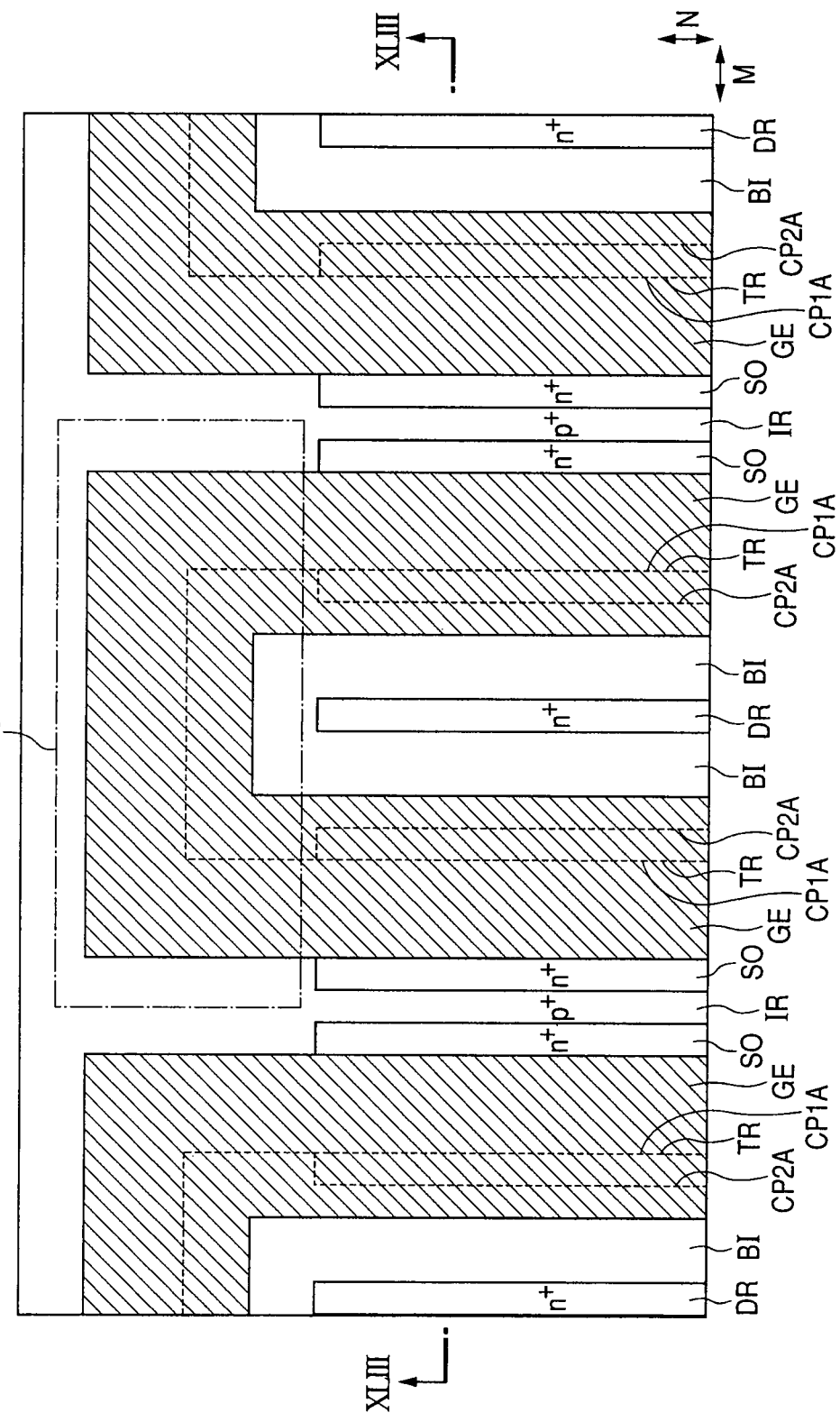
FIG. 42 is a plan view schematically showing a configuration of a semiconductor device in Embodiment 7 of the present invention in which angular portions are formed in a part of a trench when viewed in plan view.
Figure 43:
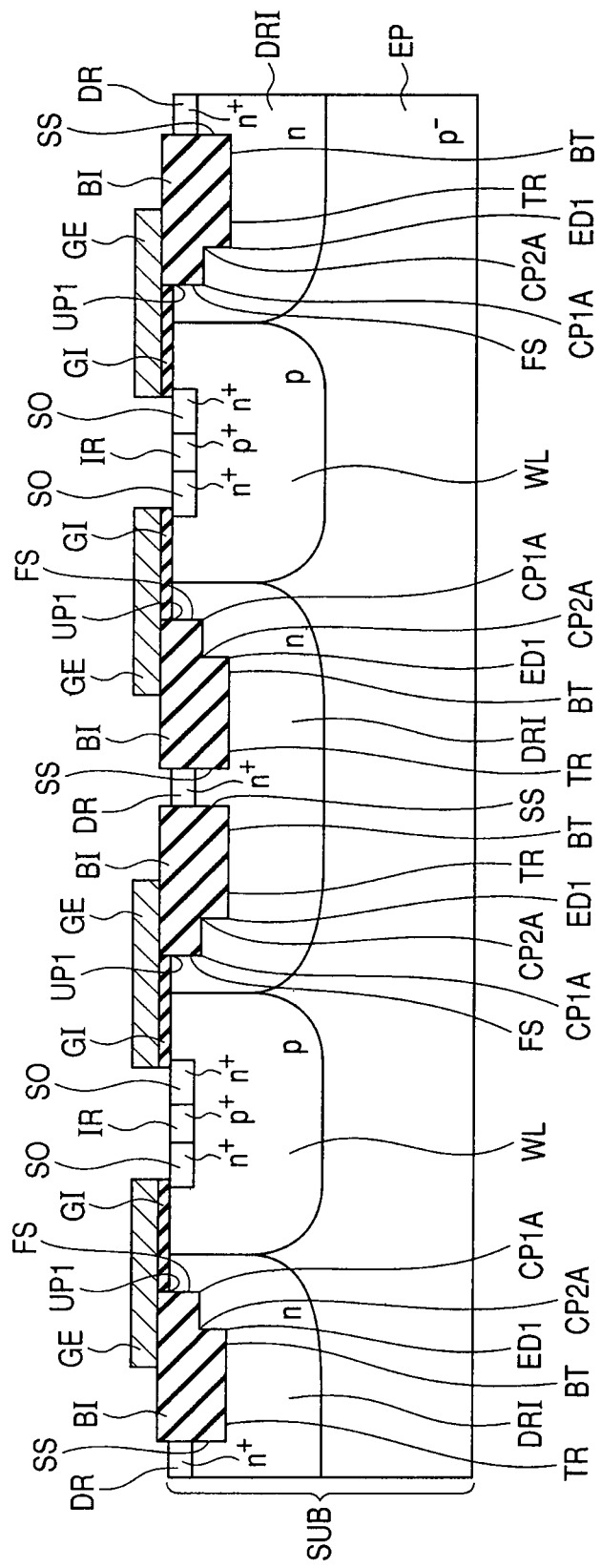
FIG. 43 is a schematic cross-sectional view along the line XLIII-XLIII of each of FIGS. 42 and 44.

Referring to FIGS. 42 and 43, the gate electrode layer GE and the p$^+$ body contact region IR are formed to be located on the outer periphery of the drain region DR when viewed in plan view (FIG. 42). In the case where a current is not allowed to flow in an element terminal portion RS, the source region SO is formed at a position opposing the drain region DR in the short-side direction (direction indicated by the arrow M in FIG. 42) of the drain region DR when viewed in plan view, and is not formed in the element terminal portion RS including a position opposing the drain region DR in the long-side direction (direction indicated by the arrow N in FIG. 42) of the drain region DR. That is, the angular portions CP1A and CP2A are each formed in a part of the trench TR so as to be located between the source region SO and the drain region DR when viewed in plan view. In this case, the source region SO and the drain region DR have mutually equal dimensions in the long-side direction (direction indicated by the arrow N in FIG. 42) when viewed in plan view.

In this configuration, the angular portions CP1A and CP2A are formed at respective positions opposing the source region SO and the drain region DR in the short-side direction between the source region SO and the drain region DR. The angular portions CP1A and CP2A are not formed in the element terminal portion RS, and have the same dimensions as those of the source region SO and the drain region DR in the long-side direction (the direction indicated by the arrow N in FIG. 42).

Figure 44:
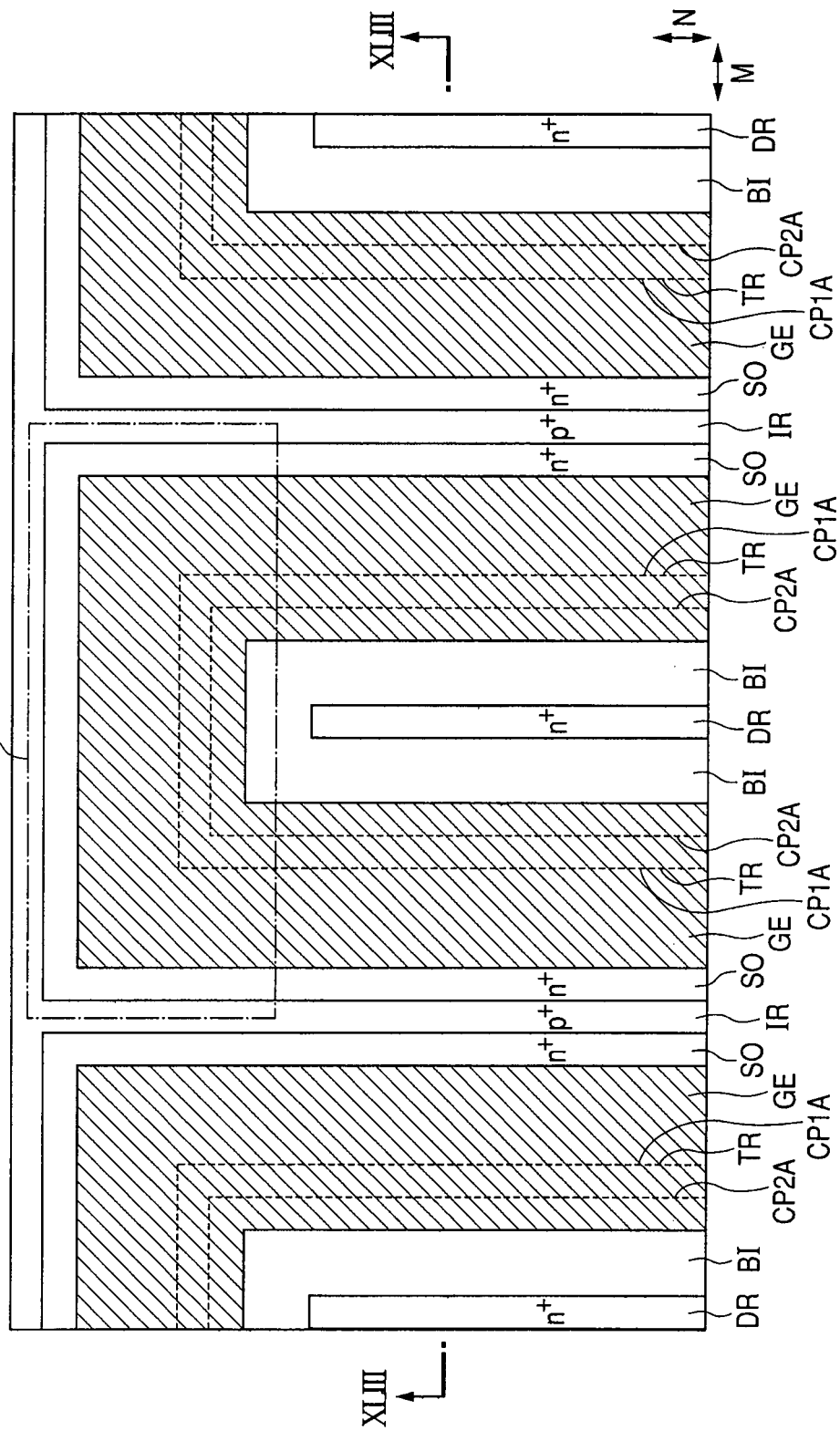
FIG. 44 is a plan view schematically showing a configuration of the semiconductor device in Embodiment 7 of the present invention in which the angular portions are formed in the entire trench when viewed in plan view.

Referring to FIGS. 44 and 43, in the case where a current is allowed to flow in the element terminal portion RS, the source region SO is formed to be located on the outer periphery of the drain region DR when viewed in plan view (FIG. 44). That is, the angular portions CP1A and CP2A are formed in the entire trench TR so as to be located between the source region SO and the drain region DR when viewed in plan view. In this case, the source region SO is formed in each of the long-side direction (direction indicated by the arrow N in FIG. 42) and the short-side direction (direction indicated by the arrow M in FIG. 42) of the drain region DR when viewed in plan view.

In this configuration, the angular portions CP1A and CP2A are each formed to surround the periphery of the drain region DR between the source region SO and the drain region DR. As a result, the angular portions CP1A and CP2A are each formed also in the element terminal portion RS.

Thus, each of the angular portions CP1A and CP2A of the trench TR is preferably disposed in a region interposed between the source region SO and the drain region DR when viewed in plan view.

Each of the angular portions CP1B and CP2B provided at the other wall portion SS of the trench TR is also preferably provided in the region interposed between the source SO and the drain DR when viewed in plan view, similarly to the angular portions CP1A and CP2A described above.

(Embodiment 8)

In each of Embodiments 1 to 7 described above, the description has been given to the case where the angular portions are formed such that the one wall portion FS and the other wall portion SS of the trench TR have the stepped shapes when viewed in cross section. However, the angular portions may also be provided so as to form an inclined portion at each of the one wall portion FS and the other wall portion SS of the trench TR when viewed in cross section. A configuration in which each of the one wall portion FS and the other wall portion SS of the trench TR has angular portions which form the inclined portion will be described below using FIGS. 45 to 49.

Figure 45:
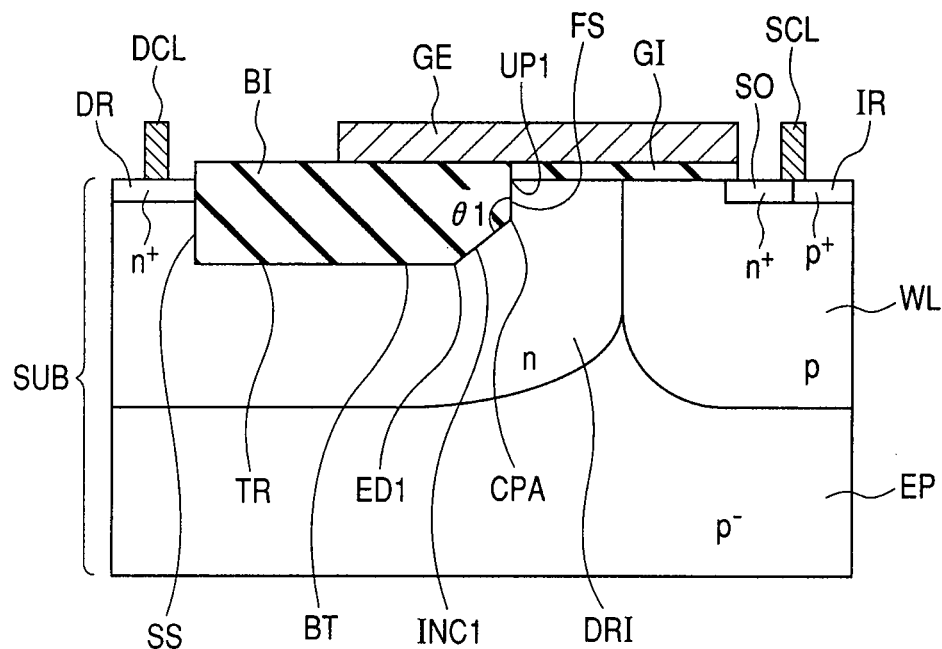
FIG. 45 is a schematic cross-sectional view showing a configuration of a RESURF MOS transistor in which an inclined portion is provided at the source-side sidewall of a trench of a STI structure.

Referring to FIG. 45, the configuration is obtained by replacing the stepped shape of the one wall portion FS of the trench TR in Embodiment 1 shown in FIG. 2 with a shape having an inclined portion. Specifically, the one wall portion FS of the trench TR has a projecting angular portion CPA. The wall portion between the angular portion CPA and the bottom portion BT forms an inclined portion INC1 inclined with respect to the wall portion between the angular portion CPA and the upper portion UP1. The angle θ1 of the projecting angular portion CPA is an obtuse angle. The inclined portion INC1 is linear when viewed in cross section.

Figure 46:
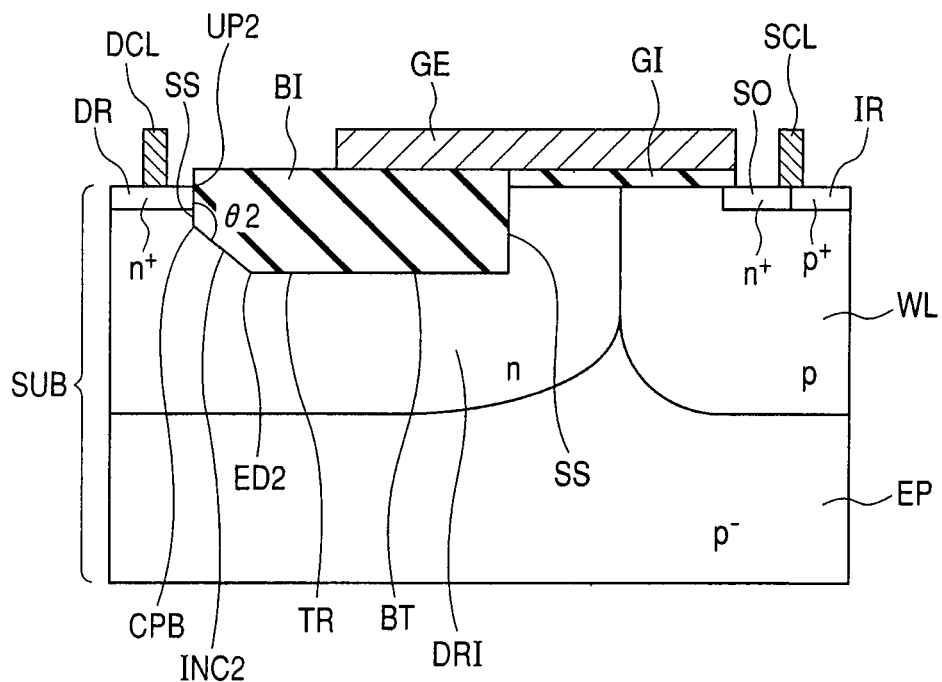
FIG. 46 is a schematic cross-sectional view showing a configuration of a RESURF MOS transistor in which an inclined portion is provided at the drain-side sidewall of a trench of a STI structure.

Referring also to FIG. 46, the configuration is obtained by replacing the stepped shape of the other wall portion SS of the trench TR in Embodiment 2 shown in FIG. 21 with a shape having an inclined portion. Specifically, the other wall portion SS of the trench TR has a projecting angular portion CPB. The wall portion between the angular portion CPB and the bottom portion BT forms an inclined portion INC2 inclined with respect to the wall portion between the angular portion CPB and the upper portion UP2. The angle θ2 of the projecting angular portion CPB is an obtuse angle. The inclined portion INC2 is linear when viewed in cross section.

Figure 47:
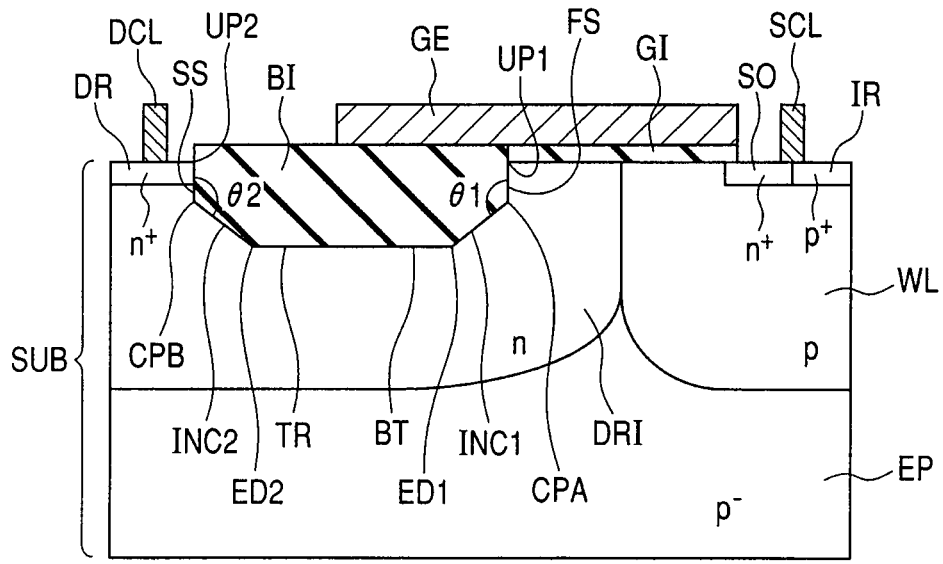
FIG. 47 is a schematic cross-sectional view showing a configuration of a RESURF MOS transistor in which an inclined portion is provided at each of the source-side sidewall and the drain-side sidewall of a trench of a STI structure.

Referring also to FIG. 47, the configuration is obtained by replacing the stepped shape of each of the one wall portion FS and the other wall portion SS of the trench TR in Embodiment 3 shown in FIG. 27 with a shape having an inclined portion. Specifically, the one wall portion FS of the trench TR has the projecting angular portion CPA. The wall portion between the angular portion CPA and the bottom portion BT forms the inclined portion INC1 inclined with respect to the wall portion between the angular portion CPA and the upper portion UP1. The other wall portion SS of the trench TR has the projecting angular portion CPB. The wall portion between the angular portion CPB and the bottom portion BT forms the inclined portion INC2 inclined with respect to the wall portion between the angular portion CPB and the upper portion UP2. Each of the angle θ1 of the projecting angular portion CPA and the angle θ2 of the projecting angular portion CPB is an obtuse angle. Each of the inclined portions INC1 and INC2 is linear when viewed in cross section.

Figure 48:
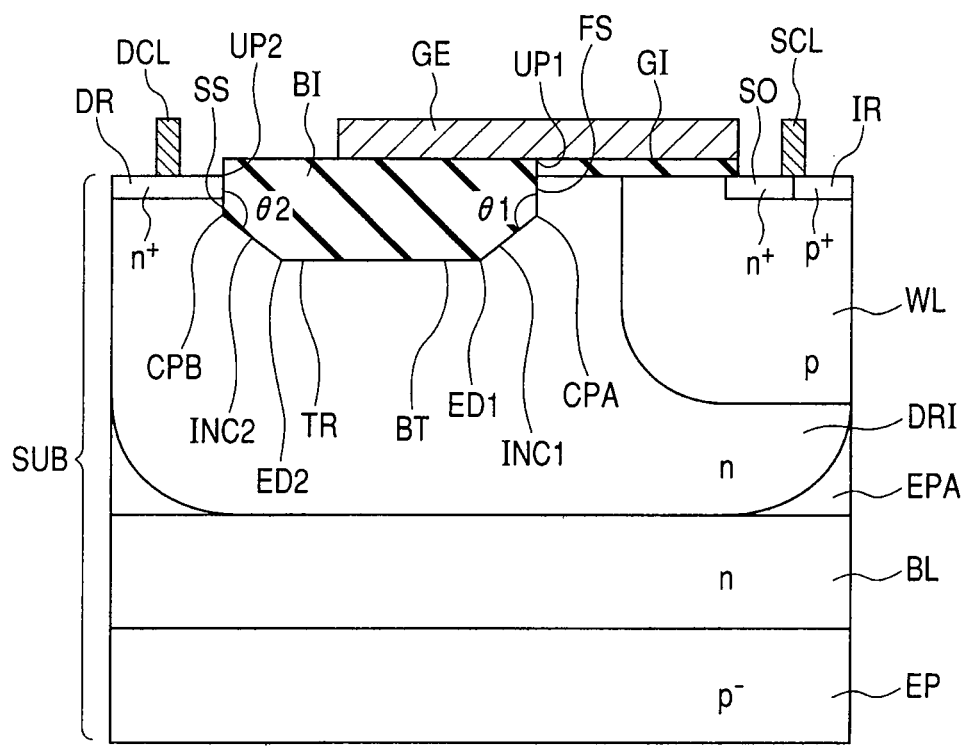
FIG. 48 is a schematic cross-sectional view showing a configuration of a NON-RESURF MOS transistor in which an inclined portion is provided at each of the source-side sidewall and the drain-side sidewall of a trench of a STI structure.

Referring also to FIG. 48, the configuration is obtained by replacing the stepped shape of each of the one wall portion FS and the other wall portion SS of the trench TR in Embodiment 4 shown in FIG. 33 with the shape having the inclined portion. The angular portion CPA of the one wall portion FS of the trench TR and the angular portion CPB of the other wall portion SS thereof have the same shapes as those of the angular portion CPA and the angular portion CPB in the configuration of FIG. 47, respectively, so that a description thereof is omitted.

Figure 49:
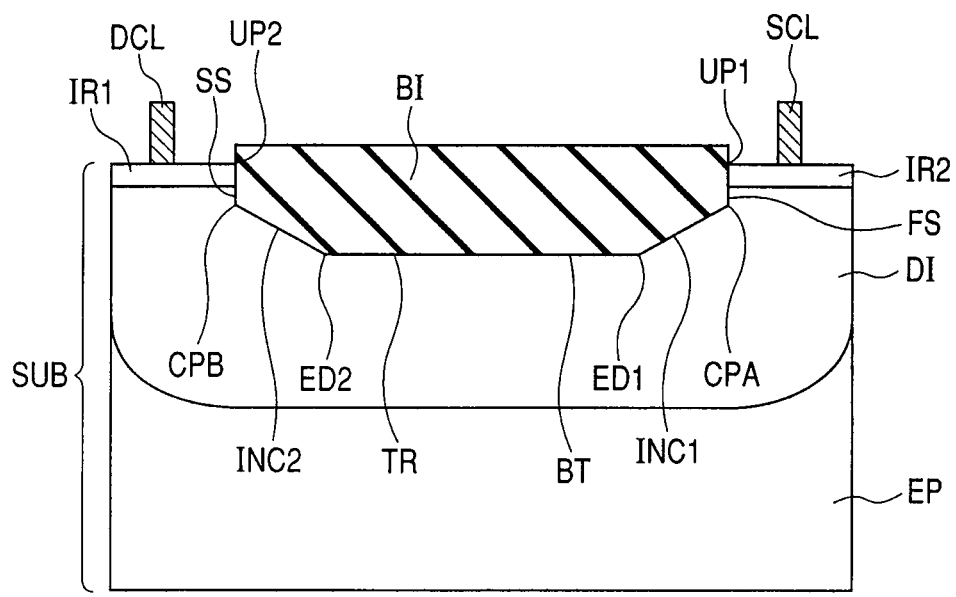
FIG. 49 is a schematic cross-sectional view showing a configuration of an element in which a current is allowed to flow from one side of a STI structure to the other side thereof through a semiconductor region under the STI structure, and an inclined portion is provided at each of the both sidewalls of a trench of the STI structure.

Referring also to FIG. 49, the configuration is obtained by replacing the stepped shape of each of the one wall portion FS and the other wall portion SS of the trench TR in Embodiment 5 shown in FIG. 34 with the shape having the inclined portion. The angular portion CPA of the one wall portion FS of the trench TR and the angular portion CPB of the other wall portion SS thereof have the same shapes as those of the angular portion CPA and the angular portion CPB in the configuration of FIG. 47, respectively, so that a description thereof is omitted.

(Embodiment 9)

In each of the configurations shown in FIGS. 45 and 46, the present inventors reproduced a stressed condition under an OLT test by device simulation, and made a comparison between the internal state of the element in the comparative example shown in FIG. 14 and that of the element in the present embodiment. The content and result of the comparative examination will be described using FIGS. 50 to 56.

First, the shapes of the one wall portion FS and the other wall portion SS of the trench TR will be described using FIG. 50.

Figure 50:
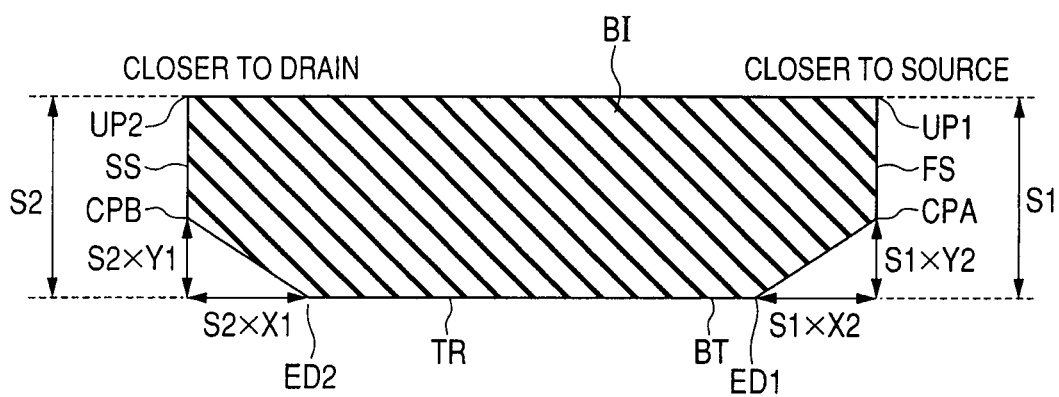
FIG. 50 is an enlarged cross-sectional view of each of the trenches of the STI structures shown in FIGS. 45 to 49, which is for illustrating the cross-sectional shape of the trench.

Referring to FIG. 50, when it is assumed that the dimension from the upper portion UP1 of the one wall portion FS of the trench TR to the bottom portion BT thereof in the depth direction is S1 and proportions (%) are X2 and Y2, the angular portion CPA is located at a position (position closer to the main surface of the semiconductor substrate SUB) shallower by S1×Y2 than the bottom portion BT of the trench TR. The junction portion (edge portion) ED1 between the one wall portion FS and the bottom portion BT is located at the depth S1 from the main surface of the semiconductor substrate SUB and closer to the drain (closer to the other wall portion SS) by S1×X2 as measured from the upper portion UP1 of the trench TR in a lateral direction (direction along the main surface of the semiconductor substrate SUB).

On the other hand, when it is assumed that the dimension from the upper portion UP2 of the other wall portion SS of the trench TR to the bottom portion BT thereof in the depth direction is S2 and proportions (%) are X1 and Y1, the angular portion CPB is located at a position (position closer to the main surface of the semiconductor substrate SUB) shallower by S2×Y1 than the bottom portion BT of the trench TR. The junction portion (edge portion) ED2 between the other wall portion SS and the bottom portion BT is located at the depth S2 from the main surface of the semiconductor substrate SUB and closer to the source (closer to the one wall portion FS) by S2×X1 as measured from the upper portion UP2 of the trench TR in a lateral direction (direction along the main surface of the semiconductor substrate SUB).

Next, a description will be given of the internal state of the element when the stressed condition under the OLT test is reproduced by setting X2 and Y2 in the one wall portion FS of the trench TR to 40% and 120%, respectively, in the configuration of FIG. 45.

Figure 51A:
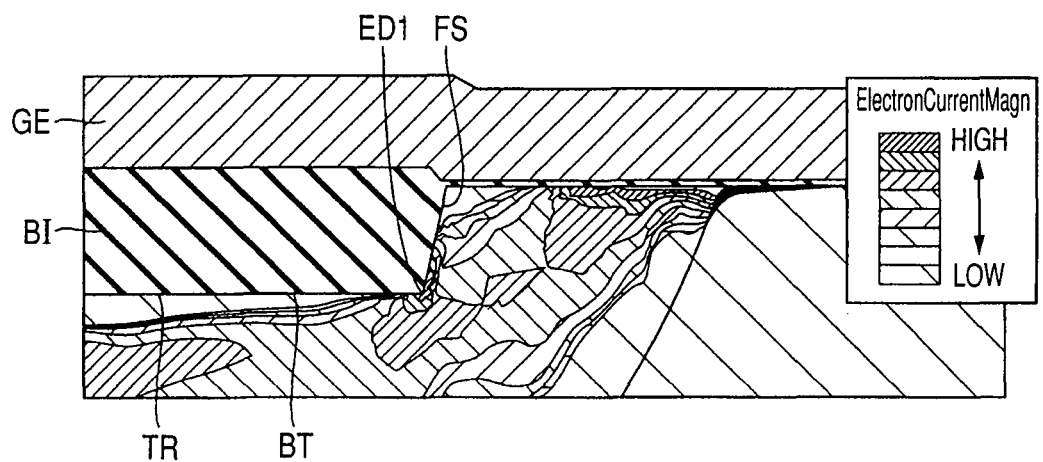
FIG. 51(A) is a distribution diagram of an electron/current density in a comparative example under OLT stressing conditions.
Figure 51B:
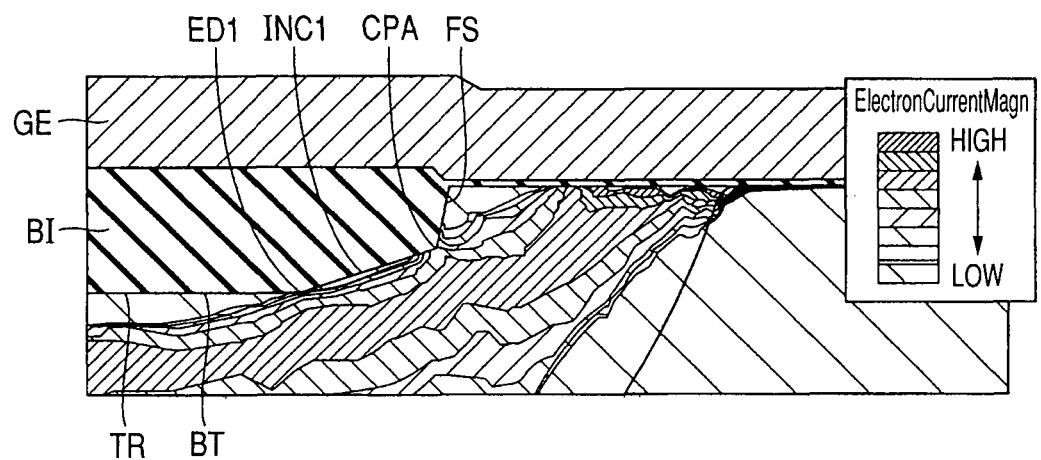
FIG. 51(B) is a distribution diagram of an electron/current density in the configuration of an inclined type shown in FIG. 45 under OLT stressing conditions.
Figure 52A:
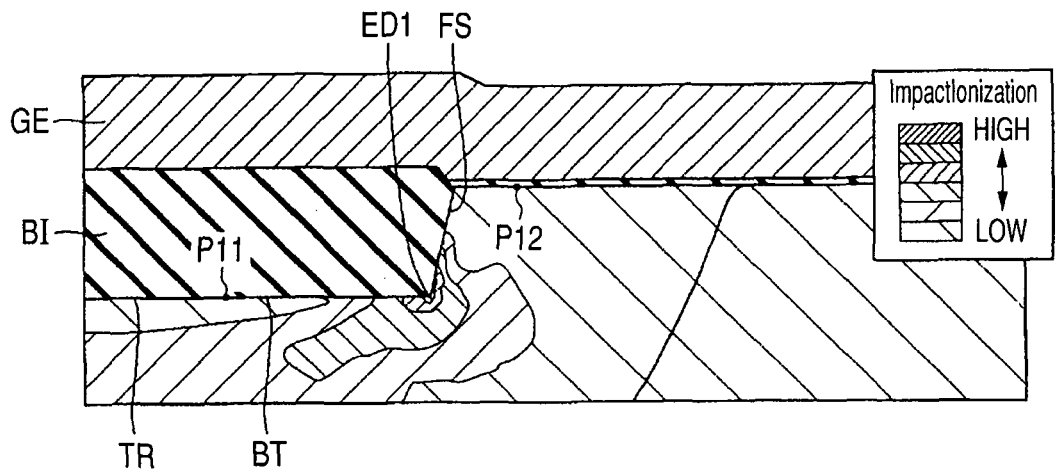
FIG. 52(A) is a distribution diagram of an impact ionization ratio in the comparative example under OLT stressing conditions.
Figure 52B:
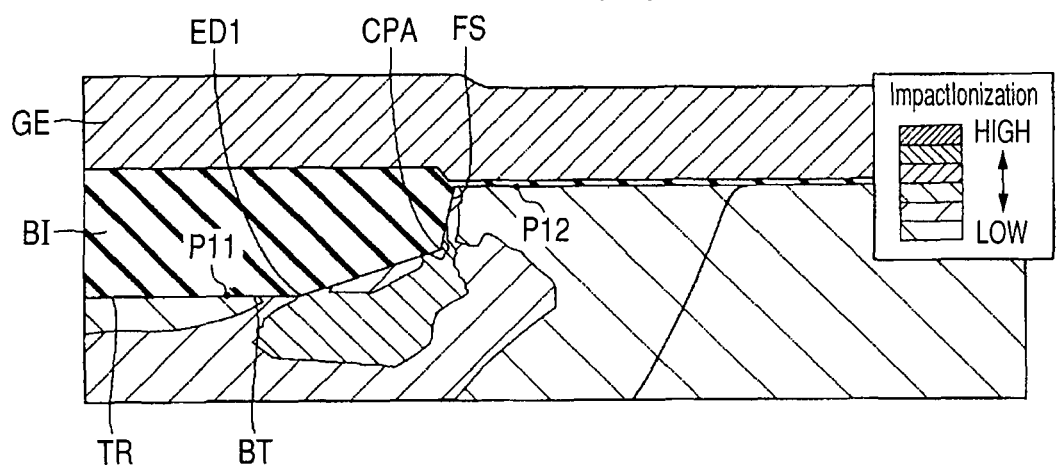
FIG. 52(B) is a distribution diagram of an impact ionization ratio in the configuration of the inclined type shown in FIG. 45 under OLT stressing conditions.
Figure 53:
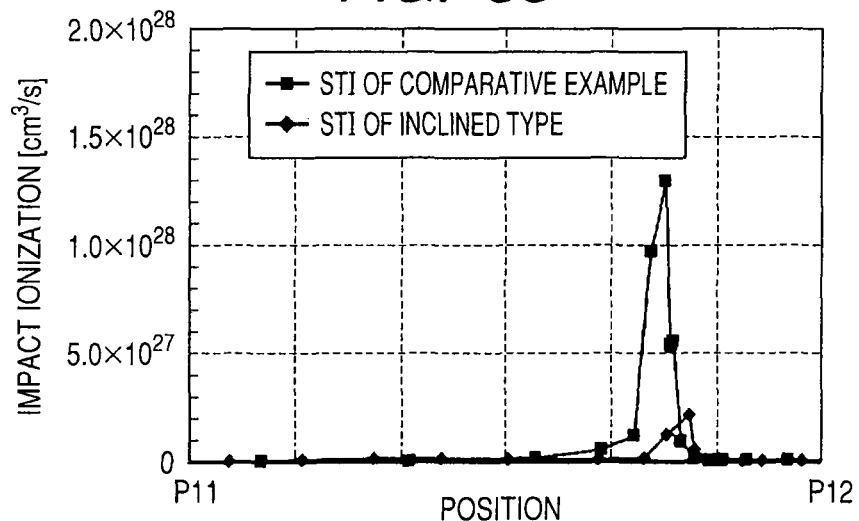
FIG. 53 is a view showing the distribution of the impact ionization ratio along the interface of a semiconductor substrate between the points P11 and P12 shown in FIG. 52 in each of the configuration of the comparative example and the configuration (of the inclined type) shown in FIG. 45, each under OLT stressing conditions.

FIGS. 51(A) and 51(B) show the respective distributions of electron/current densities in the configuration of the comparative example and the configuration of FIG. 45, each under stressing conditions. FIGS. 52(A) and 52(B) show the respective distributions of impact ionization ratios in the configuration of the comparative example and the configuration of FIG. 45, each under stressing conditions. FIG. 53 shows the distribution of the impact ionization ratio along the interface of the semiconductor substrate between the points P11 and P12 in each of FIGS. 52(A) and 52(B).

As can be seen from the results of FIGS. 51 to 53, it has been found that the electron/current density and the impact ionization ratio are high in the vicinity of the edge portion ED1 of the trench TR in the configuration of the comparative example, and also high in the vicinity of each of the edge portion ED1 and the angular portion CPA of the trench TR in the configuration of FIG. 45. It has also been found that the electron/current density and the impact ionization ratio in the vicinity of each of the edge portion ED1 and the angular portion CPA in the configuration of FIG. 45 are lower than the electron/current density and the impact ionization ratio in the vicinity of the edge portion ED1 in the configuration of the comparative example.

Thus, in the SS-LDMOS transistor of the configuration of FIG. 45, the current concentration can be reduced by forming the one wall portion FS of the trench TR into the shape having the inclined portion as compared to the reduction of the current concentration in the configuration of the comparative example. Therefore, it can be considered that the generation of hot carriers due to the impact ionization and the trapping of electrons at the interface of the edge portion ED1 of the trench TR are inhibited, and the Ids degradation can be reduced.

Next, a description will be given of the internal state of the element when the stressed condition under the OLT test is reproduced by setting X1 and Y1 in the other wall portion SS of the trench TR to 40% and 120%, respectively, in the configuration of FIG. 46.

Figure 54A:
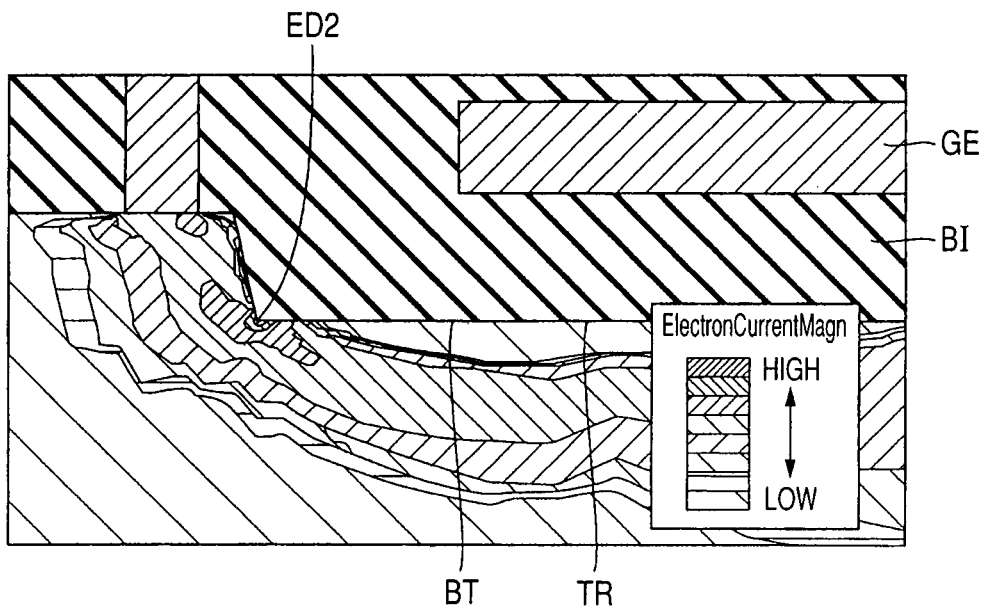
FIG. 54(A) is a distribution diagram of an electron/current density in a comparative example under OLT stressing conditions.
Figure 54B:
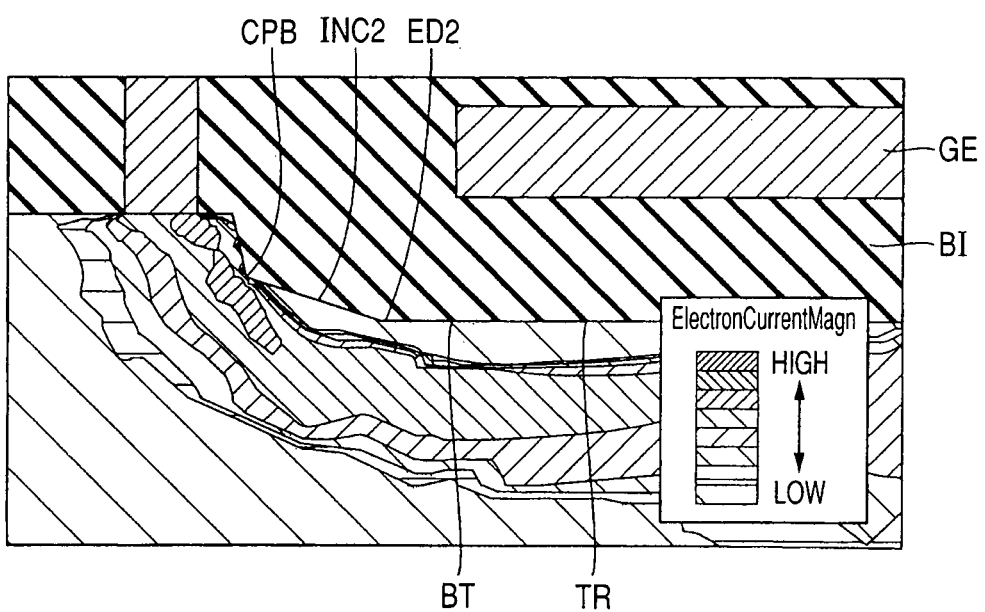
FIG. 54(B) is a distribution diagram of an electron/current density in the configuration of an inclined type shown in FIG. 46 under OLT stressing conditions.
Figure 55A:
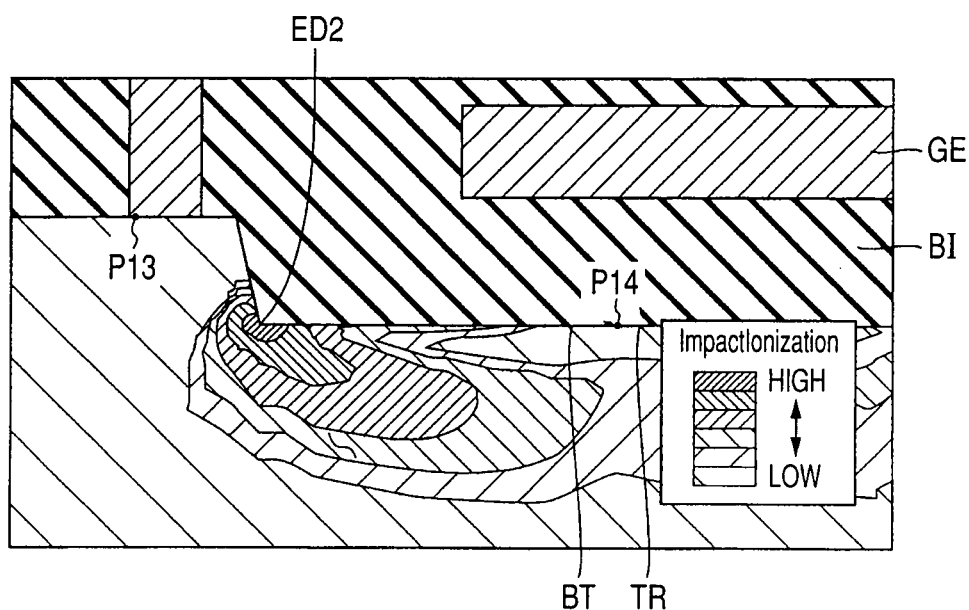
FIG. 55(A) is a distribution diagram of an impact ionization ratio in the comparative example under OLT stressing conditions.
Figure 55B:
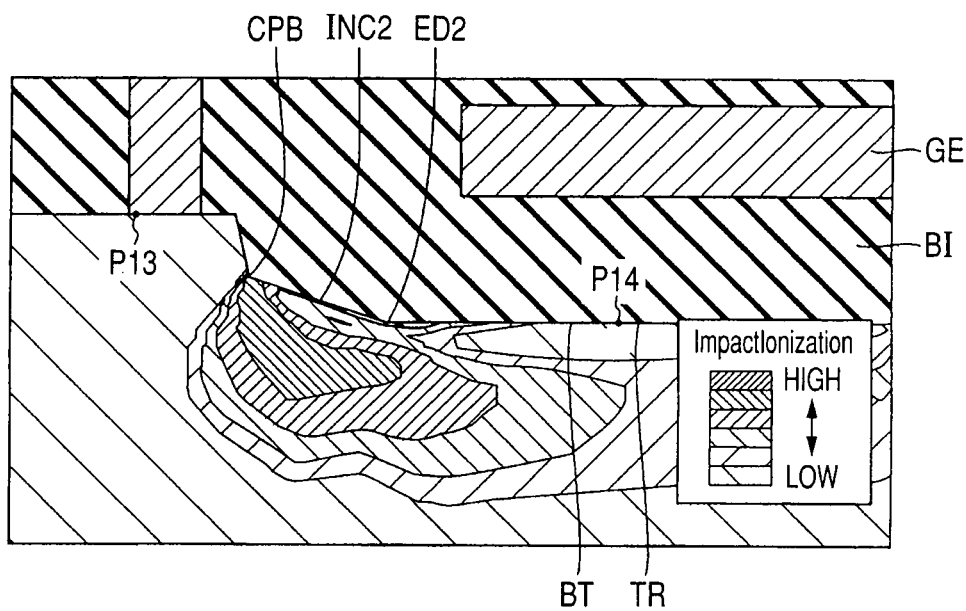
FIG. 55(B) is a distribution diagram of an impact ionization ratio in the configuration of the inclined type shown in FIG. 46 under OLT stressing conditions.
Figure 56:
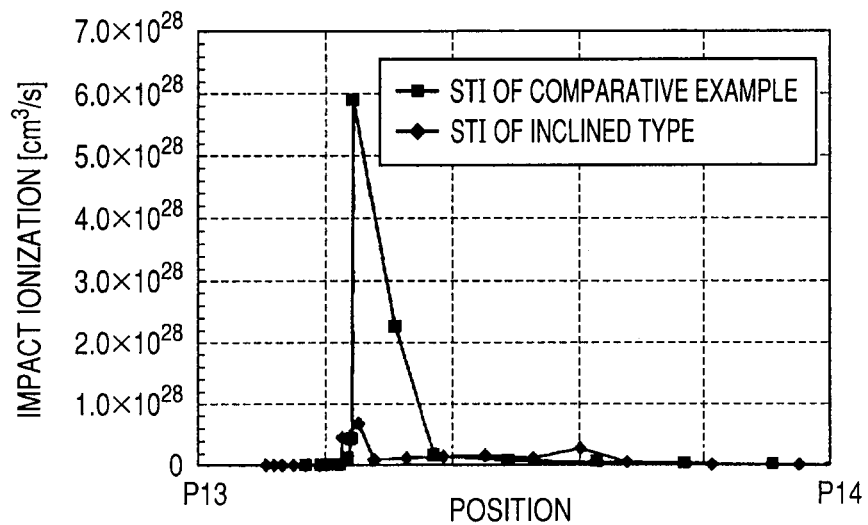
FIG. 56 is a view showing the distribution of the impact ionization ratio along the interface of a semiconductor substrate between the points P13 and P14 shown in FIG. 55 in each of the configuration of the comparative example and the configuration (of the inclined type) shown in FIG. 46, each under OLT stressing conditions.

FIGS. 54(A) and 54(B) show the respective distributions of electron/current densities in the configuration of the comparative example and the configuration of FIG. 46, each under stressing conditions. FIGS. 55(A) and 55(B) show the respective distributions of impact ionization ratios in the configuration of the comparative example and the configuration of FIG. 46, each under stressing conditions. FIG. 56 shows the distribution of the impact ionization ratio along the interface of the semiconductor substrate between the points P11 and P12 in each of FIGS. 55(A) and 55(B).

As can be seen from the results of FIGS. 54 to 56, it has been found that the electron/current density and the impact ionization ratio are high in the vicinity of the edge portion ED2 of the trench TR in the configuration of the comparative example, and also high in the vicinity of each of the edge portion ED2 and the angular portion CPB of the trench TR in the configuration of FIG. 46. It has also been found that the electron/current density and the impact ionization ratio in the vicinity of each of the edge portion ED2 and the angular portion CPB in the configuration of FIG. 46 are lower than the electron/current density and the impact ionization ratio in the vicinity of the edge portion ED2 in the configuration of the comparative example.

Thus, in the SS-LDMOS transistor of the configuration of FIG. 46, the current concentration can be reduced by forming the other wall portion SS of the trench TR into the shape having the inclined portion as compared to the reduction of the current concentration in the configuration of the comparative example. Therefore, it can be considered that the generation of hot carriers due to the impact ionization and the trapping of electrons at the interface of the edge portion ED2 of the trench TR are inhibited, and the Ids degradation can be reduced.

In this manner, in a configuration having angular portions which form an inclined portion in at least either one of the one wall portion FS and the other wall portion SS of the trench TR as shown in FIGS. 45 to 49, it is possible to reduce the electric field concentration on the wall portions of the trench as compared to the reduction of the electric field concentration in the configuration of the comparative example which does not have such angular portions, and inhibit the degradation of electric characteristics due to the trapping of electrons.

Next, the present inventors examined respective preferred shapes as the shape of the inclined portion of the one wall portion FS of the trench TR in the configuration shown in FIG. 45 and the shape of the inclined portion of the other wall portion SS of the trench TR in the configuration shown in FIG. 46. The content and result of the examination will be described below.

First, based on the definition of the shape of the trench in FIG. 50, the present inventors performed simulation for examining the impact ionization ratios when the respective values of X2 and Y2 in the one wall portion FS of the trench TR of the configuration shown in FIG. 45 were varied. The result of the simulation is shown below in Table 3.

TABLE 3

| | | \multicolumn{6}{c}{X2} | | | | | |
|---|---|---|---|---|---|---|---|
| | | 0% | 40% | 80% | 120% | 160% | 200% |
| Y2 | 0% | $1.2 \times 10^{28}$ | | | | | |
| | 20% | | $1.6 \times 10^{27}$ | $2.4 \times 10^{27}$ | $3.9 \times 10^{27}$ | $4.9 \times 10^{27}$ | $6.0 \times 10^{27}$ |
| | 40% | | $9.8 \times 10^{27}$ | $9.3 \times 10^{26}$ | $1.5 \times 10^{27}$ | $4.4 \times 10^{27}$ | $7.4 \times 10^{27}$ |
| | 60% | | $1.2 \times 10^{28}$ | $3.6 \times 10^{27}$ | $7.2 \times 10^{26}$ | $1.8 \times 10^{27}$ | $4.5 \times 10^{27}$ |
| | 80% | | $9.9 \times 10^{27}$ | $5.4 \times 10^{27}$ | $1.8 \times 10^{27}$ | $4.6 \times 10^{27}$ | $7.3 \times 10^{27}$ |

(Unit: cm$^3$/s)

As can be seen from the result of Table 3, it has been found that, in the range of X2=40% to 120%, when the angular portion CPA is located at a ratio of X2:Y2=1:2, the impact ionization ratio tends to be lower.

Based on the definition of the shape of the trench in FIG. 50, the present inventors also performed simulation for examining the impact ionization ratios when the respective values of X1 and Y1 in the other wall portion SS of the trench TR of the configuration shown in FIG. 46 were varied. The result of the simulation is shown below in Table 4.

TABLE 4

| | | \multicolumn{6}{c}{X1} | | | | | |
|---|---|---|---|---|---|---|---|
| | | 0% | 40% | 80% | 120% | 160% | 200% |
| Y1 | 0% | $4.3 \times 10^{28}$ | | | | | |
| | 20% | | $3.0 \times 10^{28}$ | $7.6 \times 10^{28}$ | $7.3 \times 10^{28}$ | $9.4 \times 10^{28}$ | $9.6 \times 10^{28}$ |
| | 40% | | $5.5 \times 10^{28}$ | $1.0 \times 10^{27}$ | $1.0 \times 10^{27}$ | $1.0 \times 10^{27}$ | $1.0 \times 10^{27}$ |
| | 60% | | $9.0 \times 10^{28}$ | $2.0 \times 10^{28}$ | $3.3 \times 10^{27}$ | $2.8 \times 10^{27}$ | $1.0 \times 10^{27}$ |
| | 80% | | $9.0 \times 10^{28}$ | $3.0 \times 10^{28}$ | $4.5 \times 10^{27}$ | $2.7 \times 10^{27}$ | $1.1 \times 10^{27}$ |

(Unit: cm$^3$/s)

As can be seen from the result of Table 4, it has been found that the impact ionization ratio tends to be lower in the range of X1=80% or more and Y1=40% or more, while it tends to be higher than the impact ionization ratio in the comparative example (in which X1=0% and Y1=0%) in the range other than the range shown above, resulting in a large difference between the highest and lowest values thereof.

(Other)

Figure 57:
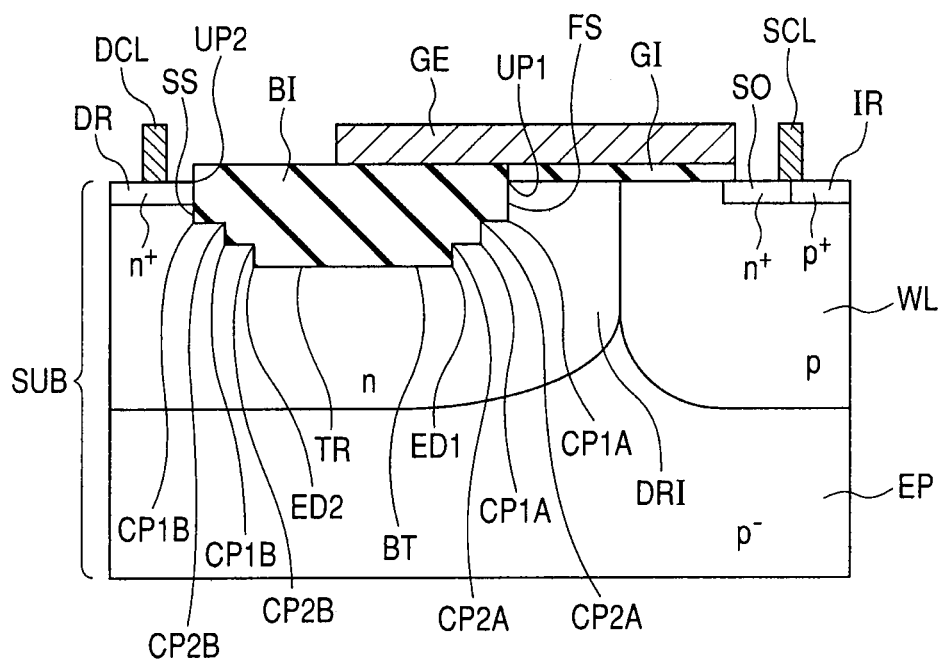
FIG. 57 is a schematic cross-sectional view showing a configuration in which the sidewalls of a STI structure have stepped shapes, and each of the sidewalls has a plurality of angular portions.

In each of Embodiments 1 to 7, the description has been given to the case where the stepped portion in the stepped shape of each of the one wall portion FS and the other wall portion SS of the trench TR is one. However, as shown in FIG. 57, each of the one wall portion FS and the other wall portion SS of the trench TR may also have a plurality of two or more stepped portions. When each of the one wall portion FS and the other wall portion SS of the trench TR has the plurality of stepped portions, it follows that a plurality of pairs of projecting angular portions CP1 and depressed angular portions CP2 are formed at each of the one wall portion FS and the other wall portion SS.

Each of the one wall portion FS and the other wall portion SS of the trench TR in each of Embodiments 8 and 9 may have a plurality of the angular portions for forming the inclined portion.

The shape of each of the one wall portion FS and the other wall portion SS of the trench TR when viewed in cross section may also be a shape obtained by appropriately combining the stepped shape in each of Embodiments 1 to 7 with the inclined portion in each of Embodiments 8 and 9.

Such a configuration according to the present invention having angular portions in at least either one of the one wall portion FS and the other wall portion SS may also be applied to an Insulated Gate Bipolar Transistor (IGBT) in which a p-type emitter region is provided in place of the n$^+$ drain region DR of the LDMOS transistor. The configuration according to the present invention may also be applied not only to a MOS transistor having a gate insulating film formed of a silicon dioxide film, but also to a Metal Insulator Semiconductor (MIS) transistor.

Each of the elements shown above may also have a configuration in which the p-type and n-type conductivities are reversed.

The embodiments disclosed herein should be considered to be illustrative from all viewpoints and are not limitative. The scope of the present invention is not defined by the above description but, rather by the claims and is intended to include the meanings equivalent to the claims and all the modifications within the claims.

What is claimed is:

1. A semiconductor device, comprising:
   a semiconductor substrate having a main surface, and a trench in the main surface;
   a buried insulating film buried in the trench;
   a gate electrode layer located over at least the buried insulating film, and
   a gate insulating film located between the gate electrode and the semiconductor substrate,
   wherein the trench has one wall portion and an other wall portion which oppose each other, and has an angular portion only between a main surface of the one wall portion and a bottom portion of the trench,
   wherein the angular portion is formed at a height lower than the gate insulating film and adjacent an interface between the buried insulating film and the gate insulating film as viewed in cross-section such that the one wall portion of the trench has a stepped shape, and
   wherein the buried insulating layer has a stepped shape only on an undersurface of the buried insulating layer.

2. A semiconductor device according to claim 1,
   wherein a lower portion of the trench from the angular portion to the bottom portion thereof is inclined in cross section with respect to an upper portion of the trench from the angular portion to the main surface.

3. The semiconductor device according to claim 1, further comprising:
- a first region of a first conductivity type formed in the main surface of a portion of the semiconductor substrate located at the one wall portion side of the trench;
- a second region formed in the main surface of a portion of the semiconductor substrate located at the other wall portion side of the trench;
- a third region of a second conductivity type formed to be located under the first region, and in the main surface of a portion of the semiconductor substrate interposed between the first region and the trench; and
- a fourth region of the first conductivity type formed in the semiconductor substrate to be located under the second region and the trench,
- wherein the gate electrode layer is located over the third region located in the main surface of the semiconductor substrate, and opposes the fourth region via the buried insulating film.

4. The semiconductor device according to claim 3, further comprising:
- a fifth region of the second conductivity type having an impurity concentration lower than that of the third region, and formed under the third and fourth regions to form a p-n junction with the fourth region.

5. A semiconductor device according to claim 3,
wherein the fourth region is formed to extend under the third region,
the semiconductor device further comprising:
- a fifth region of the second conductivity type having an impurity concentration lower than that of the third region, and formed under the fourth region; and
- a sixth region of the first conductivity type formed between the fourth region and the fifth region, and having an impurity concentration higher than that of the fourth region.

6. A semiconductor device according to claim 3, wherein the angular portion is formed in a part of the trench to be located between the first region and the second region when viewed in plan view.

7. A semiconductor device according to claim 3, wherein the angular portion is formed in the entire trench to be located between the first region and the second region when viewed in plan view.

8. The semiconductor device according to claim 1, wherein the angular portion is formed in an n-type drift region.

9. The semiconductor device according to claim 1, wherein the trench has a stepped shape only on an undersurface of the buried insulating layer.

10. The semiconductor device according to claim 9, wherein an upper surface of the buried insulating layer is flat from adjacent an interface between the buried insulating film and the gate insulating film to the other wall portion.

* * * * *